United States Patent
Suzuki et al.

(10) Patent No.: US 10,613,818 B2
(45) Date of Patent: Apr. 7, 2020

(54) SOUND EFFECT ADJUSTING APPARATUS, METHOD, AND PROGRAM

(71) Applicant: SONY CORPORATION, Tokyo (JP)

(72) Inventors: Shiro Suzuki, Kanagawa (JP); Masayuki Nishiguchi, Kanagawa (JP); Goro Shiraishi, Tokyo (JP); Koyuru Okimoto, Tokyo (JP); Masafumi Takahashi, Tokyo (JP)

(73) Assignee: SONY CORPORATION, Tokyo (JP)

( * ) Notice: Subject to any disclaimer, the term of this patent is extended or adjusted under 35 U.S.C. 154(b) by 312 days.

(21) Appl. No.: 14/417,974

(22) PCT Filed: Aug. 27, 2013

(86) PCT No.: PCT/JP2013/005052
§ 371 (c)(1),
(2) Date: Jan. 28, 2015

(87) PCT Pub. No.: WO2014/038154
PCT Pub. Date: Mar. 13, 2014

(65) Prior Publication Data
US 2015/0169280 A1 Jun. 18, 2015

(30) Foreign Application Priority Data

Sep. 4, 2012 (JP) .................................. 2012-194039

(51) Int. Cl.
*G06F 3/16* (2006.01)
*G06F 3/0484* (2013.01)
(Continued)

(52) U.S. Cl.
CPC .......... *G06F 3/165* (2013.01); *G06F 3/04842* (2013.01); *G06F 3/04847* (2013.01);
(Continued)

(58) Field of Classification Search
CPC . H03G 5/025; G06F 3/04847; G06F 3/04842; G06F 3/165; H04S 7/30
See application file for complete search history.

(56) References Cited

U.S. PATENT DOCUMENTS

| 5,428,717 A * | 6/1995 | Glassner ................. G06T 17/00 345/419 |
| 6,542,171 B1 * | 4/2003 | Satou .................. A63B 24/0003 463/30 |

(Continued)

FOREIGN PATENT DOCUMENTS

| JP | 2006-197508 | 7/2006 |
| JP | 2007-116363 | 5/2007 |

(Continued)

OTHER PUBLICATIONS

Weisstein, Eric W. "Star Polygon." From MathWorld—A Wolfram Web Resource. http://mathworld.wolfram.com/StarPolygon.html (Year: 2014).*

(Continued)

*Primary Examiner* — Justin R. Blaufeld
(74) *Attorney, Agent, or Firm* — Xsensus, LLP

(57) ABSTRACT

An information processing apparatus includes a processor that controls display of a graphic including a single shape, where the single shape corresponds to a plurality of content output characteristic adjusting parameters. The processor also modifies the single shape included in the graphic displayed on the display based on input information, and adjusts at least one content output characteristic adjusting parameter of reproduced content based on the input information.

21 Claims, 33 Drawing Sheets

(51) Int. Cl.
 *H03G 5/02* (2006.01)
 *H04S 7/00* (2006.01)
(52) U.S. Cl.
 CPC .............. *H03G 5/025* (2013.01); *H04S 7/30* (2013.01); *G10H 2220/106* (2013.01); *G10H 2220/116* (2013.01); *H04S 7/302* (2013.01); *H04S 7/40* (2013.01)

(56) References Cited

U.S. PATENT DOCUMENTS

| | | | | |
|---|---|---|---|---|
| 6,628,285 | B1* | 9/2003 | Abeyta | G06F 3/0481 345/441 |
| 2001/0025298 | A1* | 9/2001 | Masukura | G06T 7/20 709/203 |
| 2005/0262451 | A1* | 11/2005 | Remignanti | G06F 3/04847 715/833 |
| 2006/0291670 | A1* | 12/2006 | King | H03G 5/005 381/103 |
| 2007/0198926 | A1 | 8/2007 | Joguet et al. | |
| 2007/0229474 | A1* | 10/2007 | Okabayashi | G06F 3/04847 345/173 |
| 2009/0164905 | A1* | 6/2009 | Ko | H04M 1/6016 715/727 |
| 2010/0235747 | A1* | 9/2010 | Young | G06F 3/0482 715/727 |
| 2012/0041579 | A1* | 2/2012 | Davis | H04R 1/403 700/94 |
| 2012/0151394 | A1* | 6/2012 | Locke | G06F 3/04817 715/765 |
| 2013/0031506 | A1* | 1/2013 | Diaz | G06F 16/9537 715/781 |
| 2013/0174100 | A1* | 7/2013 | Seymour | G06F 3/0487 715/863 |
| 2013/0335332 | A1* | 12/2013 | Zhao | G06F 3/04845 345/172 |
| 2014/0173519 | A1* | 6/2014 | Sassi | H04S 1/002 715/833 |
| 2014/0279011 | A1* | 9/2014 | McMullen | G06Q 30/0261 705/14.58 |
| 2015/0033326 | A1* | 1/2015 | Fang | G06F 3/04842 726/16 |

FOREIGN PATENT DOCUMENTS

| | | |
|---|---|---|
| JP | 2007-527061 A | 9/2007 |
| JP | 2007-267135 A | 10/2007 |
| JP | 2009-147812 A | 7/2009 |
| JP | 2010-103590 A | 5/2010 |
| JP | 4691753 B2 | 6/2011 |
| WO | WO 88/04861 A1 | 6/1988 |

OTHER PUBLICATIONS

McMullen, Peter, and Egon Schulte. "Abstract Regular Polytopes." Abstract Regular Polytopes, Cambridge University Press, 2002, p. 16. Encyclopedia of Mathematics and Its Applications (Year: 2002).*
Leonard, I. Ed., et al. Classical Geometry: Euclidean, Transformational, Inversive, and Projective. Wiley. (Year: 2014).*
Japanese Office Action dated May 12, 2016 in Patent Application No. 2012-194039.
International Search Report dated Jan. 31, 2014 in PCT/JP2013/005052.
Office Action dated May 16, 2017 in Japanese Patent Application No. 2016-136687.

* cited by examiner

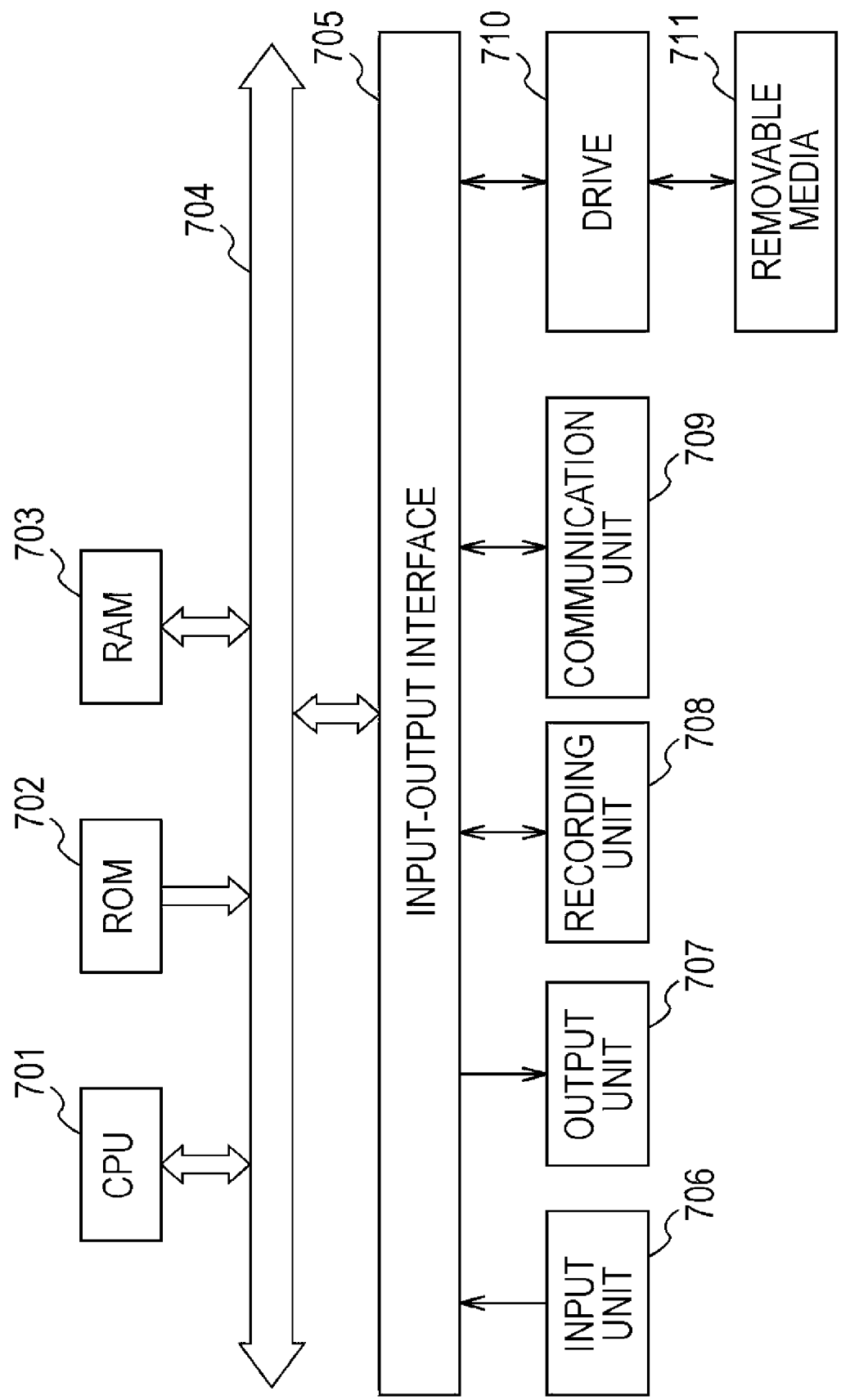

SOUND EFFECT ADJUSTING APPARATUS, METHOD, AND PROGRAM

TECHNICAL FIELD

The present technology relates to a sound effect adjusting apparatus, method, and program, in particular, to a sound effect adjusting apparatus, method, and program which are able to provide an easy-to-use user interface which is easier to understand.

BACKGROUND ART

For example, graphic equalizers are recognized as representatives of sound effect adjustment with respect to sound signals (for example, refer to PTL 1).

In graphic equalizers, for example, by raising or lowering knobs of a slide bar which correspond to each frequency component of the sound signal as shown in FIG. 1, gain (equalizer) adjustment of these frequency components is performed.

That is, in the graphic equalizer shown in FIG. 1, a knob PH 11 which corresponds to 100 Hz, a knob PH 12 which corresponds to 500 Hz, and a knob PH 13 which corresponds to 10 kHz are provided. Here, in the example of FIG. 1, the adjustable frequencies are 100 Hz, and 500 Hz, thereafter skipping to 10 kHz; however, although between 500 Hz and 10 kHz is omitted in order to simplify the description, this does not mean there is nothing there in practice.

The knob PH 11 to the knob PH 13 are arranged on scales where each numeric value is recorded from "+3" to "−3" and the user adjusts the gain of each frequency component corresponding to each knob by operating these knobs so as to move on the predetermined scale. In this example, the knob PH 11 is positioned on a scale where "+1" is recorded, the knob PH 12 is positioned on a scale where "−1" is recorded, and the knob PH 13 is positioned on a scale where "+2" is recorded.

Due to this, in the figure, it is possible to obtain the characteristics shown on the right side. In other words, the gain of each frequency of the sound signals is amplified or attenuated by an amount according to the positions of the knobs. Here, in the figure, the horizontal axis and the vertical axis on the right side show the respective frequencies and the gains of each frequency. In this example, the gain of the 100 Hz and 10 kHz are amplified by an amount which corresponds to the positions of the knob PH 11 and the knob PH 13 and the gain of the 500 Hz is attenuated by an amount which corresponds to the position of the knob PH 12.

In this manner, the adjustment of the sound effects of the graphic equalizer or the like is widely and generally performed.

CITATION LIST

Patent Literature

PTL 1: Japanese Patent No. 4691753

SUMMARY OF INVENTION

Technical Problem

Incidentally, the graphic equalizers described above are generally widely recognized by users having a familiarity with sound equipment. Therefore, such a user is able to conveniently use the graphic equalizer in accordance with the purpose thereof.

However, for users who have had no opportunities to learn about graphic equalizers, or few such opportunities, such as small children and the elderly, there is a high possibility that it will not be possible to immediately understand what kinds of functions or effects are produced by the graphic equalizer. Accordingly, even with a long-awaited graphic equalizer, users who are inexperienced with such graphic equalizers could not use the graphic equalizer as they wished. In other words, at present, it is difficult to say that a universal design has been realized for graphic equalizers.

As described above, at present, in a case where sound effect adjustment is performed with respect to sound signals (audio signals) such as equalizer adjustment, it is difficult to realize an easy-to-use user interface which is easy for the user to understand.

The present technology was made in view of such circumstances and is able to provide an easy-to-use user interface which is easier to understand.

Solution to Problem

According to a first embodiment of the present technology, a content processing apparatus includes a processor that controls display of a graphic including a single shape, where the single shape corresponds to a plurality of content output characteristic adjusting parameters. The processor also modifies the single shape included in the graphic displayed on the display based on input information, and adjusts at least one content output characteristic adjusting parameter of reproduced content based on the input information.

According to a second embodiment, a content processing method includes controlling, in a processor, display of a graphic including a single shape, where the single shape corresponds to a plurality of content output characteristic adjusting parameters. The method also includes modifying, in the processor, the single shape included in the graphic displayed on the display based on input information, and adjusting, in the processor, at least one content output characteristic adjusting parameter of reproduced content based on the input information.

According to a third embodiment, a non-transitory computer-readable medium stores computer-readable instructions thereon. The computer-readable instructions, when executed by a computer, cause the computer to perform a method that includes controlling display of a graphic including a single shape. The single shape corresponds to a plurality of content output characteristic adjusting parameters. The method also includes modifying the single shape included in the graphic displayed on the display based on input information, and adjusting at least one content output characteristic adjusting parameter of reproduced content based on the input information.

According to a fourth embodiment, a content processing apparatus includes a touch panel display that receives an input based on a user touch thereon. The touch panel display displays a graphic including a single shape, which corresponds to a plurality of content output characteristic adjusting parameters. The apparatus also includes a processor that modifies the single shape included in the graphic displayed on the display based on input information, and adjusts at least one content output characteristic adjusting parameter of reproduced content based on the input information.

Advantageous Effects of Invention

According to the first embodiment and the second embodiment of the present technology, it is possible to provide an easy-to-use user interface which is easier to understand.

BRIEF DESCRIPTION OF DRAWINGS

FIG. 33 is a diagram which illustrates a configuration example of a computer.

DESCRIPTION OF EMBODIMENTS

Hereinafter, description will be given of embodiments where the present technology with reference to the drawings.
<First Embodiment>
<Configuration Example of Sound Effect Adjustment Apparatus>

In a case of performing sound effect adjustment or the switching of sound effects such as an equalizer or surround with respect to sound signals (audio signals) such as music signals, the present technology provides an easy-to-use user interface which is easier for a user to understand. That is, the present technology realizes a universal design of a user interface for adjusting various types of sound effects, such as a graphic equalizer.

Figure 2:
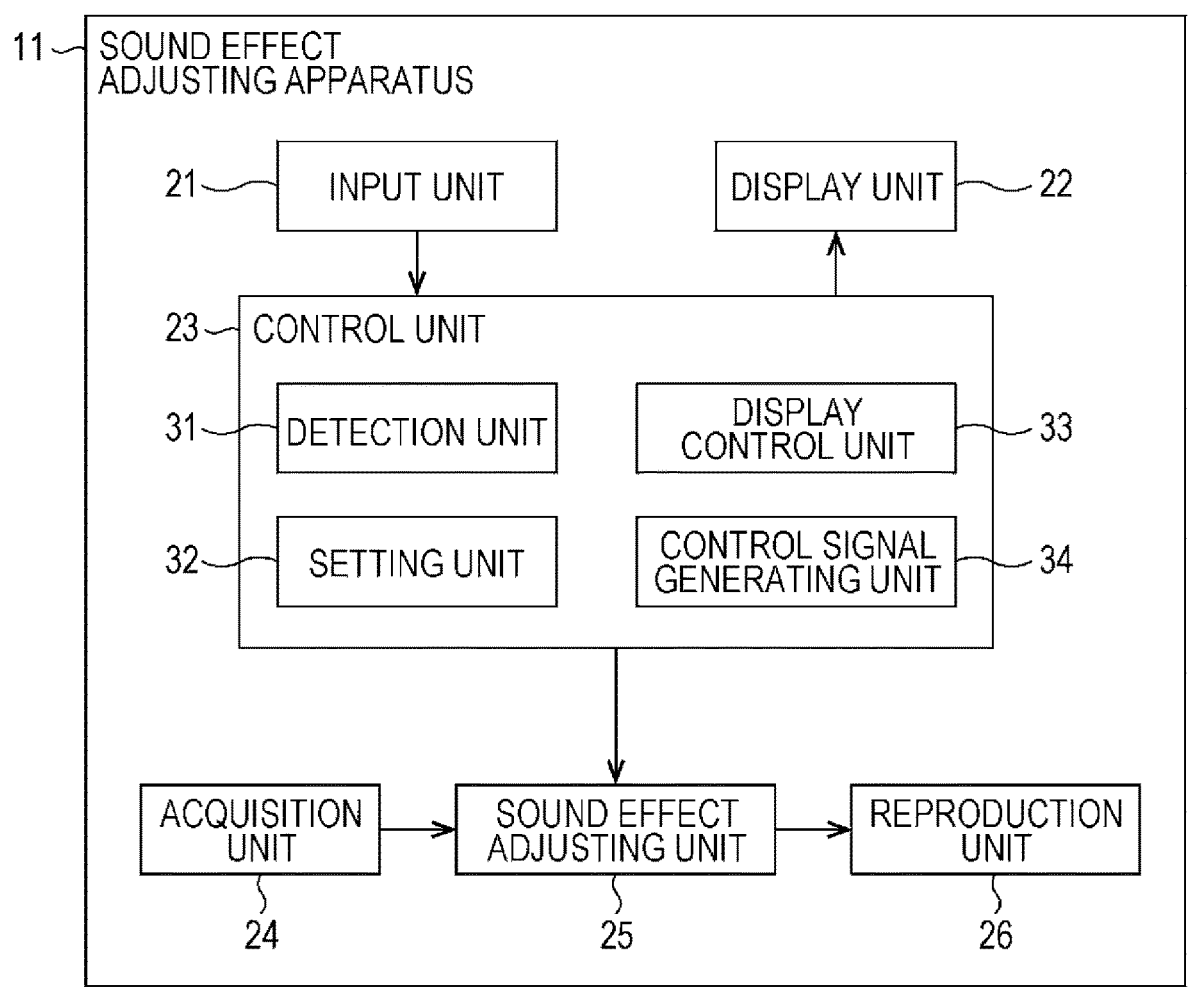
FIG. 2 is a view which illustrates a configuration example of a sound effect adjusting apparatus.

FIG. 2 is a view which illustrates a configuration example of an embodiment of a sound effect adjusting apparatus where the present technology is applied.

The sound effect adjustment apparatus 11 of FIG. 2 is configured from an input unit 21, a display unit 22, a control unit 23, an acquisition unit 24, a sound effect adjusting unit 25, and a reproduction unit 26.

The input unit 21 is formed of, for example, buttons which are operated by a user, a touch panel which is provided to be superimposed on the display unit 22, or the like, and supplies a signal to the control unit 23 in accordance with an operation of the user. The display unit 22 is formed of, for example, a liquid crystal display or the like, and displays an image which is supplied from the control unit 23. In addition, a touch panel which configures the input unit 21 is provided so as to be superimposed on the display unit 22.

The control unit 23 controls the operation of the entire sound effect adjusting apparatus 11. The control unit 23 is provided with a detection unit 31, a setting unit 32, a display control unit 33, and a control signal generating unit 34.

The detection unit 31 detects an operation of the user on the touch panel based on a signal which is supplied from the touch panel as the input unit 21. The setting unit 32 sets the amount of shape changing of the graphic for sound effect adjustment which is displayed on the display unit 22 based on the detection result by the detection unit 31.

The display control unit 33 controls the display of the image on the display unit 22 in accordance with the detection results and the like of the user operation by the detection unit 31. The control signal generating unit 34 changes the sound parameters for sound effect adjustment which is performed with respect to the sound signals, generates a control signal for processing the sound effect adjustment, and supplies the result to the sound effect adjusting unit 25, based on the detection result by the detection unit 31 and the amount of shape changing which is set by the setting unit 32.

The acquisition unit 24 acquires a sound signal from a recording medium which is not shown or another apparatus which is connected in a wired or wireless manner, and performs supply thereof to the sound effect adjusting unit 25.

The sound effect adjusting unit 25 adjusts the sound effects of the sound signals which are supplied from the acquisition unit 24 and perform supply thereof to the reproduction unit 26 based on control signals which are supplied from the control unit 23. For example, the reproduction unit 26 is configured by a speaker or the like, and reproduces audio based on the sound signal after the sound effect adjustment which is supplied from the sound effect adjusting unit 25.

<Configuration Example of Sound Effect Adjusting Unit>

In the sound effect adjusting apparatus 11 which is shown in FIG. 2, sound effect adjustment such as an equalizer or surround is performed with respect to sound signals; however, description will be given of a case where equalizer adjustment is performed first as a sound effect.

Figure 3:
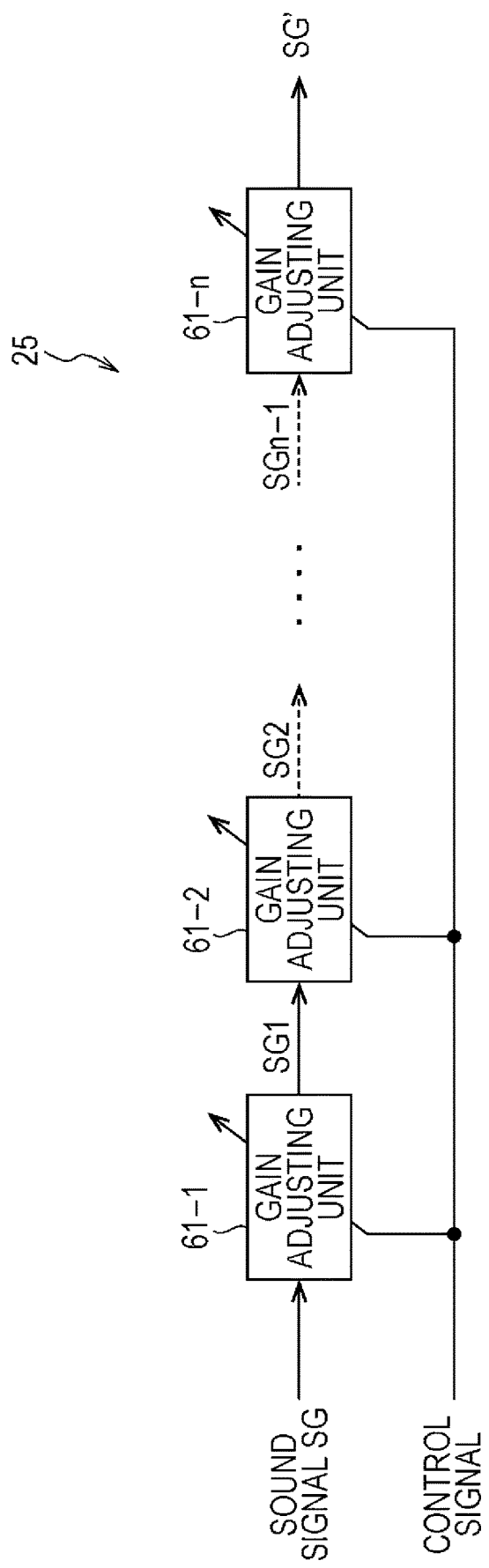
FIG. 3 is a view which illustrates a configuration example of a sound effect adjusting unit.

In such a case, the sound effect adjusting unit 25 is configured as shown in FIG. 3, for example. The sound effect adjusting unit 25 which is shown in FIG. 3 is configured of a gain adjusting unit 61-1 to a gain adjusting unit 61-$n$ (however, the gain adjusting unit 61-3 to the gain adjusting unit 61-($n$−1) are not shown).

In accordance with control signals which are supplied from the control signal generating unit 34, the gain adjusting unit 61-1 adjusts the gain of a predetermined frequency of the sound signal SG which is supplied from the acquisition unit 24, and supplies the sound signal SG1 which is obtained as a result to the gain adjusting unit 61-2. For example, in the gain adjusting unit 61-1, the gain of the sound signals at 100 Hz is adjusted.

In accordance with control signals which are supplied from the control signal generating unit 34, the gain adjusting unit 61-2 adjusts the gain of a predetermined frequency of the sound signal SG1 which is supplied from the gain adjusting unit 61-1, and supplies the sound signal SG2 which is obtained as a result to the gain adjusting unit 61-3. For example, in the gain adjusting unit 61-2, the 500 Hz gain of the sound signals is adjusted.

In the same manner, in accordance with control signals which are supplied from the control signal generating unit 34, the gain adjusting unit 61-$i$ (here, i is equal to or greater than 3 and equal to or smaller than n−1) adjusts the gain of a predetermined frequency of the sound signal SG (i−1) which is supplied from the gain adjusting unit 61-($i$−1), and supplies the sound signal SGi which is obtained as a result to the gain adjusting unit 61-($i$+1).

In accordance with control signals which are supplied from the control signal generating unit 34, the gain adjusting unit 61-$n$ adjusts the gain of a predetermined frequency of the sound signal SG (n−1) which is supplied from the gain adjusting unit 61-($n$−1), and supplies the sound signal SG' which is obtained as a result to the reproduction unit 26. For example, in the gain adjusting unit 61-$n$, the 10 kHz gain of the sound signals is adjusted.

Here, below, in a case where the gain adjusting unit 61-1 to the gain adjusting unit 61-$n$ are not individually distinguished, these are simply referred to as the gain adjusting unit 61.

<Equalizer Adjustment>

Figure 4:
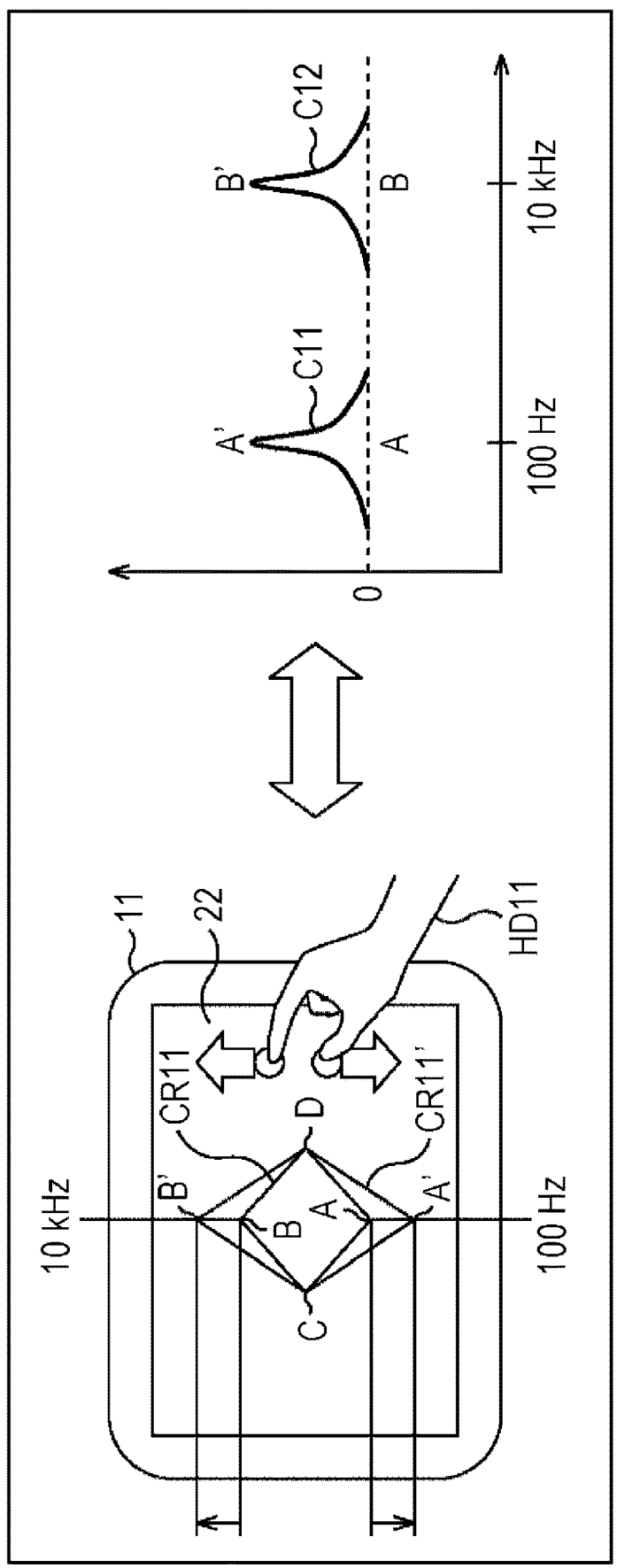
FIG. 4 is a diagram which describes gain adjustment using a control graphic.

In a case where equalizer adjustment is performed as the sound effect adjustment in the above sound effect adjusting unit 25, for example, a control graphic CR11 which is shown in FIG. 4 is displayed on the display unit 22 as the user interface for equalizer adjustment.

The control graphic CR11 is an image of a rectangle where four of a point A, a point B, a point C, and a point D are set as vertices, and the control graphic CR11 is linked to the sound parameters of the sound signals. That is, when the user performs an operation with respect to the control graphic CR11 and the control graphic CR11 continuously changes shape, the sound parameters are also continuously changed by being linked to this shape changing.

Specifically, the low frequency of the sound signal, for example, the 100 Hz gain, is associated with the point A of the control graphic CR11 and the high frequency of the sound signal, for example, the 10 kHz gain, is associated with the point B of the control graphic CR11. In addition, the state of the control graphic CR11 which is shown in FIG. 4 is set to be completely flat, in other words, a state where each frequency of the equalizer (gain) adjustment amount is 0.

From such a state, the display unit 22, in other words, the surface of the touch panel as the input unit 21 is set to be pinched outward by the user in the vertical direction with two fingers of their right hand HD11. In other words, the user contacts the touch panel with the index finger and thumb of their right hand HD11, and, from this state, an operation is performed where the index finger and the thumb trace the surface of the touch panel so as to be separated in the vertical direction in the diagram.

By so doing, the sound effect adjusting apparatus 11 senses the movement of the fingers of the user and converts the movement into the amount of sliding of the fingers. Then, in accordance with the obtained sliding amount, the sound effect adjusting apparatus 11 moves the point A and point B of the control graphic CR11 which are lined up in the vertical direction to the point A' and the point B', and a rectangular control graphic CR11' is set where the four of the point A', the point B', the point C, and the point D are set as the vertices. That is, the control graphic CR11 changes shape into the control graphic CR11'.

When such an operation is performed with respect to the control graphic CR11, the characteristics of the sound signals at 100 Hz, which are associated with the point A, and the characteristics of the sound signals at 10 kHz, which are associated with the point B are changed as shown in the right side in the diagram. Moreover, in FIG. 4, the horizontal axis and the vertical axis on the right side show the respective frequencies and the gains of each frequency. In particular, a curve C11 and a curve C12 show the gain in the vicinity of 100 Hz of the sound signal and the gain in the vicinity of 10 kHz.

In the control graphic CR11, since the 100 Hz gain is assigned to the point A, the movement amount from the point A to the point A' (amount of change) signifies the amount of change of the equalizer of the sound signal at 100 Hz. Therefore, when the point A moves to the point A', the characteristics of the sound signals at 100 Hz are changed from A (that is, 0) as shown in the curve C11 to A'. In other words, the gain of the sound signal at 100 Hz is increased or decreased in accordance with the amount of change of the position in the vertical direction of point A in the diagram.

In addition, in the control graphic CR11, since the gain at 10 kHz is assigned to the point B, the movement amount from the point B to the point B' (amount of change) signifies the amount of change of the equalizer of the sound signal at 10 kHz. Therefore, when the point B moves to the point B', the characteristics of the sound signals at 10 kHz are changed from B (that is, 0) to B' as shown in the curve C12. In other words, the gain of the sound signal at 10 kHz is increased or decreased in accordance with the amount of change of the position in the vertical direction of point B in the diagram.

Here, in more detail, as shown by the curve C11 and the curve C12, the gain of a predetermined frequency band which is centered on 100 Hz or 10 kHz is adjusted. In addition, the units of the gain are set to dB or the like, for example.

Figure 1:
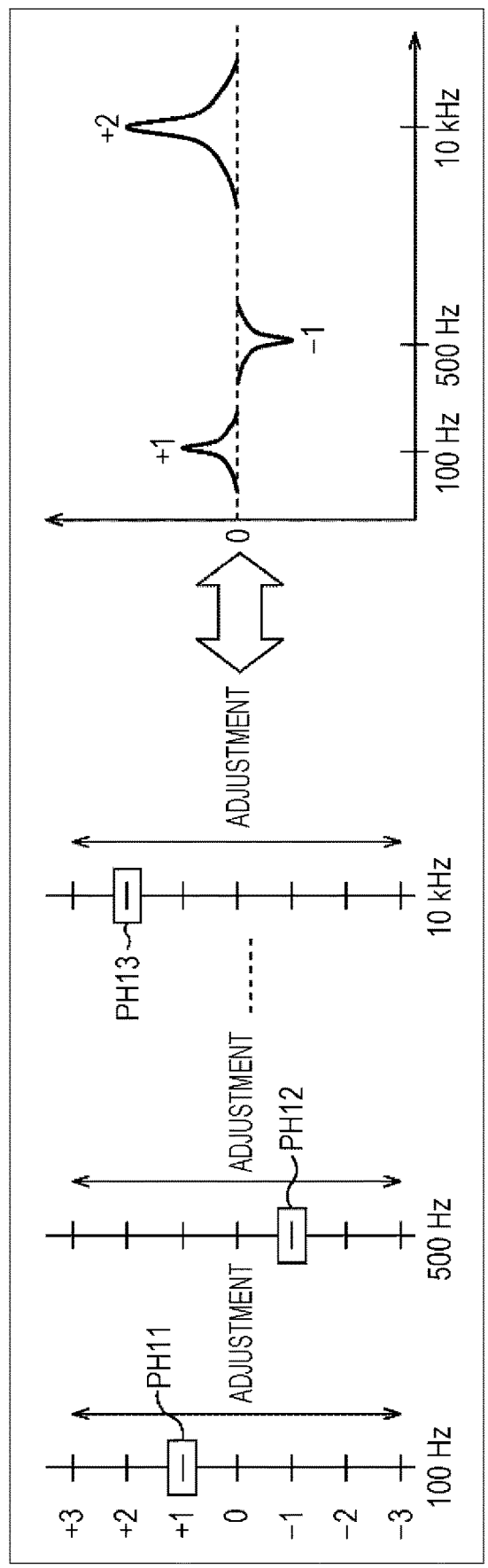
FIG. 1 is a diagram which describes equalizer adjustment of the related art.

In this manner, the sound effect adjusting apparatus 11 is able to perform equalizer adjustment according to the change of the shape of the control graphic CR11 rather than equalizer adjustment according to the slide bar as shown in FIG. 1.

The equalizer adjustment according to the slide bar which was described with reference to FIG. 1 is logical and it is possible to clearly recognize the amount of the adjustment as a numeric value; however, as explained above, not everyone may be able to understand the meaning or the intention thereof. In addition, an adjustment operation also has to be separately done for each frequency and it is not necessarily possible to intuitively understand as a whole what kind of adjustment to perform to obtain the sound effects as imagined.

In contrast, in the example of FIG. 4, it is possible to visualize and grasp the amount where only two sound parameters, the low frequency (100 Hz) and the high frequency (10 kHz), are concentrated, and the changes of the two sound parameters with one control graphic CR11. Therefore, the user is able to clearly recognize the relationship between the kind of change in the shape of the control graphic CR11 and the kind of sound effect which is obtained, and is able to intuitively perform the operations. Accordingly, even if the user does not know the details of the parameters, it is possible to adjust the characteristics of the sound signals to the equalizer characteristics according to personal preferences.

Furthermore, in order for the user to be able to more easily grasp the operation with respect to the control graphic CR11, an image which recalls the associated sound parameters may be displayed in the vicinity of the control graphic CR11.

For example, in the example of FIG. 4, the display unit 22 displays an image of a drum in the vicinity of point A of the control graphic CR11 and displays an image of a hi-hat in the vicinity of point B, and these images are further scaled and displayed by being linked to the shape changing of the control graphic CR11.

Due to this, the user is able to more intuitively perform operations with respect to the control graphic CR11, in other words, operations of equalizer adjustment. That is, for example, by looking at the image of the drum, it is possible for the user to easily grasp that the operation with respect to the point A is an operation relating to enhancing the low frequency of the sound signals.

Here, regarding the changing of the shape of the image, the changing of the shape may be performed by any method as long as it is possible to image the changes of the respective characteristics. In addition, in FIG. 4, description has been given of an example where the gain at both 100 Hz and 10 kHz is increased; however, it is of course possible to reduce the gain. Furthermore, gain adjustment is also possible only for 100 Hz or 10 kHz.

<Description of Sound Effect Adjusting Process>

Next, with reference to the flowchart in FIG. 5, description will be given of the sound effect adjusting process which is a process where the sound effect adjusting apparatus 11 performs equalizer adjustment (gain adjustment) with respect to the sound signal in accordance with the operation with respect to the control graphic CR11 which is shown in FIG. 4.

In step S11, the display control unit 33 supplies image data of the control graphic CR11 to the display unit 22 and displays the control graphic CR11 on the display unit 22. By so doing, the display unit 22 displays the control graphic CR11 based on the image data which are supplied from the display control unit 33.

When the control graphic CR11 is displayed on the display unit 22, the user performs operations with respect to the control graphic CR11. Here, the operations with respect to the control graphic CR11 may be performed on the control graphic CR11 or may be performed in a region in the vicinity of the control graphic CR11.

When the user performs an operation with respect to the control graphic CR11, the touch panel as the input unit 21 supplies a signal in accordance with an operation of the user to the control unit 23.

In step S12, the detection unit 31 detects an operation of the user with respect to the touch panel (control graphic CR11) based on the signal which is supplied from the input unit 21.

Specifically, the detection unit 31 detects the touch position of the user on the touch panel, in other words, the contact positions of the fingers of the user and the number of touches of the user on the touch panel, in other words, the number of fingers (number of touch positions) of the user which are in contact with the touch panel. In addition, the detection unit 31 detects the amount of movement of the fingers of the user which are in contact with the touch panel as the sliding amount.

For example, in the example of FIG. 4, since the user is touching the touch panel with the index finger and thumb of their right hand HD11, the number of touches which is detected by the detection unit 31 is 2. In addition, the contact positions of the index finger and thumb of the right hand HD11 on the touch panel are detected as the respective touch positions by the detection unit 31. Furthermore, the amount of movement (movement distance) of the index finger of the right hand HD11 on the touch panel and the amount of movement of the thumb of the right hand HD11 on the touch panel are detected by the detection unit 31 as the sliding amount of the respective fingers.

In step S13, the setting unit 32 determines whether or not the number of touches which is detected by the detection unit 31 is 2. For example, in the example shown in FIG. 4, the number of touches is determined as 2.

In a case where the number of touches in step S13 is determined as 2, in step S14, the setting unit 32 sets the movement distance of point A and point B of the control graphic CR11 in accordance with the sliding amount which is detected by the detection unit 31.

Specifically, in the example in FIG. 4, since the sliding amount of each finger is detected for each of the index finger and the thumb of the right hand HD11, the setting unit 32 selects either one from among the these two sliding amounts, for example, the larger one from among two sliding amounts. Then, the setting unit 32 sets a distance which is determined in advance with respect to the selected sliding amount as the movement distances of point A and point B. In such a case, the movement distances of point A and point B are the same distance. Here, for example, the movement distance of point A is the distance between the point A in FIG. 4 and the point A' which is the movement destination of point A.

Here, without being limited to one among the two sliding amounts, the movement distance of point A and point B may be determined from the average value or the like of the two sliding amounts.

In addition, the movement distances of point A and point B may be set to be determined separately. In such a case, for example, in FIG. 4, the movement distance of point B is determined based on the sliding amount of the index finger of which the touch position further to the upper side and the movement distance of point A is determined based on the sliding amount of the thumb of which the touch position further to the lower side.

In step S15, the display control unit 33 controls the display unit 22 based on the movement distances of point A and point B which are determined in step S14, and changes the shape of the control graphic CR11 in the vertical direction, that is, the direction of a straight line connecting point A and point B.

For example, in the example of FIG. 4, point A and point B are moved by only a determined movement distance. Due to this, the point A and point B are respectively moved to point A' and point B' and, as a result, the control graphic CR11 changes shape and becomes the control graphic CR11'.

Here, in a case where an operation by the user with respect to the control graphic CR11 is a pinch out operation as in the example of FIG. 4, the point A and point B change shape so as to move toward the outside of the control graphic CR11, and the control graphic CR11 is expanded.

On the contrary, in a case where the operation by the user with respect to the control graphic CR11 is a pinch in operation, that is, for example, an operation is performed where the user contacts the touch panel with the index finger and thumb of their right hand HD11 and, from this state, the index finger and thumb trace the touch panel surface so as to become closer in the vertical direction in FIG. 4. In such a case, the point A and point B are moved closer to each other by only a movement distance which is determined in accordance with the pinch in operation by the user, and the control graphic CR11 is reduced in size.

In step S16, the control signal generating unit 34 determines the gain in accordance with the change in the shape of the control graphic CR11.

For example, the control signal generating unit 34 determines the gain of the equalizer at 100 Hz in accordance with the movement distance and movement direction of the point A in the example of FIG. 4, and determines the gain of the equalizer at 10 kHz in accordance with the movement distance and movement direction of the point B.

At this time, in a case where the movement direction of the point A and the point B is a direction to the outside of the control graphic CR11, the gain at 100 Hz and 10 kHz of the sound signals which are associated with the point A and point B respectively is amplified. In contrast, in a case where the movement direction of the point A and the point B is a direction to the inside of the control graphic CR11, the gain at 100 Hz and 10 kHz of the sound signals which are associated with the point A and point B respectively is attenuated.

In addition, for the amplification amount or the attenuation amount of the gain of each frequency which is associated with the point A and point B, the absolute values of the amplification amount or the attenuation amount of the gain are determined to increase continuously as the movement distance of the points becomes longer.

When the positions of the point A' and the point B' with respect to the state of the control graphic CR11 which is completely flat, that is, the gains (equalizer adjustment amounts) of each frequency based on the movement direction and the movement distance of the point A and the point B, are determined, the control signal generating unit 34 generates a control signal in accordance with the determined gain. That is, the control signal generating unit 34 generates a control signal which shows the gain of the sound signal such that the determined gain characteristics are obtained, and performs supply thereof to each gain adjusting unit 61 of the sound effect adjusting unit 25.

In step S17, the sound effect adjusting unit 25 performs equalizer adjustment with respect to the sound signal which is supplied from the acquisition unit 24 based on the control signal from the control signal generating unit 34 and supplies the sound signal which is obtained as a result to the reproduction unit 26.

Specifically, for example, the operation which is shown in FIG. 4 is performed and, in the gain adjusting unit 61-1 and the gain adjusting unit 61-$n$ among the gain adjusting units 61, the gain adjustment is performed for 100 Hz and 10 kHz respectively.

In such a case, the gain adjusting unit 61-1 performs gain adjustment at 100 Hz based on the control signal with respect to the sound signal SG which is supplied from the acquisition unit 24, and supplies the sound signal SG1 which is obtained as a result to the gain adjusting unit 61-2. In addition, the gain adjusting unit 61-2 to the gain adjusting unit 61-($n$−1) supply the sound signal which is supplied from the gain adjusting unit 61-1 to the gain adjusting unit 61-($n$−2) of the previous stage as is to the gain adjusting unit 61-3 to the gain adjusting unit 61-$n$ of the next stage.

Furthermore, the gain adjusting unit 61-$n$ performs gain adjustment at 10 kHz based on the control signal with respect to the sound signal SG(n−1) which is supplied from the gain adjusting unit 61-($n$−1), and supplies the sound signal SG' which is obtained as a result to the reproduction unit 26. The reproduction unit 26 reproduces the audio based on the sound signal SG' which is supplied from the gain adjusting unit 61-$n$.

When the gain adjustment of the sound signal is performed in this manner, the sound effect adjusting process is finished. Here, in practice, the process of step S15 and the process of step S17 are performed at approximately the same time.

In addition, in step S13, in a case where the number of touches is determined not to be 2, that is, in a case where the number of touches which is detected by the detection unit 31 is 1, the process proceeds to step S18.

In step S18, the setting unit 32 determines whether or not the touch positions which are detected by the detection unit 31 are at the side which is lower than the center of the control graphic CR11, that is, at the point A side. For example, in FIG. 4, in a case where the touch position of the user is at the side which is lower than a straight line connecting point C and point D in the figure, the touch position is determined as being at the side which is lower than the center of the control graphic CR11.

In a case where the touch position is determined as being at the side which is lower than the center of the control graphic CR11 in step S18, in step S19, the setting unit 32 sets the movement distance of the point A of the control graphic CR11 in accordance with the sliding amount which is detected by the detection unit 31. Specifically, the setting unit 32 sets the distance which is determined in advance with respect to one detected sliding amount as the movement distance of the point A.

In step S20, the display control unit 33 controls the display unit 22 based on the movement distance of the point A which is determined in step S19 and changes the shape of the control graphic CR11 in the direction from the point B toward the point A, which is the downward direction, that is, the direction of a straight line which connects the point A and the point B.

For example, the control graphic CR11 changes shape to a graphic where the point A', the point B, the point C, and the point D are set as vertices. Here, in a case where an operation where the point A is moved to the upper side in FIG. 4 is performed by the user, that is, in a case where the sliding direction of the fingers of the user is the upper side in FIG. 4, the control graphic CR11 changes shape such that the point A moves to the upper side.

In step S21, the control signal generating unit 34 determines the gain in accordance with the change in the shape of the control graphic CR11.

Specifically, the control signal generating unit 34 determines the gain of the equalizer at 100 Hz which is the frequency which is associated with the point A in accordance with the movement distance and the movement direction of the point A. Here, in step S21, the gain is determined in the same manner as the case in step S16.

When the gain (equalizer adjusting amount) of the frequency which is associated with the point A is determined, the control signal generating unit 34 generates a control signal in accordance with the determined gain and performs supply thereof to each gain adjusting unit 61 of the sound effect adjusting unit 25.

In step S22, the sound effect adjusting unit 25 performs equalizer adjustment with respect to the sound signal which is supplied from the acquisition unit 24 based on the control signal from the control signal generating unit 34 and supplies the sound signal which is obtained as a result to the reproduction unit 26. That is, in step S22, a process which is similar to that of step S17 is performed. However, in step S22, only the equalizer adjustment (gain adjustment) of the frequency which is associated with the point A is performed.

When the equalizer adjustment of the sound signal is performed, the sound effect adjusting unit 25 supplies the sound signal which is obtained as a result to the reproduction unit 26 and the sound effect adjusting process is finished. In the reproduction unit 26, the audio is reproduced based on the sound signal which is supplied from the sound effect adjusting unit 25.

Furthermore, in step S18, in a case where the touch position is not at the side which is lower than the center of the control graphic CR11, that is, where it is determined that the touch position is at the side which is above the center of the control graphic CR11, the process proceeds to step S23.

In step S23, the setting unit 32 sets the movement distance of point B of the control graphic CR11 in accordance with the sliding amount which is detected by the detection unit 31. Specifically, the setting unit 32 sets the distance which is determined in advance with respect to one detected sliding amount as the movement distance of the point B.

In step S24, the display control unit 33 controls the display unit 22 based on the movement distance of the point B which is determined in step S23 and changes the shape of the control graphic CR11 in the direction from the point A toward the point B, which is the upward direction, that is, the direction of a straight line which connects the point A and the point B.

For example, the control graphic CR11 changes shape to a graphic where the point A, the point B', the point C, and the point D are set as vertices. Here, in a case where an operation where the point B is moved to the lower side in FIG. 4 is performed by the user, that is, in a case where the sliding direction of the fingers of the user is the lower side in FIG. 4, the control graphic CR11 changes shape such that the point B moves to the lower side.

In step S25, the control signal generating unit 34 determines the gain in accordance with the change in the shape of the control graphic CR11.

Specifically, the control signal generating unit 34 determines the gain of the equalizer at 10 kHz which is the frequency which is associated with the point B in accordance with the movement distance and the movement direction of the point B. Here, in step S25, the gain is determined in the same manner as the case in step S16.

When the gain (equalizer adjusting amount) of the frequency which is associated with the point B is determined, the control signal generating unit 34 generates a control signal in accordance with the determined gain and performs supply thereof to each gain adjusting unit 61 of the sound effect adjusting unit 25.

In step S26, the sound effect adjusting unit 25 performs equalizer adjustment with respect to the sound signal which is supplied from the acquisition unit 24 based on the control signal from the control signal generating unit 34 and supplies the sound signal which is obtained as a result to the reproduction unit 26. That is, in step S26, a process which is similar to that of step S17 is performed, and the gain of the frequency which is associated with the point B is adjusted.

When the equalizer adjustment of the sound signal is performed, the sound effect adjusting unit 25 supplies the sound signal which is obtained as a result to the reproduction unit 26 and the sound effect adjusting process is finished. In the reproduction unit 26, the audio is reproduced based on the sound signal which is supplied from the sound effect adjusting unit 25.

In the above manner, the sound effect adjusting apparatus 11 changes the shape of the control graphic CR11 in accordance with an operation by the user with respect to the control graphic CR11, and performs equalizer adjustment with respect to the sound signal in accordance with the change in shape.

According to the sound effect adjusting apparatus 11, at the same time as the point A and the point B which are associated with the sound parameters for equalizer adjustment in accordance with the operation by the user are moved and the control graphic CR11 changes shape, the sound effect is adjusted in accordance with the change of shape, whereby it is possible to realize an intuitive operation for the user. That is, with respect to the user, it is possible to provide an easy-to-use user interface which is easier to understand. Due to this, the user is able to easily know the kind of sound effect which is obtained from the kind of change in the shape of the control graphic CR11.

Here, in the present specification, description is given only of a representative operation as an operation with respect to the control graphic CR11; however, in consideration of many other operations as variations of the operation with respect to the control graphic CR11, it is possible to apply the present technology with respect to the adjustment of sound effects corresponding to these variations in the operations.

In addition, description has been given of an example where an operation is performed with respect to the control graphic by the user performing a touching operation or the like with respect to the touch panel as the input unit 21;

however, other than this, an operation may be performed with respect to the control graphic by the user operating a mouse as the input unit 21.

In such a case, for example, the user moves a pointer which is displayed along with the control graphic on the display unit 22 and performs a clicking operation or a sliding operation with respect to the control graphic by operating the mouse of the input unit 21. By so doing, the detection unit 31 detects the operation by the user with respect to the control graphic based on the signal which is supplied from the input unit 21 and the display control unit 33 and the control signal generating unit 34 change the shape of the control graphic and generate a control signal in accordance with the detection result of the detection unit 31.

<Second Embodiment>
<Equalizer Adjustment>

In the above, description has been given of an example where the gain adjustment of predetermined frequencies is associated with the point A and the point B of the control graphic CR11; however, other sound parameters which are different to the gain of the predetermined frequencies may also be associated with the point C and the point D of the control graphic CR11.

Figure 6:
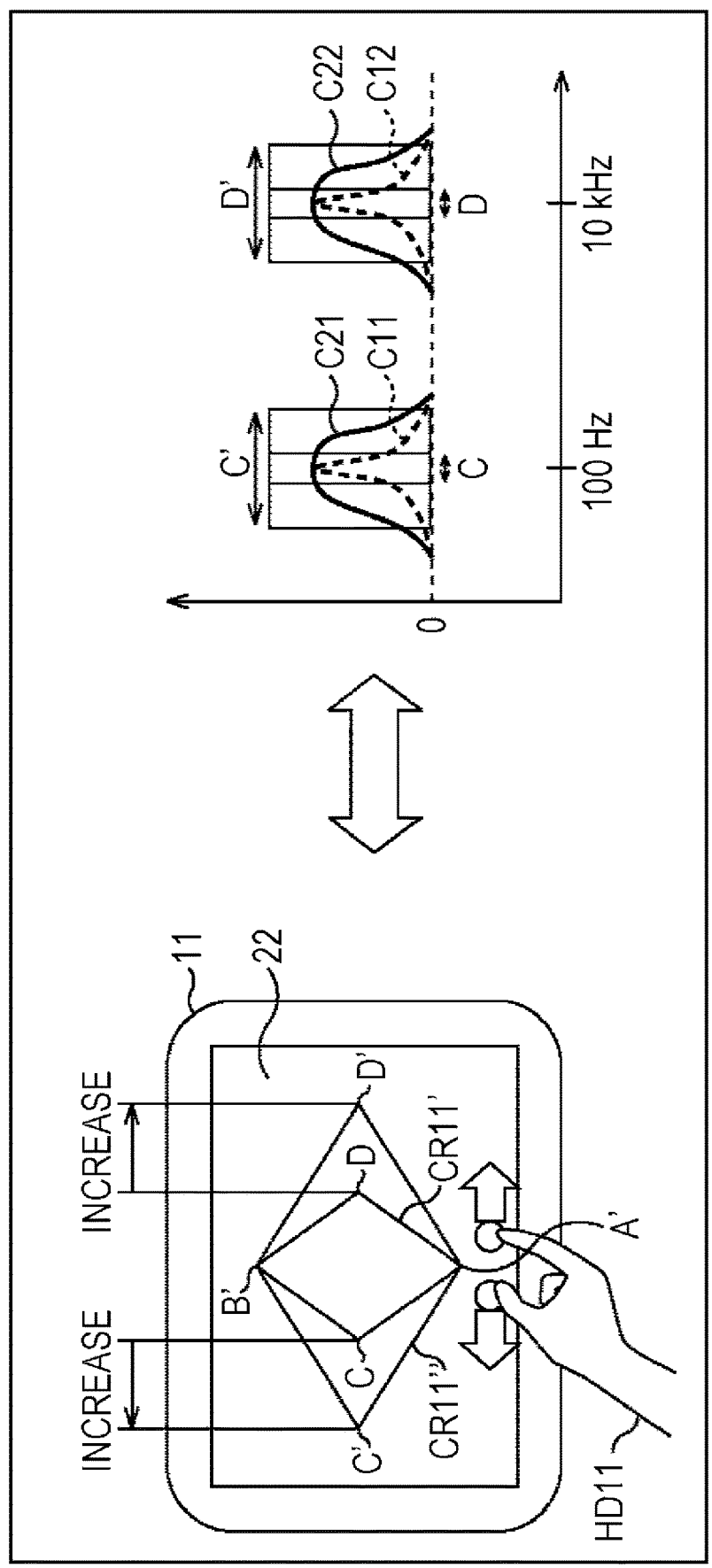
FIG. 6 is a diagram which describes adjustment of a Q value using the control graphic.

In such a case, for example, it is considered that the Q value (sharpness) of the equalizer as the sound parameter is associated with the point C and the point D as shown in FIG. 6. Here, in FIG. 6, in the portion which corresponds to the case in FIG. 4, the same reference numerals are used and description thereof is omitted.

In FIG. 6, the control graphic CR11 changes shape and the obtained control graphic CR11' is displayed on the display unit 22.

The gain at 100 Hz and the gain at 10 kHz are respectively associated with the point A' and the point B' of the control graphic CR11' in the example of FIG. 6, and the control graphic CR11' changes from a completely flat state to a state where the gains at 100 Hz and 10 kHz are increased.

In addition, in this example, the Q value of the gain at 100 Hz is associated with the point C of the control graphic CR11' and the Q value of the gain at 10 kHz is associated with the point D.

For example, as shown in FIG. 6, the user pinches out in the horizontal direction with two fingers of their right hand HD11 on the display unit 22 (touch panel). By so doing, the sound effect adjusting apparatus 11 senses the movement of the fingers of the user and converts the movement into the sliding amount of the fingers. Then, in accordance with the obtained sliding amount, the sound effect adjusting apparatus 11 moves the point C and the point D of the control graphic CR11 which are lined up in the horizontal direction to a point C' and a point D' and sets a rectangular control graphic CR11" where the four of the point A', the point B', the point C', and the point D' are set as vertices. In other words, the control graphic CR11' changes shape into the control graphic CR11".

Here, the pinching out operation is performed by the right hand HD11 of the user in a region which is outside the control graphic CR11' on the display unit 22; however, the operation of the user with respect to the control graphic CR11' may of course be performed in a region which is inside the control graphic CR11'.

When this kind of operation is performed with respect to the control graphic CR11', the Q value of 100 Hz of the sound signal which is associated with the point C and the Q value of 10 kHz of the sound signal which is associated with the point D are changed as shown in the right side in the diagram. Here, in FIG. 6, the horizontal axis and the vertical axis on the right side show the respective frequencies and the gains of each frequency. In particular, a curve C21 and a curve C22 show the gain in the vicinity of 100 Hz of the sound signal and the gain in the vicinity of 10 kHz.

In the control graphic CR11', since the Q value of the gain at 100 Hz is associated with the point C, the movement amount (change amount) from the point C to the point C' signifies the change amount of the Q value of the 100 Hz equalizer of the sound signal.

Therefore, when the point C is moved to the point C', the gain characteristic in the vicinity of 100 Hz of the sound signal is changed from the curve C11 to the curve C21. In other words, the width (sharpness) in the frequency direction of the curve which shows the gain in the vicinity of 100 Hz of the sound signal is widened.

In the same manner, in the control graphic CR11', since the Q value of the gain at 10 kHz is associated with the point D, the movement amount (change amount) from the point D to the point D' signifies the change amount of the Q value of the 10 kHz equalizer of the sound signal. Therefore, when the point D is moved to the point D', the gain characteristic in the vicinity of 10 kHz of the sound signal is changed from the curve C12 to the curve C22. In other words, the width in the frequency direction of the curve which shows the gain in the vicinity of 10 kHz of the sound signal is widened.

Since widening the width of the control graphic CR11' in this manner is equivalent to decreasing the Q value of the associated frequency and widening the adjustment bandwidth of the gain in terms of sound quality, it is possible to obtain a sound effect with a stronger sense of boosting.

For the operation in the horizontal direction with respect to the control graphic CR11, that is, the operation with respect to the point C and the point D, the degree of matching of the images of the changes of the graphic which is the control graphic CR11 and the characteristics of the equalizer may be said to be highly intuitive. In this manner, when it is possible to realize the adjustment of not only the gain of the 10 kHz and 100 Hz equalizers, but also of the respective Q values by changing the shape of one control graphic CR11', it is possible to improve the usability.

Furthermore, in order to make it possible for the user to more easily grasp the operation with respect to the control graphic CR11', an image which recalls the associated sound parameters may be displayed in the vicinity of the point C and the point D of the control graphic CR11'.

For example, an image of a drum is displayed in the vicinity of the point C and an image of a hi-hat is displayed in the vicinity of point D, and these images are further scaled in the horizontal direction only and displayed by being linked to the shape changing of the control graphic CR11'. Due to this, it is possible for the user to more intuitively perform operations with respect to the control graphic CR11'.

Here, regarding the changing of the shape of the image, the changing of the shape may be performed by any method as long as it is possible to image the changes of the respective characteristics. However, in a case where the image of the drum and the hi-hat are also displayed in the vicinity of the point A' and the point B', the methods of changing the shapes of these images are made to be different.

Specifically, the image of the drum is displayed in the vicinity of the point C and in the vicinity of the point A' and the image of the hi-hat is displayed in the vicinity of the point D and in the vicinity of the point B'. In such a case, for the images which are arranged in the vicinity of the point A' and the point B', the sizes of the images are changed. In addition, for the images which are arranged in the vicinity of the point C and the point D, the shading of colors and resolution of the images are changed. Due to this, it is possible for the user to easily grasp the differences in the sound effects.

<Description of Sound Effect Adjustment Process>

Figure 7:
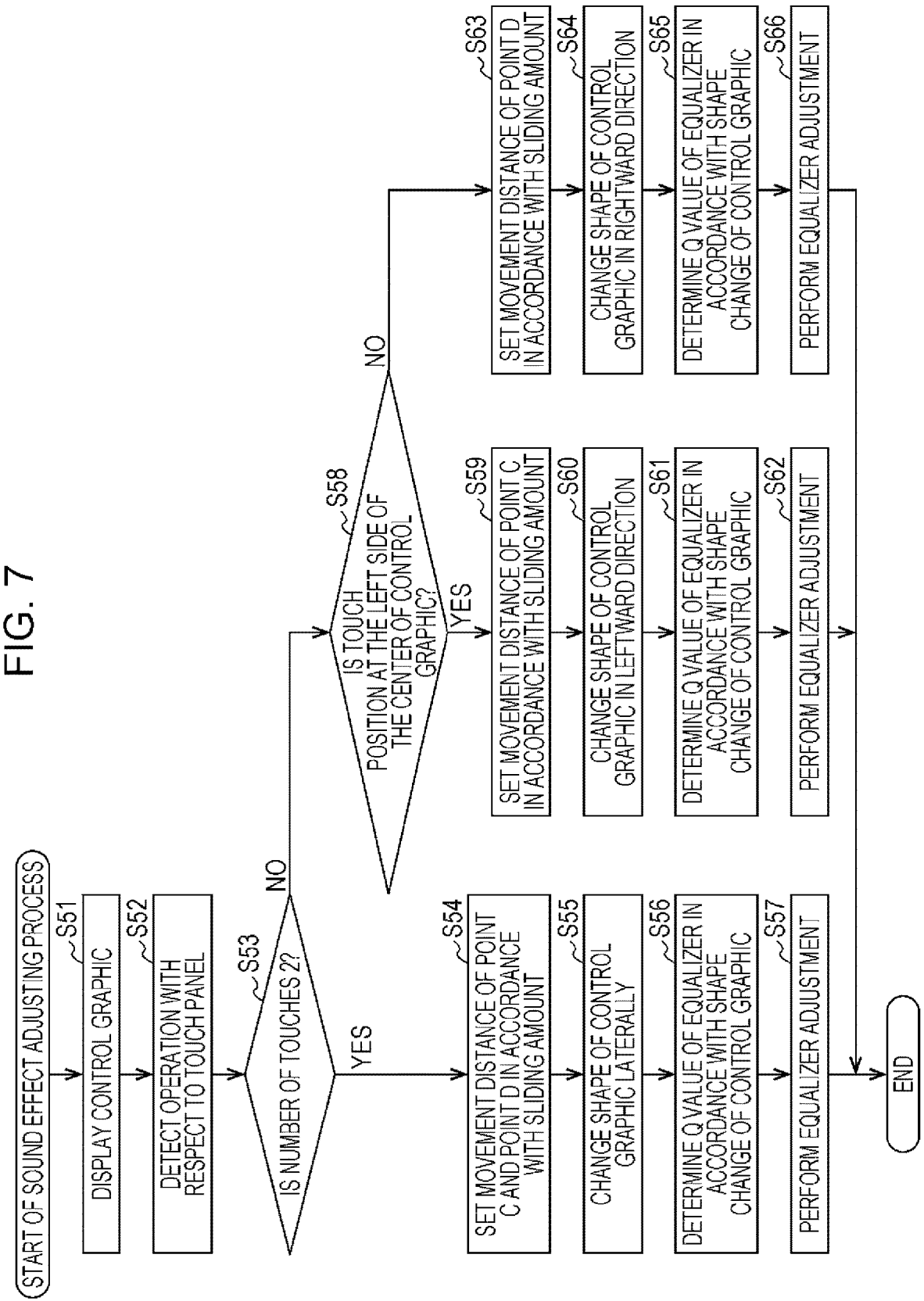
FIG. 7 is a flowchart which describes the sound effect adjustment process.

As shown in FIG. 6, in a case where an operation is performed in the horizontal direction with respect to the control graphic, the sound effect adjusting apparatus 11 performs the sound effect adjusting process which is shown in the flowchart of FIG. 7 and performs equalizer adjustment with respect to the sound signal. Below, with reference to the flowchart of FIG. 7, description will be given of the sound effect adjusting process using the sound effect adjusting apparatus 11.

Figure 5:
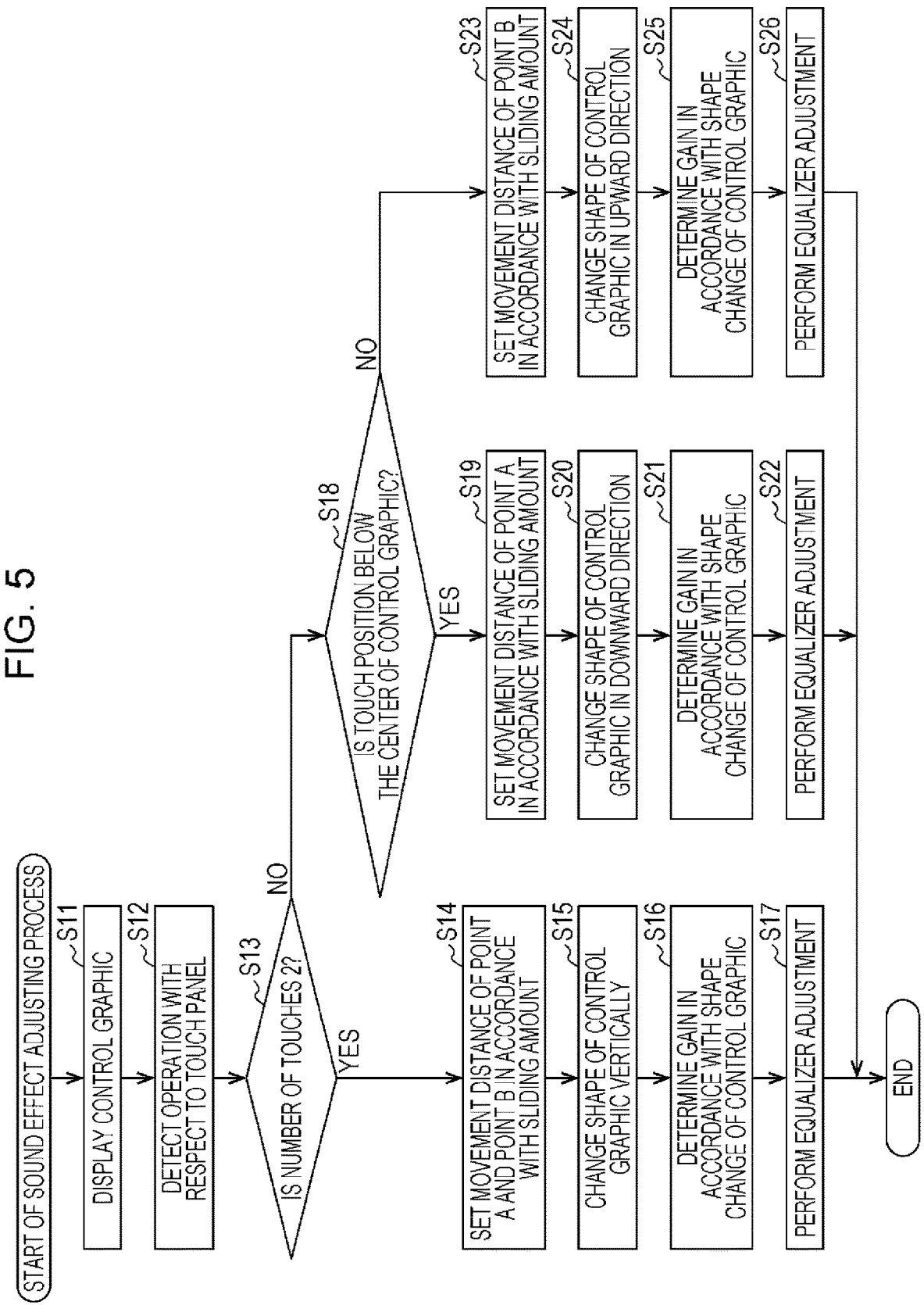
FIG. 5 is a flowchart which describes a sound effect adjustment process.

Here, since the processes of step S51 to step S53 are the same as the processes of step S11 to step S13 of FIG. 5, description thereof will be omitted. However, in the process of step S51, for example, the control graphic CR11' which is shown in FIG. 6 is displayed on the display unit 22. In addition, in the following, description will continue with the case where the control graphic CR11' is displayed as an example.

In a case where it is determined in step S53 that the number of touches is 2, in step S54, the setting unit 32 sets the movement distance of the point C and the point D of the control graphic CR11' in accordance with the sliding amount which is detected by the detection unit 31. For example, in step S53, the movement distance of the point C and the point D is set by performing the same process as in step S14 of FIG. 5.

In step S55, the display control unit 33 controls the display unit 22 based on the movement distance of the point C and the point D which are determined in step S54, and the control graphic CR11 changes shape in the left and right direction, that is, the direction of a straight line which connects the point C and the point D.

For example, in the example of FIG. 6, the point C and the point D are moved by only the determined movement distance. Due to this, the point C and the point D are respectively moved to the point C' and the point D' and as a result the control graphic CR11' changes shape to become the control graphic CR11".

Here, in a case where the operation of the user with respect to the control graphic CR11' is a pinching out operation as shown in the example of FIG. 6, the change of shape is performed such that the point C and the point D move toward the outside of the control graphic CR11', and the control graphic CR11' is expanded. On the contrary, in a case where the user performs a pinching in operation, the point C and the point D are moved so as to become closer to each other by only a movement distance which is determined in accordance with the operation, and the control graphic CR11' is reduced in size.

In step S56, the control signal generating unit 34 determines the Q value of the equalizer in accordance with the change of shape of the control graphic CR11'.

For example, the control signal generating unit 34 determines the Q value of the 100 Hz equalizer in accordance with the movement distance and movement direction of the point C in the example of FIG. 6 and determines the Q value of the 10 kHz equalizer in accordance with the movement distance and movement direction of the point D.

At this time, in a case where the movement direction of the point C and the point D is a direction to the outside of the control graphic CR11', the Q values of the gains of 100 Hz and 10 kHz of the sound signal which are associated with the point C and the point D respectively are reduced. In contrast, in a case where the movement direction of the point C and the point D is a direction to the inside of the control graphic CR11', the Q values of the gains of 100 Hz and 10 kHz of the sound signal which are associated with the point C and the point D respectively are increased.

In addition, the amount of increase or decrease of the Q values of the gain for each frequency which is associated with the point C or the point D is determined such that the absolute values of the amplification amount or the attenuation amount of the Q values of the gain increase continuously as the movement distance of the points becomes longer.

When the Q values of the gain (equalizer) of each frequency are determined based on the positions of the point C' and the point D' of the control graphic CR11", that is, the movement direction and the movement distance of the point C and the point D, the control signal generating unit 34 generates a control signal in accordance with the determined Q values. That is, the control signal generating unit 34 generates a control signal which shows the Q values of the sound signal such that the equalizer characteristics (gain characteristics) of the determined Q values are obtained, and performs supply thereof to each gain adjusting unit 61 of the sound effect adjusting unit 25.

In step S57, the sound effect adjusting unit 25 performs equalizer adjustment with respect to the sound signal which is supplied from the acquisition unit 24 based on the control signal from the control signal generating unit 34 and supplies the sound signal which is obtained as a result to the reproduction unit 26.

Specifically, each gain adjusting unit 61 performs gain adjustment with respect to the supplied sound signal with the gain and the Q value which are shown by the control signal. When the gain adjustment (equalizer adjustment) is performed with respect to the sound signal, the sound effect adjusting unit 25 supplies the obtained sound signal to the reproduction unit 26. The reproduction unit 26 reproduces the audio based on the sound signal which is supplied from the sound effect adjusting unit 25. In this manner, when the equalizer adjustment of the sound signal is performed, the sound effect adjusting process is finished.

In addition, in step S53, in a case where the number of touches is determined not to be 2, that is, in a case where the number of touches which is detected by the detection unit 31 is 1, the process proceeds to step S58.

In step S58, the setting unit 32 determines whether or not the touching position which is detected by the detection unit 31 is at the side to the left of the center of the control graphic CR11', that is, the point C side. For example, in FIG. 6, in a case where the touch position according to the user is on a side to the left of a straight line which connects the point A' and the point B' in the diagram, the touch position is determined as being at the side to the left of the center of the control graphic CR11'.

In step S58, in a case where the touch position is determined as being at the side to the left of the center of the control graphic CR11', in step S59, the setting unit 32 sets the movement distance of the point C of the control graphic CR11' in accordance with the sliding amount which is detected by the detection unit 31. Specifically, the setting unit 32 sets the distance which is determined in advance with respect to one detected sliding amount as the movement distance of the point C.

In step S60, the display control unit 33 controls the display unit 22 based on the movement distance of the point C which is determined by the step S59 and changes the shape of the control graphic CR11' in the direction from the point D to the point C which is the direction to the left, that is, the direction of a straight line which connects the point C and the point D.

For example, the control graphic CR11' changes shape to a graphic where the point A', the point B', the point C', and the point D are set as vertices. Here, in a case where an operation where the point C is moved in the direction to the right in FIG. 6 is performed by the user, that is, in a case where the sliding direction of the user's finger is the direction to the right in FIG. 6, the control graphic CR11' changes shape such that the point C is moved to the right side.

In step S61, the control signal generating unit 34 determines the Q value of the equalizer in accordance with the change of shape of the control graphic CR11'.

Specifically, the control signal generating unit 34 determines the Q value of the 100 Hz equalizer which is associated with the point C in accordance with the movement distance and the movement direction of the point C. Here, in step S61, the gain is determined in the same manner as in step S56.

When the Q value of the frequency which is associated with the point C is determined, the control signal generating unit 34 generates a control signal in accordance with the determined Q value, and performs supply thereof to each gain adjusting unit 61 of the sound effect adjusting unit 25.

In step S62, the sound effect adjusting unit 25 performs equalizer adjustment with respect to the sound signal which is supplied from the acquisition unit 24 based on the control signal from the control signal generating unit 34 and supplies the sound signal which is obtained as a result to the reproduction unit 26. That is, in step S62, a process which is similar to that of step S57 is performed.

When the equalizer adjustment of the sound signal is performed, the sound effect adjusting unit 25 supplies the sound signal which is obtained as a result to the reproduction unit 26 and the sound effect adjusting process is finished. In the reproduction unit 26, the audio is reproduced based on the sound signal which is supplied from the sound effect adjusting unit 25.

Furthermore, in step S58, in a case where it is determined that the touch position is not at the side to the left of the center of the control graphic CR11', that is, that the touch position is at the side to the right of the center of the control graphic CR11', the process proceeds to step S63.

In step S63, the setting unit 32 sets the movement distance of the point D of the control graphic CR11' in accordance with the sliding amount which is detected by the detection unit 31. Specifically, the setting unit 32 sets the distance which is determined in advance with respect to one detected sliding amount as the movement distance of the point D.

In step S64, the display control unit 33 controls the display unit 22 based on the movement distance of the point D which is determined by the step S63 and changes the shape of the control graphic CR11' in the direction from the point C to the point D which is the direction to the right, that is, the direction of a straight line which connects the point C and the point D.

For example, the control graphic CR11' changes shape to a graphic where the point A', the point B', the point C, and the point D' are set as vertices. Here, in a case where an operation where the point D is moved in the direction to the left in FIG. 6 is performed by the user, that is, in a case where the sliding direction of the user's finger is the direction to the left in FIG. 6, the control graphic CR11' changes shape such that the point D is moved in the left direction.

In step S65, the control signal generating unit 34 determines the Q value of the equalizer in accordance with the change of shape of the control graphic CR11'.

Specifically, the control signal generating unit 34 determines the Q value of the 10 kHz equalizer which is associated with the point D in accordance with the movement distance and the movement direction of point D. Here, in step S65, the Q value is determined in the same manner as in step S56.

When the Q value of the frequency which is associated with the point D is determined, the control signal generating unit 34 generates a control signal in accordance with the determined Q value, and performs supply thereof to each gain adjusting unit 61 of the sound effect adjusting unit 25.

In step S66, the sound effect adjusting unit 25 performs equalizer adjustment with respect to the sound signal which is supplied from the acquisition unit 24 based on the control signal from the control signal generating unit 34 and supplies the sound signal which is obtained as a result to the reproduction unit 26. That is, in step S66, a process which is similar to that of step S57 is performed and the gain of the frequency which is associated with the point D is adjusted.

When the equalizer adjustment of the sound signal is performed, the sound effect adjusting unit 25 supplies the sound signal which is obtained as a result to the reproduction unit 26 and the sound effect adjusting process is finished. In the reproduction unit 26, the audio is reproduced based on the sound signal which is supplied from the sound effect adjusting unit 25.

In the above manner, the sound effect adjusting apparatus 11 changes the shape of the control graphic CR11' in accordance with a horizontal direction operation of the user with respect to the control graphic CR11', and performs equalizer adjustment with respect to the sound signal with the Q value in accordance with the change in shape.

According to the sound effect adjusting apparatus 11, at the same time as the point C and the point D which are associated with the sound parameters for equalizer adjustment in accordance with the operation of the user are moved and the control graphic CR11' changes shape, the sound effect is adjusted in accordance with the change of shape, whereby it is possible to realize an intuitive operation for the user. That is, with respect to the user, it is possible to provide an easy-to-use user interface which is easier to understand.

Here, in the present specification, description is given only of a representative operation as an operation of the change of the Q value with respect to the control graphic CR11'; however, in consideration of many other operations as variations of the operation with respect to the control graphic CR11', it is possible to apply the present technology with respect to the adjustment of sound effects corresponding to these variations in the operations.

In addition, the display control unit 33 displays a switching image for changing the sound parameter which are associated with the control graphic on the display unit 22 along with the control graphic CR11' and the user performs an operation with respect to the switching image, whereby the control graphic which is displayed may be switched. In such a case, for example, when the user touches the switching image in a state where the control graphic CR11' is displayed, the display control unit 33 displays another control graphic which is different to the control graphic CR11' instead of the control graphic CR11' which has been displayed up to that point. For example, sound parameters for adjusting other sound effects which are different to the equalizer effect are associated with each vertex of the control graphic.

<Third Embodiment>
<Equalizer Adjustment>

Furthermore, from the state of the control graphic CR11' which is shown in FIG. 4, the user may perform an operation in the horizontal direction with respect to the control graphic CR11' and make it possible to divide the point A' and the point B' into another two points.

Figure 8:
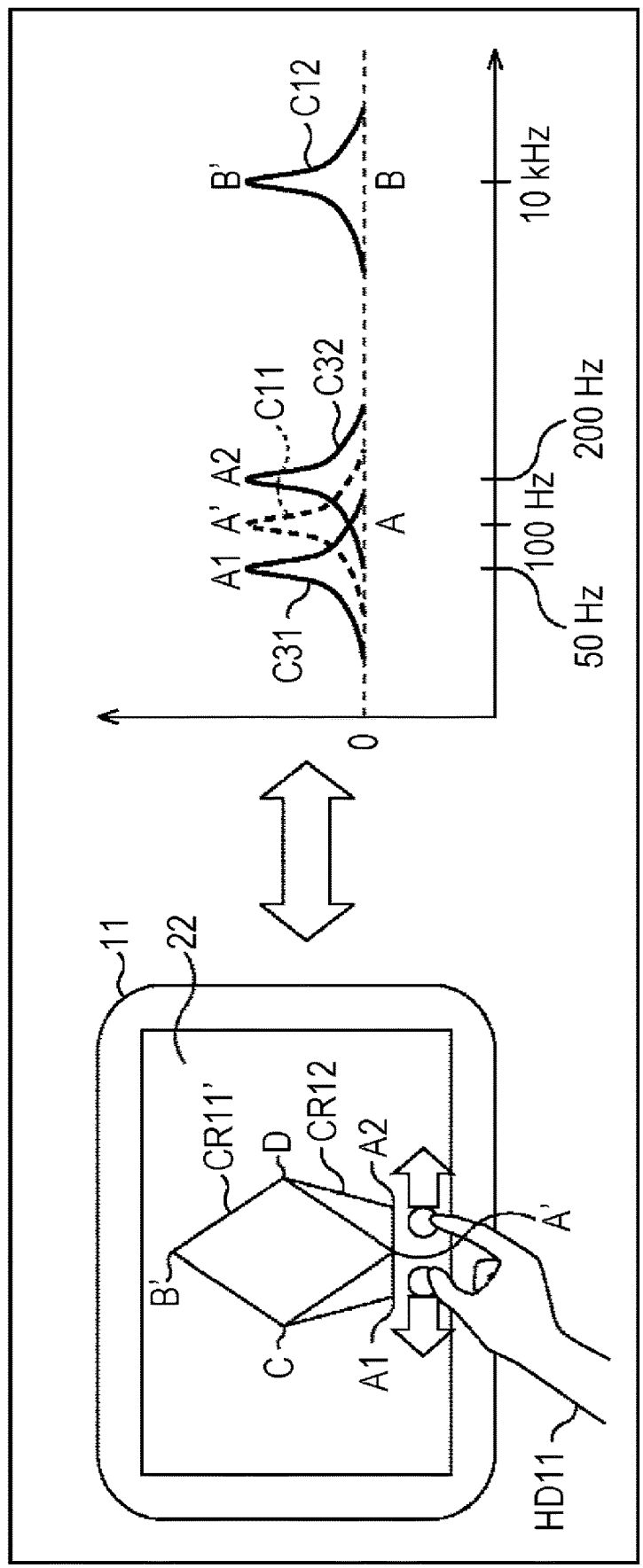
FIG. 8 is a diagram which describes another example of gain adjustment using the control graphic.

In such a case, when an operation in the horizontal direction is performed with respect to the point A' of the control graphic CR11', for example, the point A' is divided into a point A1 and a point A2 as shown in FIG. 8. Here, in FIG. 8, the same reference numerals are used in the division corresponding to the case in FIG. 4, and description thereof will be omitted as appropriate.

In this example, the sound parameters are not associated with the point C and the point D of the control graphic CR11'. In addition, in this example, in a state where the control graphic CR11' is displayed, the user performs a pinching out operation with respect to a region of the lower side of the control graphic CR11' in the diagram with their right hand HD11.

When such a pinching out operation is performed, the point A' of the control graphic CR11' is divided into two of the point A1 and the point A2. Due to this, the control graphic CR11' changes shape into a pentagon-shaped control graphic CR12 where the point A1, the point A2, the point B', the point C, and the point D are set as vertices.

In the control graphic CR12 which is obtained by the change of shape, the gain at 50 Hz is associated with the point A1 and the gain at 200 Hz is associated with the point A2.

In addition, according to the division of the point A' into the point A1 and the point A2, the gain characteristics of the sound signal are changed as shown in the right side in the diagram. Here, in FIG. 8, the horizontal axis and the vertical axis on the right side show the respective frequencies and the gains of each frequency. In particular, a curve C31 and a curve C32 show the gain in the vicinity of 50 Hz of the sound signal and the gain in the vicinity of 200 kHz.

In the state where the control graphic CR11' is displayed, the gain characteristic at 100 Hz which is associated with the point A' is the characteristic which is shown by the curve C11. In such a state, the gain of 50 Hz and 200 Hz are 0.

Thereafter, when the point A' is divided into the point A1 and the point A2, the gain of 100 Hz which is associated with the point A' becomes 0, and the gain in the vicinity of 50 Hz and 200 Hz which is associated with the point A1 and the point A2 which are obtained by the division as shown by the curve C31 and the curve C32. In this example, the gain at 50 Hz and 200 Hz is the same size as the gain at 100 Hz which is shown in the curve C11. In this manner, the point A' is divided into the two points of the point A1 and the point A2 and the gain of the frequencies which are associated with these points is changed, whereby it is possible to more finely adjust the equalizer characteristic.

When the operation which divides the point A' into the point A1 and the point A2 in this manner is performed, the display control unit 33 displays the control graphic CR12 after the division on the display unit 22, and the control signal generating unit 34 generates a control signal in accordance with the division of the point A' and performs supply thereof to the sound effect adjusting unit 25. Then, the sound effect adjusting apparatus 25 adjusts the gain of the sound signal at 50 Hz and 200 Hz in accordance with the supplied control signal.

Here, description has been given of an example where the point A' is divided into the point A1 and the point A2; however, it is possible to divided the point B' into two of a point B1 and a point B2 in the same manner. For example, in a case where the division of the point A' and the division of the point B' are performed, when a sliding operation in the horizontal direction is performed by the user in a region of the side in the diagram which is above a straight line which connects the point C and the point D in FIG. 8, the point B' is divided. In addition, when a sliding operation in the horizontal direction is performed by the user in a region of the side in the diagram which is below a straight line which connects the point C and the point D in FIG. 8, the point A' is divided.

Furthermore, in accordance with the sliding amount of the finger of the user in the horizontal direction in the pinching out operation, the pinching in operation, or the like, the frequencies of the gains which are associated with the points after division may be set to change.

Other than the above, in a case where the Q value is associated with the point C or the point D, when the touch operation is performed by the user in a region which is inside the control graphic CR11', the Q value which is associated with the point C and the point D is changed, and when the touch operation is performed by the user in a region which is outside the control graphic CR11', the division of the point A' and the point B' may be performed.

<Modification 1 of Third Embodiment>
<Equalizer Adjustment>

Furthermore, after the control graphic CR12 of FIG. 8 is displayed, the gain of the frequencies which are associated with the point A1 and the point A2 may be adjusted according to the operation of the user in the horizontal direction with respect to the point A1 and the point A2.

Figure 9:
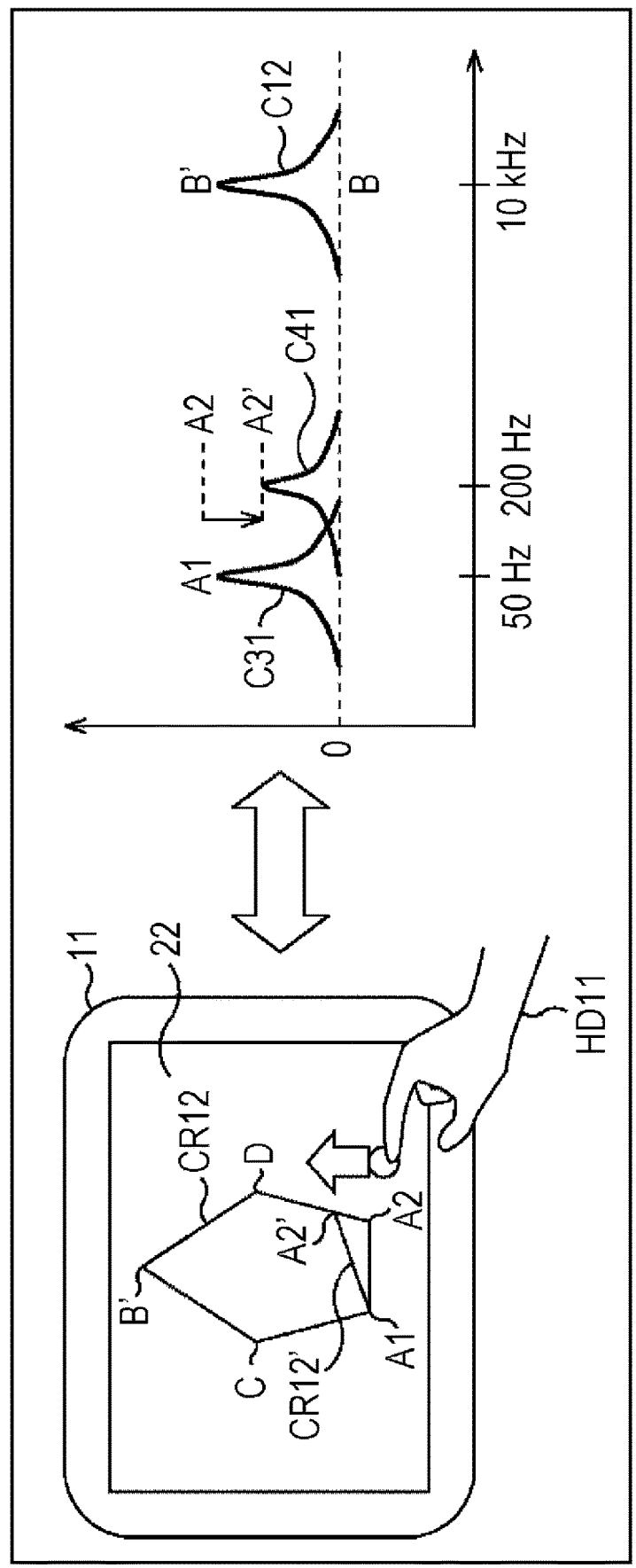
FIG. 9 is a diagram which describes another example of gain adjustment using the control graphic.

For example, in a state where the control graphic CR12 is displayed as shown in FIG. 9, the user performs a sliding operation in the upward direction in the diagram using the index finger of the right hand HD11 in a region in the vicinity of the point A2. Here, the same reference numerals are used for the portions corresponding to the cases in FIG. 9 and in FIG. 8 and description thereof is omitted.

In FIG. 9, when the user performs a sliding operation in a region in the vicinity of the point A2, the point A2 is moved in the sliding direction by a distance in accordance with the sliding amount of the sliding operation. In this example, the point A2 is moved to the point A2'. Due to this, the control graphic CR12 changes shape into a pentagon-shaped control graphic CR12' where the point A1, the point A2', the point B', the point C, and the point D are set as vertices.

Then, in accordance with the change of shape of the control graphic CR12, the 200 Hz gain characteristics of the sound signal which are associated with the point A2 are changed as shown in the right side in the diagram. Here, in FIG. 9, the horizontal axis and the vertical axis on the right side show the respective frequencies and the gains of each frequency. In particular, a curve C41 shows the gain in the vicinity of 200 Hz of the sound signal.

In other words, when the point A2 is moved to the point A2', the gain characteristic of the sound signal in the vicinity of 200 Hz changes from the characteristic which is shown by the curve C32 of FIG. 8 to the characteristic which is shown by the curve C41 of FIG. 9 along with this move. In this example, since the point A2 moves in the upward direction in the figure, the gain in the vicinity of 200 Hz is decreased in comparison with before the movement of the point A2.

As described above, the various sound parameters relating to the equalizer are associated with respect to each vertex of one of the control graphics and the sound parameters are changed in accordance with the change of shape of the control graphic, whereby it is possible to provide an easy-to-use user interface which is easier to understand. That is, it is possible for the user to intuitively perform an adjustment operation of the sound parameters while looking at the change of the shape of the control graphic.

<Fourth Embodiment>
<Surround Adjustment of Related Art>

Furthermore, in the above, description has been given of a case where equalizer adjustment is performed as the adjustment of the sound effects; however, surround adjustment of the sound signal may be set to be performed.

Figure 10:
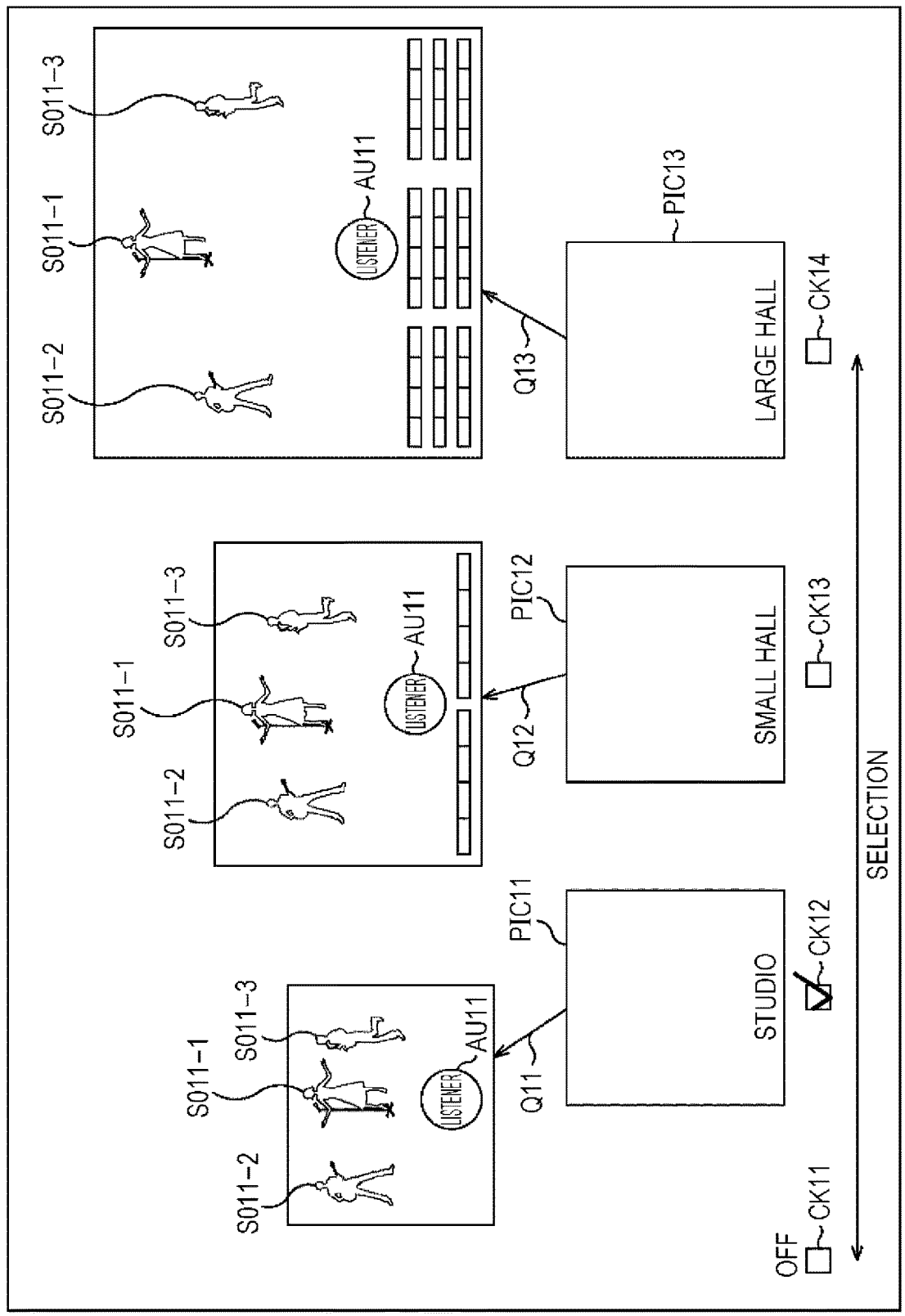
FIG. 10 is a diagram which describes surround adjustment of the related art.

In the related art, in a case where surround adjustment is performed as the sound effect adjustment, for example, as shown in FIG. 10, when the user selects any one from among the mode of any of the surround modes on the surround selection screen, the surround adjustment is performed in accordance with the selected mode.

In FIG. 10, four of a selection box CK11 to a selection box CK14 are lined up in the horizontal direction at the lower side of the surround selection screen in the diagram. By selecting any one of the selection box CK11 to the selection box CK14, it is possible for the user to select one surround mode. In this example, a selection box CK12 is selected.

The selection box CK11 is a selection box where the off mode is operated as the surround mode during the selection and the text "OFF" is written in the upper side of the selection box CK11 in the diagram. The off mode is a mode where the surround effect is turned off and when the off mode is selected, the surround effect adjustment is not performed with respect to the sound signal.

The selection box CK12 is a selection box where a studio mode is operated as the surround mode during the selection and an image PIC 11 which images the sound of the studio mode, that is, a sense of depth and a sense of width is displayed in the upper side of the selection box CK12 in the diagram.

The studio mode is a studio where a virtual space (below, also referred to as a virtual listening space) in which a user who listens to the reproduced sound signal is the listener is small, and is a mode where a surround effect in which the sense of depth and the sense of width of the studio are not that strong is obtained.

Here, the sense of depth refers to the size of the virtual listening space with respect to the depth direction when viewed by the user as the listener in the virtual listening space, in other words, the width, and the sense of width refers to the size of the virtual listening space with respect to the horizontal direction when viewed by the user as the listener in the virtual listening space.

For example, an image PIC11 is set as an image indicated by an arrow Q11, and the text "Studio" which indicates the studio mode is also displayed in the image PIC11. The image indicated by the arrow Q11 is an image which expresses the virtual listening space and three of a sound source SO11-1 to a sound source SO11-3 are arranged in front of a listener AU11 in the image.

For example, the sound source SO11-1 which is positioned at the front center of the listener AU11 is set to the vocals, the sound source SO11-2 which is positioned at the front left side of the listener AU11 is set to the bass, and the sound source SO11-3 which is positioned at the front right side of the listener AU11 is set to the saxophone. Here, below, in a case where the sound source SO11-1 to the sound source SO11-3 are not particularly distinguished, reference will simply be made to the sound source SO11.

A selection box CK13 is a selection box where a small hall mode is operated as the surround mode during the selection and an image PIC 12 which images the sense of depth and the sense of width of the small hall mode is displayed in the upper side of the selection box CK13 in the diagram.

The small hall mode is a room where the virtual listening space is as large as a live venue or the like which accommodates several tens to several hundreds of people and is a mode where a surround effect in which the sense of depth and the sense of width are in accordance with such a virtual listening space is obtained.

An image PIC12 is set as an image indicated by an arrow Q12, and the text "Small Hall" which indicates the small hall mode is also displayed in the image PIC12. The image indicated by the arrow Q12 is an image which expresses the virtual listening space and three of the sound source SO11-1 to the sound source SO11-3 are arranged in front of the listener AU11 in the image while a certain number of audience seats are arranged behind the listener AU11.

The selection box CK14 is a selection box where a large hall mode is operated as the surround mode during the selection and an image PIC 13 which images the sense of depth and the sense of width of the large hall mode is displayed in the upper side of the selection box CK14 in the diagram.

The large hall mode is a space where the virtual listening space is on the scale of a concert hall with several thousands to several tens of thousands of people and is a mode where a surround effect in which the sense of depth and the sense of width are in accordance with such a virtual listening space is obtained.

An image PIC13 is set as an image indicated by an arrow Q13, and the text "Large Hall" which indicates the large hall mode is also displayed in the image PIC 13. The image indicated by the arrow Q13 is an image which expresses the virtual listening space and three of the sound source SO11-1 to the sound source SO11-3 are arranged in front of the listener AU11 in the image while a large number of audience seats are arranged behind the listener AU11.

In this manner, by selecting the selection box corresponding to the desired surround mode while the user looks at the image PIC11 to the image PIC13 or the like, the surround adjustment in accordance with the selected surround mode is performed with respect to the sound signal. At this time, by referring to the image PIC11 to the image PIC13, it is possible for the user to associate the sound which is obtained by each surround mode, that is, the sense of depth and the sense of width.

<Configuration of Surround Adjusting Unit>

Here, in the example shown in FIG. 10, description will be given of the configuration of the surround adjusting unit which performs surround adjustment with respect to the sound signal in accordance with the selected surround mode.

Figure 11:
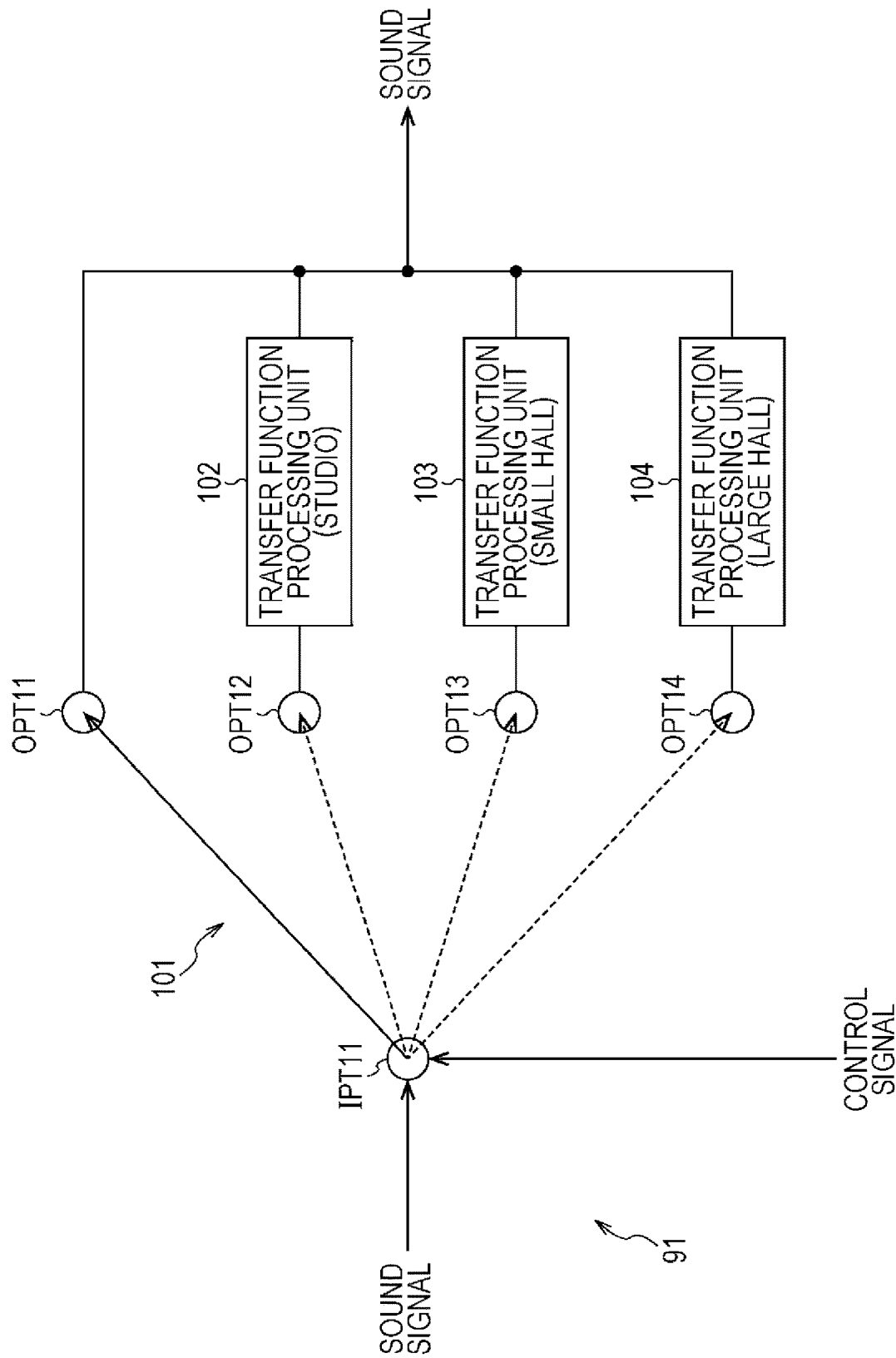
FIG. 11 is a view which illustrates a configuration example of a surround adjusting unit.

For example, the surround adjusting unit is configured as shown in FIG. 11. Here, since the surround adjustment realizes a sound effect using the difference or the like between the channels, it is assumed that sound signals of a plurality of two or more channels are input. In addition, in FIG. 11, the path is expressed by a single line in order to simplify the description; however, in practice, sound signals of a plurality of channels are transmitted.

In a surround adjusting unit 91 which is shown in FIG. 11, a sound signal which is the processing target and a control signal in accordance with the surround mode selected by the user are supplied to a switch 101 which is formed of an input terminal IPT11 and an output terminal OPT11 to an output terminal OPT14.

In the switch 101, the sound signal and the control signal are supplied to the input terminal IPT11 and the switch 101 connects the input terminal IPT11 to any one of the output terminal OPT11 to the output terminal OPT14 according to the control signal.

Specifically, in a case where the off mode is selected, the switch 101 connects the input terminal IPT11 and the output terminal OPT11. In such a case, the sound signal which is supplied to the input terminal IPT11 is output to the outside as is through the output terminal OPT11. In other words, in such a case, the surround adjustment with respect to the sound signal is not performed.

In addition, in a case where the studio mode is selected, the switch 101 connects the input terminal IPT11 and the output terminal OPT12. In such a case, the sound signal which is input to the input terminal IPT11 is supplied to transfer function processing unit 102 through the output terminal OPT 12.

The transfer function processing unit 102 multiplies a transfer function TF1 for realizing the sound of the studio mode with respect to the sound signal which is supplied from the output terminal OPT12, and the sound signal which is obtained as a result is output to the outside.

In a case where the small hall mode is selected, the switch 101 connects the input terminal IPT11 and the output terminal OPT13, and supplies the sound signal which is input to the input terminal IPT11 to the transfer function processing unit 103 through the output terminal OPT13. The transfer function processing unit 103 multiplies a transfer function TF2 for realizing the sound of the small hall mode with respect to the sound signal which is supplied from the output terminal OPT13, and the sound signal which is obtained as a result is output to the outside.

Furthermore, in a case where the large hall mode is selected, the switch 101 connects the input terminal IPT11 and the output terminal OPT 14, and supplies the sound signal which is input to the input terminal IPT11 to the transfer function processing unit 104 through the output terminal OPT14. The transfer function processing unit 104 multiplies a transfer function TF3 for realizing the sound of the large hall mode with respect to the sound signal which is supplied from the output terminal OPT14, and the sound signal which is obtained as a result is output to the outside.

<Configuration of Transfer Function Processing Unit>

Figure 12:
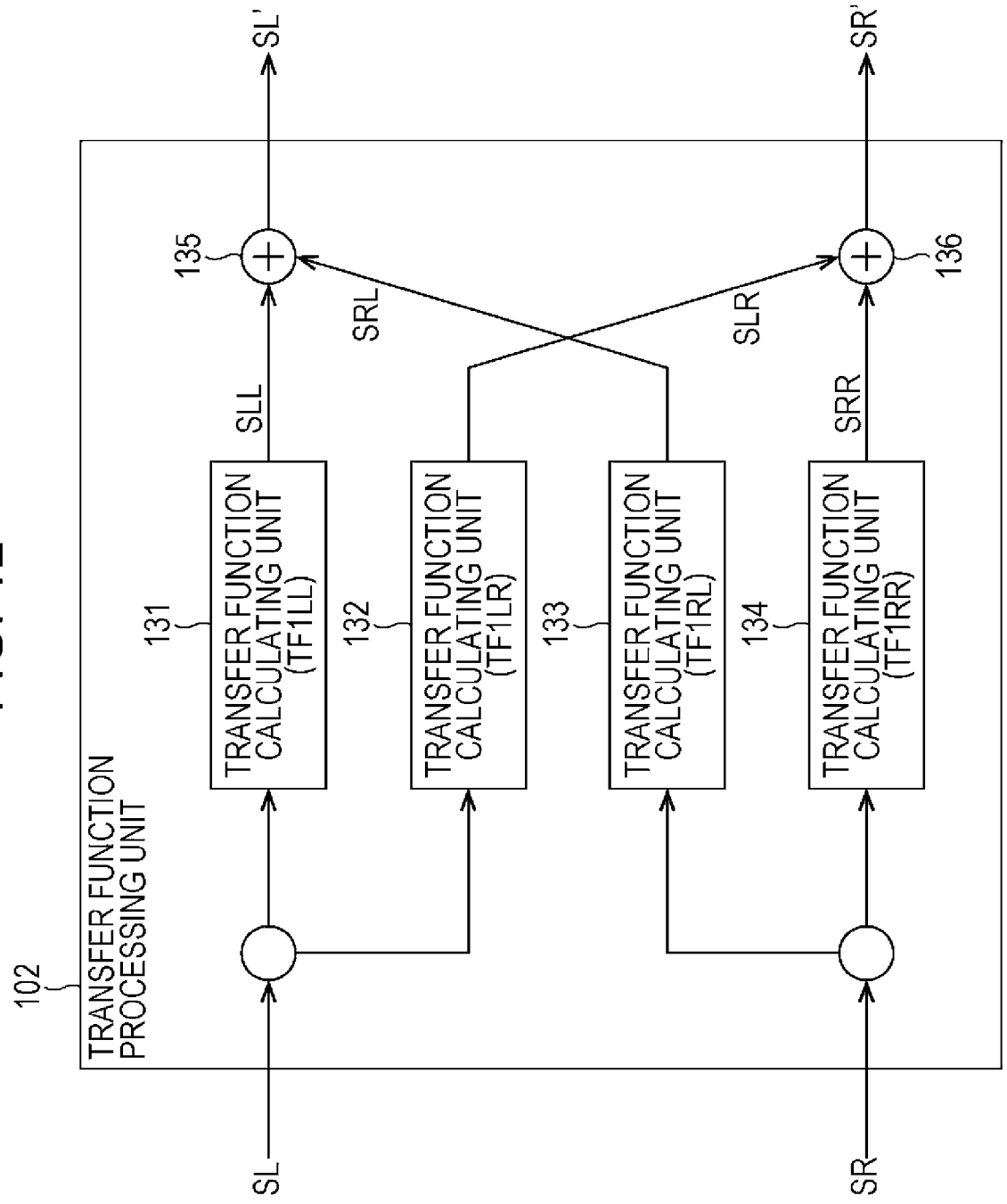
FIG. 12 is a view which illustrates a configuration example of a transfer function processing unit.

In addition, for example, the transfer function processing unit 102 of FIG. 11 is configured as shown in FIG. 12. In this example, for example, a sound signal SL of the left channel and a sound signal SR of the right channel are input as the sound signal. Here, the left channel is a channel of a sound signal which is output toward the left ear of the user from a left speaker, and the right channel is a channel of a sound signal which is output toward the right ear of the user from a right speaker.

The transfer function processing unit 102 is configured of a transfer function calculating unit 131 to a transfer function calculating unit 134, an adding unit 135, and an adding unit 136. In this example, the sound signal SL of the left channel is supplied to the transfer function calculating unit 131 and the transfer function calculating unit 132 and the sound signal SR of the right channel is supplied to the transfer function calculating unit 133 and the transfer function calculating unit 134.

The transfer function calculating unit 131 multiplies a transfer function TF1LL from the left speaker to the left ear of the user with respect to the supplied sound signal SL of the left channel, and the sound signal SLL obtained in this manner is supplied to the adding unit 135. In addition, the transfer function calculating unit 132 multiplies a transfer function TF1LR from the left speaker to the right ear of the user with respect to the supplied sound signal SL of the left channel, and the sound signal SLR obtained in this manner is supplied to the adding unit 136.

The transfer function calculating unit 133 multiplies a transfer function TF1RL from the right speaker to the left ear of the user with respect to the supplied sound signal SR of the right channel, and the sound signal SRL obtained in this manner is supplied to the adding unit 135. The transfer function calculating unit 134 multiplies a transfer function TF1RR from the right speaker to the right ear of the user with respect to the supplied sound signal SR of the right channel, and the sound signal SRR obtained in this manner is supplied to the adding unit 136.

The adding unit 135 adds the sound signal SLL which is supplied from the transfer function calculating unit 131 and the sound signal SRL which is supplied from the transfer function calculating unit 133, and sets a sound signal SL' which is the signal of the left channel after surround adjustment and performs output thereof to the outside.

Similarly, the adding unit 136 adds the sound signal SLR which is supplied from the transfer function calculating unit 132 and the sound signal SRR which is supplied from the transfer function calculating unit 134, and sets a sound signal SR' which is the signal of the right channel after surround adjustment and performs output thereof to the outside.

In this manner, in general, by setting the sound signal SL' and a sound signal SR' by multiplying a space characteristic with respect to the sound signal SL and the sound signal SR which are reproduced as is, it is possible to enable the user to virtually feel the sense of depth and the sense of width of the space.

Here, description has been given of a configuration example of the transfer function processing unit 102; however, since the configuration of the transfer function processing unit 103 and the transfer function processing unit 104 of FIG. 11 are the same as that of the transfer function processing unit 102, description thereof will be omitted.

<Configuration of Transfer Function Calculating Unit>

Figure 13:
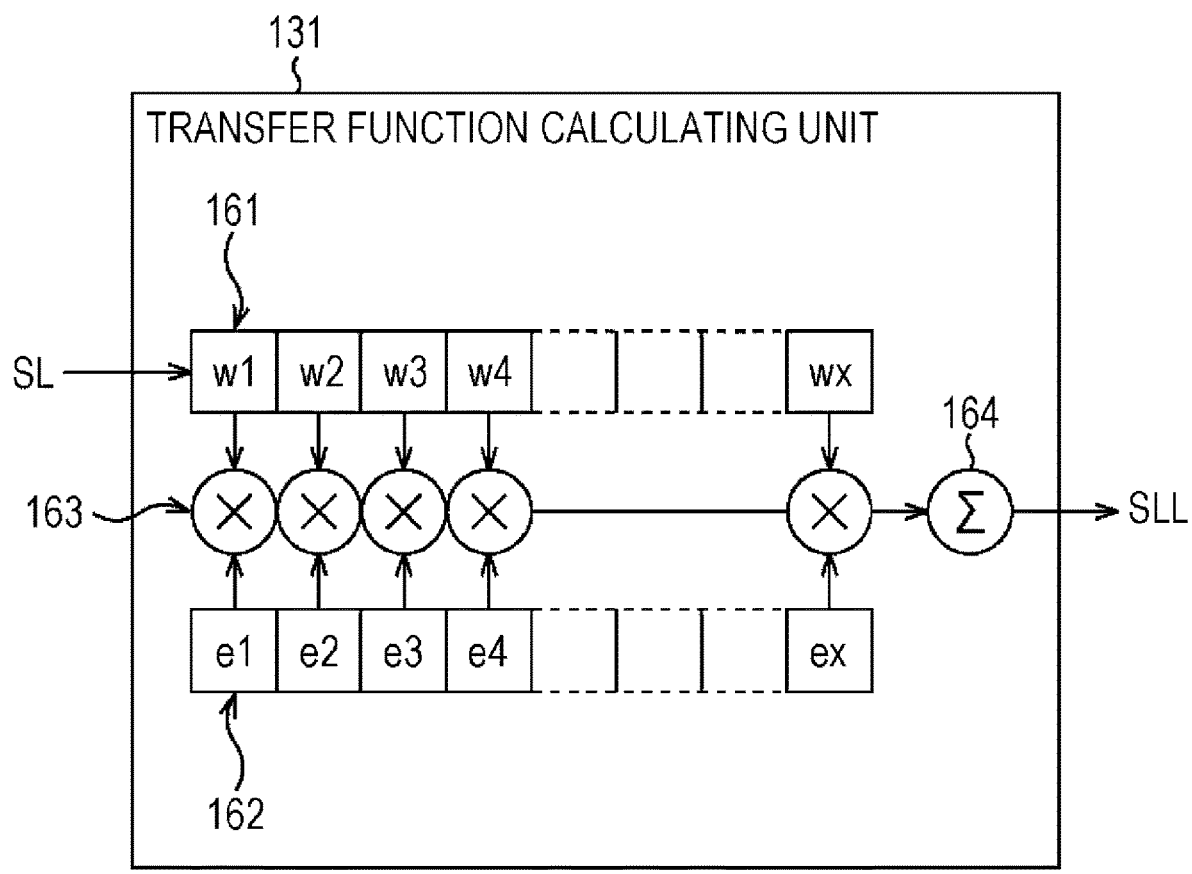
FIG. 13 is a view which illustrates a configuration example of a transfer function calculating unit.

Furthermore, the transfer function calculating unit 131 shown in FIG. 12 is configured as shown in FIG. 13, for example. That is, the calculation according to the transfer function TF1LL is realized by impulse response convolution.

In FIG. 13, the transfer function calculating unit 131 is configured of an input buffer 161, a coefficient holding unit 162, a multiplication unit 163, and an adding unit 164, and the sound signal SL is supplied to the input buffer 161.

The input buffer 161 has x of a buffer w1 to a buffer wx and the value of each of x consecutive samples of the sound signal SL are stored in each of the buffer w1 to the buffer wx. That is, a sample of the newest sound signal SL is stored in the buffer w1, and a sample of the oldest sound signal SL is stored in the buffer wx. In addition, each time a new sample of the sound signal SL is supplied to the input buffer 161, the sample stored in the buffer wi (here, i is equal to or greater than 1 and equal to or smaller than x−1) is stored in the buffer w (i+1) and the sample hitherto stored in the buffer wx is discarded.

The input buffer 161 supplies the value of the sample of the sound signal SL which is stored in each buffer to the multiplication unit 163.

The coefficient holding unit 162 holds x of a coefficient e1 to a coefficient ex which are instances of a transfer function TF1LL, and supplies these coefficients to the multiplication unit 163.

The multiplication unit 163 is formed of x multipliers, multiplies the coefficient from the coefficient holding unit 162 with respect to the sound signal SL from the input buffer 161, and performs supply thereof to the adding unit 164. That is, a coefficient ei (here, i is equal to or greater than 1 and equal to or smaller than x) is multiplied with respect to the value of the sample which is stored in the buffer wi (here, i is equal to or greater than 1 and equal to or smaller than x), and supplied to the adding unit 164.

The adding unit 164 determines the sum of the values of each sample of the sound signal SL supplied from the multiplication unit 163 and multiplied by the coefficient ei (here, i is equal to or greater than 1 and equal to or smaller than x) and outputs the obtained value to the adding unit 135 as the value of one sample of the sound signal SLL.

In this manner, in the transfer function calculating unit 131 which is shown in FIG. 13, a sound signal SLL is generated by a convolution operation using x coefficients with respect to the sound signal SL. Since this method determines the coefficient e1 to the coefficient ex using actual measurements, it is possible to increase the reproducibility of the spatial characteristics; however, since the number of buffers and the coefficients which configure the input buffer 161 is increased, the scale of the circuits and the calculation amounts are increased.

Here, description has been given of a configuration example of the transfer function calculating unit 131; however, since the configuration of the transfer function calculating unit 132 to the transfer function calculating unit 134 of FIG. 12 are the same as that of the transfer function calculating unit 131, description thereof will be omitted.

<Another Configuration of Transfer Function Calculating Unit>

Figure 14:
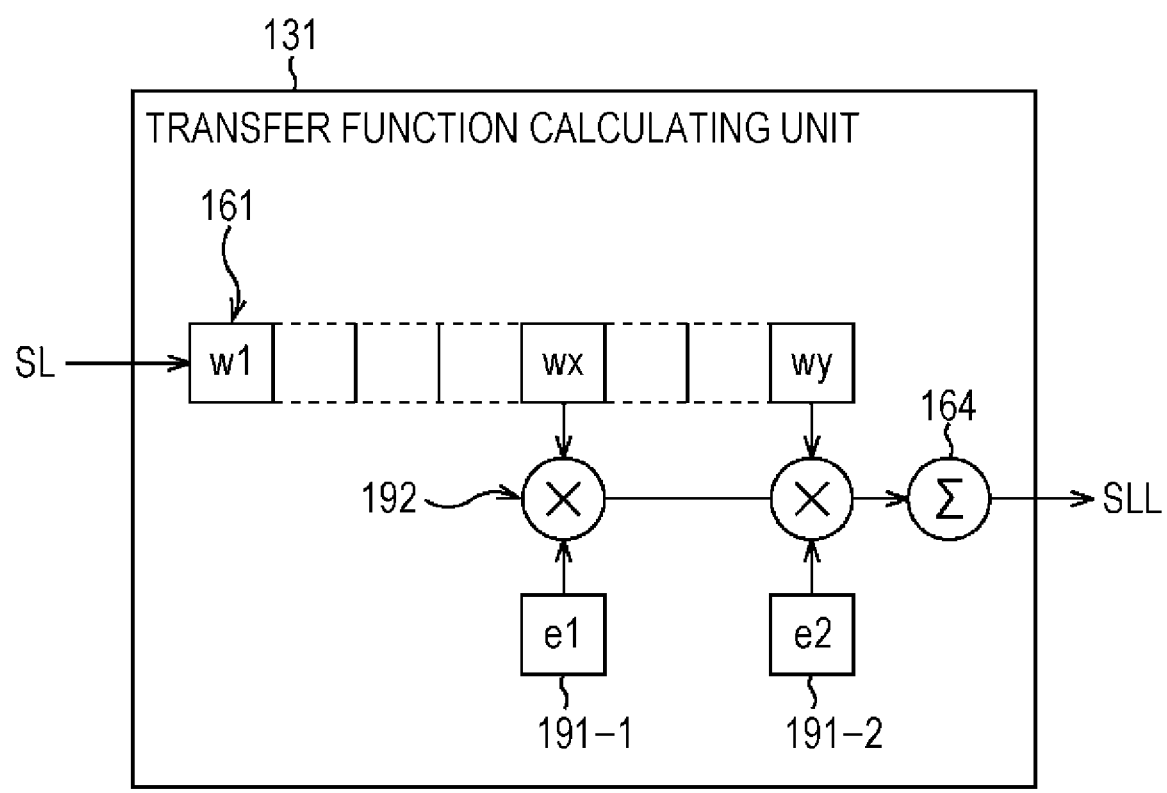
FIG. 14 is a view which illustrates another configuration example of a transfer function calculating unit.

In addition, the transfer function calculating unit 131 shown in FIG. 12 may be configured as shown in FIG. 14, for example. Here, in FIG. 14, the same reference numerals are used in the portions corresponding to the case in FIG. 13, and description thereof will be omitted.

The transfer function calculating unit 131 shown in FIG. 14 is configured of the input buffer 161, a coefficient holding unit 191-1, a coefficient holding unit 191-2, a multiplication unit 192, and the adding unit 164, and the sound signal SL is supplied to the input buffer 161. Here, in this example, the buffer w1 to the buffer wy (here, x<y) are provided in the input buffer 161.

The coefficient holding unit 191-1 holds the coefficient e1 for realizing a primary reflected sound and supplies the coefficient e1 to the multiplication unit 192. In addition, the coefficient holding unit 191-2 holds a coefficient e2 for realizing a secondary reflected sound and supplies the coefficient e2 to the multiplication unit 192. Here, below, in a case where the coefficient holding unit 191-1 to the coefficient holding unit 191-2 are not particularly distinguished, reference will simply be made to the coefficient holding unit 191.

The multiplication unit 192 multiplies the coefficient e1 which is supplied from the coefficient holding unit 191-1 with the value of the sample of the sound signal SL which is supplied from the buffer wx of the input buffer 161 and multiplies the coefficient e2 which is supplied from the coefficient holding unit 191-2 with the value of the sample of the sound signal SL which is supplied from the buffer wy. Then, the multiplication unit 192 supplies the values of the samples of the sound signal SL multiplied by these coefficients to the adding unit 164. The adding unit 164 determines the sum of the values of each sample of the sound signal SL supplied from the multiplication unit 192 and multiplied by the coefficient, and outputs the obtained value to the adding unit 135 as the value of one sample of the sound signal SLL.

In this example, the coefficient e1 is multiplied by the sample which is stored in the buffer wx and a primary reflected sound is generated, and in order to realize further delay of the reflection, the coefficient e2 is multiplied by the sample which is stored in the buffer wy and a secondary reflected sound is generated. Then, the primary reflected sound and the secondary reflected sound are added and the sound signal SLL is generated.

In this method, since it is possible to decrease the coefficient in comparison with the method which is shown in FIG. 13, it is possible to decrease the scale of the circuits and the calculation amounts; however, it is difficult to reproduce the fine characteristics possessed by the actual space. However, by increasing the buffer, since it is possible for the position of each reflected sound to be moved to an arbitrary delay position and the coefficient to take an arbitrary value, it is possible to produce space characteristics which are not real. In addition, for the reflected sounds, in addition to the primary reflected sound and the secondary reflected sound, a third reflected sound and a fourth reflected sound may be added to the extent allowed by the system.

<Surround Adjustment where Present Technology is Applied>

Incidentally, in the surround adjustment described in the above, it was only possible for the user to select one desired surround mode from among the several surround modes which were prepared in advance. Therefore, due to the surround adjustment, there are cases where it may not be possible to obtain the sound effect that the user would like.

Figure 15:
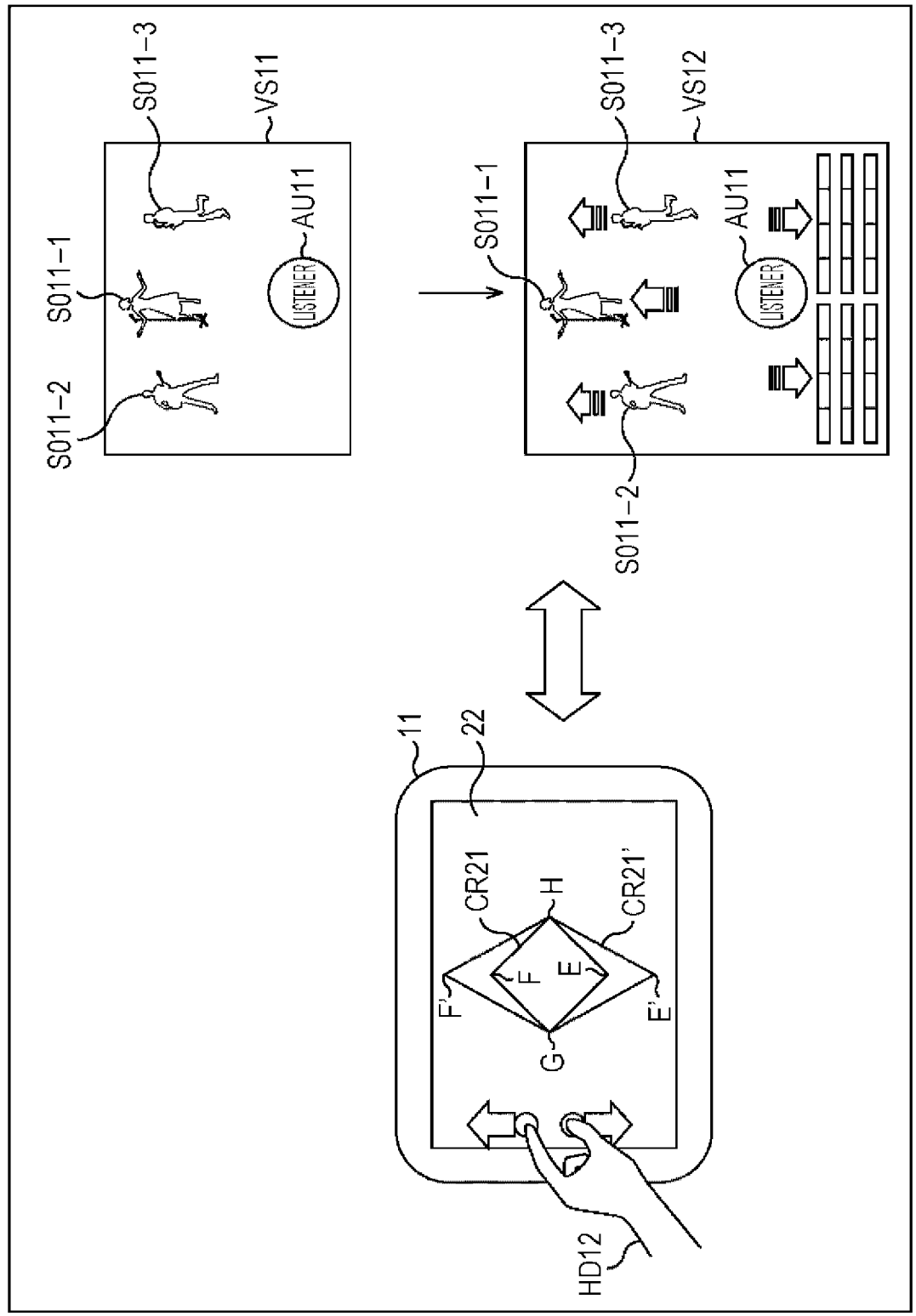
FIG. 15 is a diagram which describes adjustment of a sense of depth using the control graphic.

Thus, in the present technology, for example, as shown in FIG. 15, the control graphic is displayed on the display unit 22 of the sound effect adjusting apparatus 11, and it is possible to continuously adjust the sound parameters of the surround effect.

In FIG. 15, as the user interface for the sound effect adjustment, that is, the surround adjustment, a control graphic CR21 is displayed on the display unit 22.

The control graphic CR21 is an image of a rectangle where four of a point E, a point F, a point G, and a point H are set as vertices, and the control graphic CR21 is linked to the sound parameters which are related to the surround effects of the sound signals. That is, when the user performs an operation with respect to the control graphic CR21 and the control graphic CR21 continuously changes shape, the sound parameters also continuously change along with this change of shape.

For example, as the sound parameters relating to the surround effects, there are the sense of depth, the sense of width, and the like of the sound signals; however, in this example, the sense of depth is associated with the point E and the point F of the control graphic CR21. In more detail, the sense of depth of the space to the back when viewed by the user (listener) in the virtual listening space is associated with the point E and the sense of depth of the space to the front when viewed by the user (listener) in the virtual listening space is associated with the point F.

In addition, the state of the control graphic CR21 which is shown in FIG. 15 is a state which is a reference, in other words, a state with no surround effect (zero sound effects). In a case where the state of the control graphic CR21 is a state which is a reference, for example, a virtual listening space VS11 which is shown at the right side in the diagram is reproduced according to the sound signal. Here, in FIG. 15, the same reference numerals are used in the portions corresponding to the case in FIG. 10, and description thereof will be omitted as appropriate.

In the virtual listening space VS11, three of the sound source SO11-1 to the sound source SO11-3 are arranged in front of the listener AU11. Even in a state where there is no surround effect with respect to the sound signal, if the sound signal is a stereo signal or the like, since the user feels the sense of depth or the sense of width to a certain extent, it is possible to obtain a sense of space like the virtual listening space VS11.

From such a state, the display unit 22, in other words, the surface of the touch panel as the input unit 21 is set to be pinched outward by the user in the vertical direction with two fingers of their left hand HD12. By so doing, the sound effect adjusting apparatus 11 senses the movement of the fingers of the user and converts the movement into the sliding amount of the fingers. Then, in accordance with the obtained sliding amount, the sound effect adjusting apparatus 11 moves the point E and the point F of the control graphic CR21 which are lined up in the vertical direction to a point E' and a point F' and sets a rectangular control graphic CR21' where the four of a point E', a point F', a point G, and a point H are set as vertices. In other words, the control graphic CR21 changes shape into the control graphic CR21'.

When such an operation is performed with respect to the control graphic CR21, the characteristic of the sense of depth to the back which is associated with the point E and the characteristic of the sense of depth to the front which is associated with the point F are changed as shown in a virtual listening space VS12 of the right side in the diagram. In other words, the virtual listening space VS12 becomes a space which is wider in the front and back direction of the listener AU11 in comparison with the virtual listening space VS11.

In the virtual listening space VS12, the depth to the front and to the back of the listener AU11 becomes larger, and in accordance with this, each sound source SO11 is moved to the back side from the front so as to move away from the listener AU11. In addition, to the back of the listener AU11, there is a state where audience seats of other listeners are also provided in accordance with the width of the space at the back.

The movement of the point E to the point E' in the control graphic CR21 signifies a change in the sense of depth to the back of the virtual listening space which is felt by the listener hearing the audio without the surround effects, and the sense of depth to the back of the virtual listening space VS11 is changed in accordance with this change amount. In the same manner, the movement of the point F to the point F' in the control graphic CR21 signifies a change in the sense of depth to the front of the virtual listening space which is felt by the listener hearing the audio without the surround effects, and the sense of depth to the front of the virtual listening space VS11 is changed in accordance with this change amount.

In other words, the sense of depth (surround effect) of the virtual listening space may also be expanded forward and backward centering on the listener AU11 by being linked to the expansion of the control graphic CR21 in the front and back direction into the control graphic CR21'.

In this manner, for the sound effect adjusting apparatus 11, not only surround adjustment according to the selection box as shown in FIG. 10, but also surround adjustment according to the shape change of the control graphic CR21 is possible.

By displaying an image of the surround mode, the adjustment of the surround effect according to the selection boxes of the related art is easily and intuitively understandable. However, in this method, it is only possible to obtain preset surround effects which are selected in accordance with the selection boxes. Therefore, for example, if the user wishes to set a sense of depth and a sense of width of a medium hall which is a space of a size which is between the small hall and the large hall, it is difficult to perform such setting.

In contrast, according to the present technology, it is possible to continuously adjust the changes of two sound parameters such as the sense of depth to the front and the back of the virtual listening space with one control graphic. Moreover, it is possible for the user to clearly recognize the relationship between how the shape of the control graphic is changed and what kind of surround effect is obtained, and it is possible to perform an intuitive and continuous operation. Due to this, it is possible for the user to enjoy a wider surround effect in comparison with the adjustment of the surround effect according to just the selection box.

<Configuration Example of Sound Effect Adjusting Unit>

Figure 16:
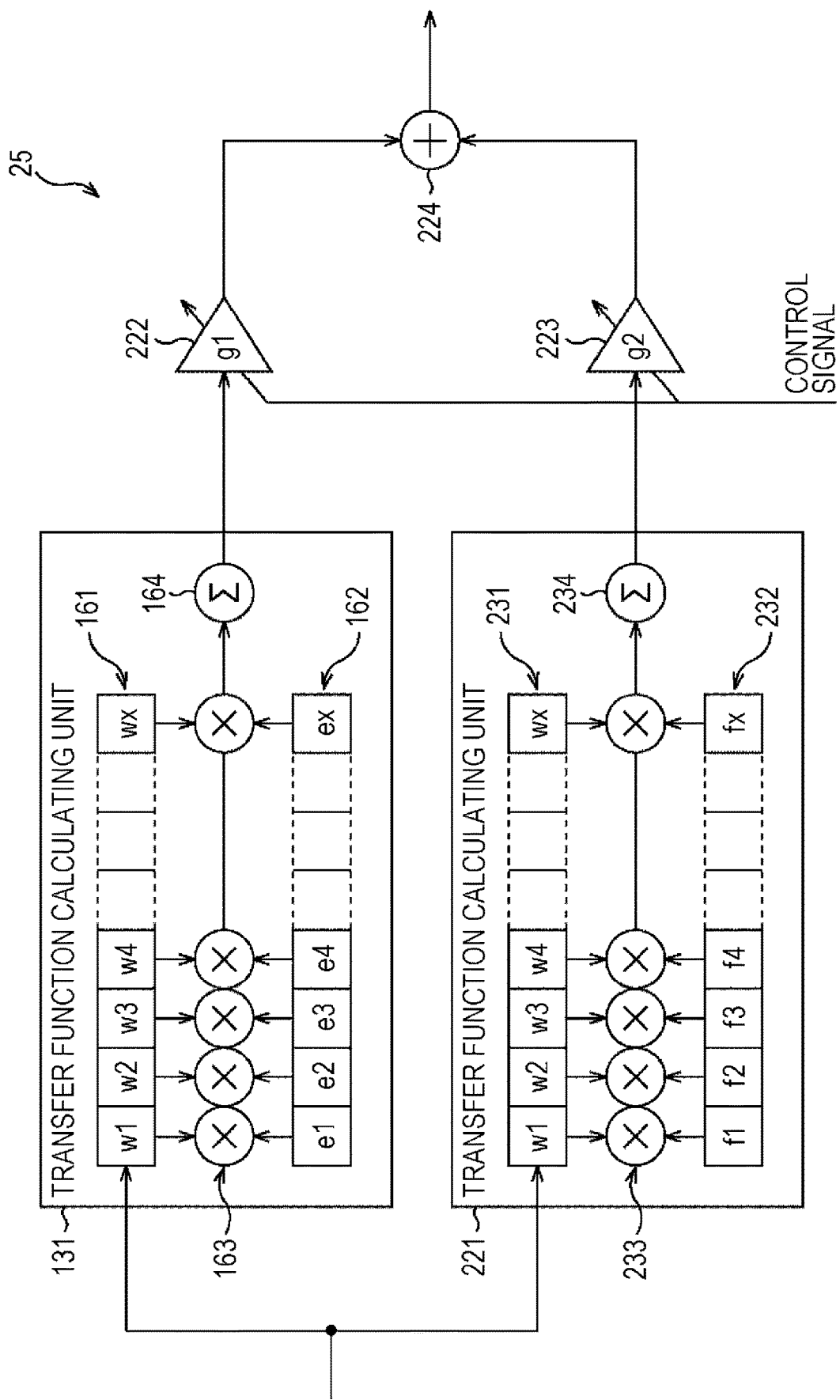
FIG. 16 is a view which illustrates a configuration example of a sound effect adjusting unit.

Next, description will be given of a configuration of the sound effect adjusting unit 25 of the sound effect adjusting apparatus 11 in a case where adjustment of the surround effect is performed according to the operation with respect to the control graphic CR21 which is shown in FIG. 15. In such a case, the sound effect adjusting unit 25 is configured as shown in FIG. 16, for example. Here, in FIG. 16, the same reference numerals are used in the portions corresponding to the case in FIG. 13, and description thereof will be omitted as appropriate.

The sound effect adjusting unit 25 shown in FIG. 16 is configured by a transfer function calculation unit 131, a transfer function calculation unit 221, a multiplication unit 222, a multiplication unit 223, and an adding unit 224, and a sound signal which is output from the acquisition unit 24 is supplied to the transfer function calculation unit 131 and the transfer function calculation unit 221.

The transfer function calculation unit 131 performs a convolution calculation with respect to the supplied sound signal using the held coefficient e1 to the coefficient ex, and the sound signal which is obtained as a result is supplied to the multiplication unit 222.

The transfer function calculation unit 221 performs a convolution calculation with respect to the supplied sound signal using a held coefficient f1 to the coefficient fx, and the sound signal which is obtained as a result is supplied to the multiplication unit 223.

The transfer function calculation unit 221 has the same configuration of the transfer function calculation unit 131, and an input buffer 231, a coefficient holding unit 232, a multiplication unit 233, and an adding unit 234 which configure the transfer function calculating unit 221 correspond to the input buffer 161 to the adding unit 164.

That is, the input buffer 231 has x of the buffer w1 to a buffer wx, and the values of each of the x samples which are consecutive from the sound signal are stored in each buffer. Then, the input buffer 231 supplies the values of the samples of the sound signals which are stored in each buffer to the multiplication unit 233.

The coefficient holding unit 232 holds x of the coefficient f1 to a coefficient fx which are real transfer functions, and these coefficients are supplied to the multiplication unit 233. The multiplication unit 233 multiplies the coefficients from the coefficient holding unit 232 with respect to the sound signal from the input buffer 231 and performs supply thereof to the adding unit 234. That is, a coefficient fi (here, i is equal to or greater than 1 and equal to or smaller than x) is multiplied with respect to the value of the sample which is stored in the buffer wi (here, i is equal to or greater than 1 and equal to or smaller than x), and supplied to the adding unit 234.

The adding unit 234 determines the sum of the values of each sample of the sound signal supplied from the multiplication unit 233 and multiplied by the coefficient, and outputs the obtained value to the multiplication unit 223 as the value of one sample of the sound signal.

Here, the transfer function of the transfer function calculation unit 131 shows the sense of depth in the predetermined space SPA, and the transfer function of the transfer function calculation unit 221 shows the sense of depth in the space SPB which is different to the space SPA. In the control graphic CR21 of FIG. 15, the sense of depth of the virtual listening space is changed according to the change of shape of the control graphic CR21; however, it is possible to realize the changes of the sense of depth by switching the transfer function of the transfer function calculating unit 131 and the transfer function of the transfer function calculating unit 221. That is, the realization is possible by switching performing the surround adjustment of the sound signal in the transfer function calculating unit 131 and performing the surround adjustment of the sound signal in the transfer function calculating unit 221.

However, when these transfer functions are rapidly or non-continuously switched, since the sense of depth of the virtual listening space is not continuously changed, the image of the changes of the control graphic CR21 and the changes of the sense of depth no longer match. Thus, the multiplication unit 222 and the multiplication unit 223 which have a variable coefficient are introduced in the sound effect adjusting unit 25.

The multiplication unit 222 continuously changes a variable coefficient g1 in accordance with a control signal which is supplied from the control signal generating unit 34, multiplies the variable coefficient g1 by the sound signal which is supplied from the transfer function calculating unit 131, and performs supply thereof to the adding unit 224. Similarly, the multiplication unit 223 continuously changes a variable coefficient g2 in accordance with a control signal which is supplied from the control signal generating unit 34, multiplies the variable coefficient g2 by the sound signal which is supplied from the transfer function calculating unit 221, and performs supply thereof to the adding unit 224.

The adding unit 224 adds the sound signal which is supplied from the multiplication unit 222 and the sound signal which is supplied from the multiplication unit 223, sets a sound signal where the surround effect is adjusted, and performs supply thereof to the reproduction unit 26. In other words, a sound signal where the sound effect (surround effect) which is determined in advance is applied in the transfer function calculation unit 131 and a sound signal where another sound effect, which is different to the sound effect of the transfer function calculation unit 131 and which is determined in advance is applied in the transfer function calculation unit 221, are cross-faded by the adding unit 224.

In other words, in a case where the sound effect adjusting unit 25 has a plurality of non-continuous settings in advance as the settings of the transfer functions, and the sound effect (surround effect) is changed from a certain state to another state, by cross-fading the state setting of the plurality of transfer functions, continuous change of the sound effects is realized.

In this manner, by continuously changing the variable coefficient g1 and the variable coefficient g2 according to the control signal, it is possible to continuously change the sense of depth of the virtual listening space, and it is possible to further increase the degree of matching between the image of the changes of the control graphic CR21 and the changes of the sense of depth. In this manner, it is possible for the user to perform a more intuitive operation which is easy to understand.

Here, in a case where the sound signals which are acquired in the acquisition unit 24 have a plurality of channels, a configuration which is formed of the transfer function calculation unit 131 to the adding unit 224 may be provided for each channel of the sound signals.

<Description of Sound Effect Adjusting Process>

Furthermore, with reference to the flowchart of FIG. 17, description will be given of the sound effect adjusting process which is performed by the sound effect adjusting apparatus 11 in a case where the sound effect adjusting unit 25 of the sound effect adjusting apparatus 11 is configured as shown in FIG. 16.

Here, since the processes of step S91 to step S93 are the same as the processes of step S11 to step S13 of FIG. 5, description thereof will be omitted. However, in the process of step S91, for example, the control graphic CR21 which is shown in FIG. 15 is displayed on the display unit 22. In addition, in the following, the description will be continued with a case where the control graphic CR21 is displayed as an example.

In a case where it is determined that the number of touches in step S93 is 2, in step S94, the setting unit 32 sets the movement distance of the point E and the point F of the control graphic CR21 in accordance with the sliding amount which is detected by the detection unit 31. For example, in step S94, the movement distance of the point E and the point F is set by performing the same process as in step S14 of FIG. 5.

In step S95, the display control unit 33 controls the display unit 22 based on the movement distance of the point E and the point F which are determined in the step S94, and changes the shape of the control graphic CR21 in the up and down direction, that is, the direction of a straight line which connects the point E and the point F.

For example, in the example of FIG. 15, the point E and the point F are moved by the determined movement distance. Due to this, the point E and the point F are respectively moved to the point E' and the point F' and as a result the control graphic CR21 changes shape to become the control graphic CR21'.

Here, in a case where the operation of the user with respect to control graphic CR21 is a pinching out operation as shown in the example of FIG. 15, the change of shape is performed such that the point E and the point F move toward the outside of the control graphic CR21, and the control graphic CR21 is expanded. On the contrary, in a case where the user performs a pinching in operation, the point E and the point F are moved so as to become closer to each other by a movement distance which is determined in accordance with the operation, and the control graphic CR21 is reduced in size.

In step S96, the control signal generating unit 34 determines the sense of depth to the front and the back of the virtual listening space in accordance with the shape change of the control graphic CR21.

For example, the control signal generating unit 34 determines the sense of depth to the back of the virtual listening space in accordance with the movement distance and the movement direction of the point E in the example of FIG. 15, and determines the sense of depth to the front of the virtual listening space in accordance with the movement distance and the movement direction of the point F.

At this time, in a case where the movement direction of the point E and the point F is a direction to the outside of the control graphic CR21, adjustment of the surround effect is performed such that the senses of depth to the back and to the front which are associated with the point E and the point F are widened. In contrast, in a case where the movement direction of the point E and the point F is a direction to the inside of the control graphic CR21, adjustment of the surround effect is performed such that the senses of depth to the back and to the front are narrowed.

In addition, the amount of change of the senses of depth which are associated with the point E and the point F is determined such that the absolute values of the amount of change of the senses of depth increase continuously as the movement distance of the points becomes longer.

When the sense of depth to the back and to the front in the virtual listening space is determined based on the positions of the point E' and the point F' of the control graphic CR21', that is, the movement direction and the movement distance of the point E and the point F, the control signal generating unit 34 generates a control signal in accordance with the determined sense of depth and performs supply thereof to the multiplication unit 222 and the multiplication unit 223 of the sound effect adjusting unit 25.

In step S97, the sound effect adjusting unit 25 performs surround adjustment with respect to the sound signal which is supplied from the acquisition unit 24 based on the control signal from the control signal generating unit 34 and supplies the sound signal which is obtained as a result to the reproduction unit 26.

Specifically, the transfer function calculation unit 131 and the transfer function calculation unit 221 perform convolution calculations using coefficients with respect to the sound signal which is supplied from the acquisition unit 24, and supply the sound signals which are obtained as a result to the multiplication unit 222 and the multiplication unit 223.

The multiplication unit 222 and the multiplication unit 223 changes the variable coefficient g1 and the variable coefficient g2 in accordance with the control signal from the control signal generating unit 34, performs multiplication with the sound signal from the transfer function calculation unit 131 and the transfer function calculation unit 221, and supplies the sound signal which is obtained as a result to the adding unit 224. The adding unit 224 adds the sound signal from the multiplication unit 222 and the sound signal from the multiplication unit 223 and performs supply thereof to the reproduction unit 26.

Furthermore, in the reproduction unit 26, the audio is reproduced based on the sound signal which is supplied from the sound effect adjusting unit 25. When the surround adjustment of the sound signal is performed in this manner, the sound effect adjusting process is finished.

In addition, in step S93, in a case where the number of touches is determined not to be 2, that is, in a case where the number of touches which is detected by the detection unit 31 is 1, the process proceeds to step S98.

In step S98, the setting unit 32 determines whether or not the touch position which is detected by the detection unit 31 is on the side which is lower than the center of the control graphic CR21, that is, the side of the point E.

In a case where it is determined in step S98 that the touch position is on the side which is lower than the center of the control graphic CR21, in step S99, the setting unit 32 sets the movement distance of the point E of the control graphic CR21 in accordance with the sliding amount which is detected by the detection unit 31.

In step S100, the display control unit 33 controls the display unit 22 based on the movement distance of the point E which is determined in the step S99, and changes the shape of the control graphic CR21 in the direction from the point F toward the point E which is the downward direction, that is, the direction of a straight line which connects the point E and the point F.

For example, the control graphic CR21 of FIG. 15 changes shape to a graphic where the point E', the point F, the point G, and the point H are set as vertices. Here, in a case where an operation where the point E is moved in the upward direction in FIG. 15 is performed by the user, the control graphic CR21 changes shape such that the point E is moved to the upper side.

In step S101, the control signal generating unit 34 determines the sense of depth to the back of the virtual listening space in accordance with the shape change of the control graphic CR21. Specifically, the control signal generating unit 34 determines the sense of depth to the back of the virtual listening space which is associated with the point E in accordance with the movement distance and the movement direction of the point E.

When the sense of depth which is associated with the point E is determined, the control signal generating unit 34 generates a control signal in accordance with the determined sense of depth and performs supply thereof to the multiplication unit 222 and the multiplication unit 223 of the sound effect adjusting unit 25.

In step S102, the sound effect adjusting unit 25 performs surround adjustment with respect to the sound signal which is supplied from the acquisition unit 24 based on the control signal from the control signal generating unit 34 and supplies the sound signal which is obtained as a result to the reproduction unit 26. That is, in step S102, the same process as in step S97 is performed.

When the surround adjustment of the sound signal is performed, the sound effect adjusting unit 25 supplies the sound signal which is obtained as a result to the reproduction unit 26 and the sound effect adjusting process is finished. In the reproduction unit 26, the audio is reproduced based on the sound signal which is supplied from the sound effect adjusting unit 25.

Furthermore, in step S98, in a case where it is determined that the touch position is not at the side lower than the center of the control graphic CR21, that is, the touch position is at the side above the center of the control graphic CR21, the process proceeds to step S103.

In step S103, the setting unit 32 sets the movement distance of the point F of the control graphic CR21 in accordance with the sliding amount which is detected by the detection unit 31. Specifically, the setting unit 32 sets the distance which is determined in advance with respect to one detected sliding amount as the movement distance of the point F.

In step S104, the display control unit 33 controls the display unit 22 based on the movement distance of the point F which is determined in step S103, and the control graphic CR21 changes shape in the upward direction.

For example, the control graphic CR21 of FIG. 15 changes shape to a graphic where the point E, the point F', the point G, and the point H are set as vertices. Here, in a case where an operation where the point F is moved in the downward direction in FIG. 15 is performed by the user, the control graphic CR21 changes shape such that the point F is moved to the lower side.

In step S105, the control signal generating unit 34 determines the sense of depth to the front of the virtual listening space in accordance with the shape change of the control graphic CR21. Specifically, the control signal generating unit 34 determines the sense of depth to the front which is associated with the point F in accordance with the movement distance and the movement direction of the point F.

When the sense of depth to the front which is associated with the point F is determined, the control signal generating unit 34 generates a control signal in accordance with the determined sense of depth and performs supply thereof to the multiplication unit 222 and the multiplication unit 223 of the sound effect adjusting unit 25.

In step S106, the sound effect adjusting unit 25 performs surround adjustment with respect to the sound signal which is supplied from the acquisition unit 24 based on the control signal from the control signal generating unit 34 and supplies the sound signal which is obtained as a result to the reproduction unit 26. That is, in step S106, the same process as in step S97 is performed, and the sense of depth (surround) which is associated with the point F is adjusted.

When the surround adjustment of the sound signal is performed, the sound effect adjusting unit 25 supplies the sound signal which is obtained as a result to the reproduction unit 26 and the sound effect adjusting process is finished. In the reproduction unit 26, the audio is reproduced based on the sound signal which is supplied from the sound effect adjusting unit 25.

In this manner, the sound effect adjusting apparatus 11 changes the shape of the control graphic CR21 in accordance with an operation of the user with respect to the control graphic CR21, and performs surround adjustment with respect to the sound signal in the sense of depth in accordance with the shape change.

According to the sound effect adjusting apparatus 11, at the same time as the points which are associated with the sound parameters for surround adjustment in accordance with the operation of the user are moved and the control graphic CR21 changes shape, the sound effect is adjusted in accordance with the change of shape, whereby it is possible to realize an intuitive operation for the user. That is, with respect to the user, it is possible to provide an easy-to-use user interface which is easier to understand.

Here, in the present specification, description is given only of a representative operation as an operation of the change of the sense of depth with respect to the control graphic CR21; however, in consideration of many other operations as variations of the operation with respect to the control graphic CR21, it is possible to apply the present technology with respect to the adjustment of sound effects corresponding to these variations in the operations.

<Modification 1 of Fourth Embodiment>
<Other Configuration Example of Sound Effect Adjusting Unit>

Here, in the above, description has been given of an example where two transfer function calculation units are provided in the sound effect adjusting unit 25; however, the sense of depth of the virtual listening space may be continuously changed in one transfer function calculation unit.

Figure 18:
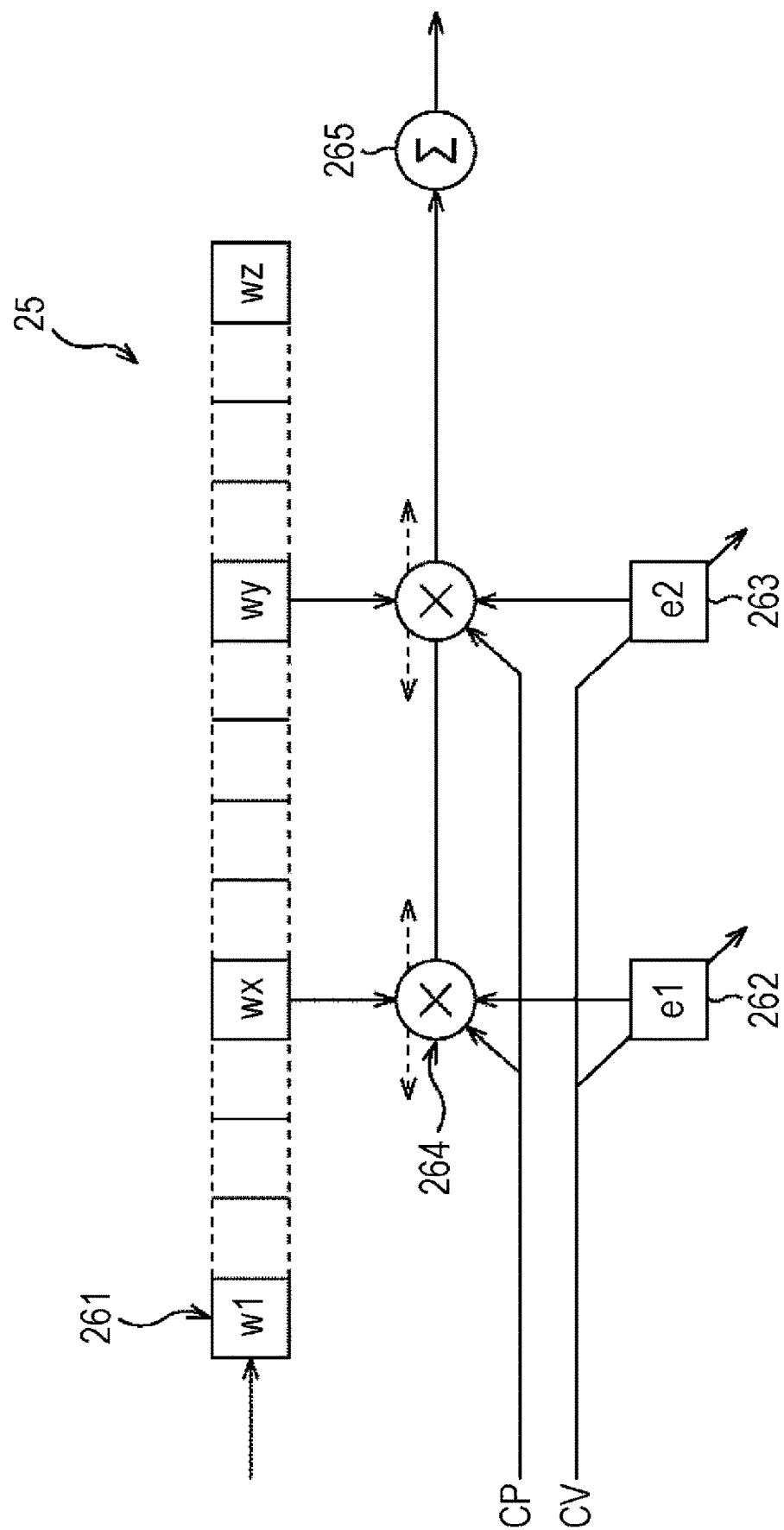
FIG. 18 is a view which illustrates another configuration example of a sound effect adjusting unit.

In such a case, the sound effect adjusting unit 25 is configured as shown in FIG. 18, for example.

The sound effect adjusting unit 25 which is shown in FIG. 18 is configured by an input buffer 261, a coefficient holding unit 262, a coefficient holding unit 263, a multiplication unit 264, and an adding unit 265, and supplies a sound signal to the input buffer 261.

The input buffer 261 holds a supplied sound signal which corresponds to the input buffer 161 of FIG. 16, and supplies a value of a sample of a part thereof to the multiplication unit 264. Here, the input buffer 261 has z buffers of the buffer w1 to a buffer wz, and stores the value of the sample of the sound signal in the buffer w1 to the buffer wz in order from the newest one.

The coefficient holding unit 262 changes the coefficient e1 for realizing the primary reflected sound in accordance with a control signal CV from the control signal generating unit 34 and supplies the coefficient e1 to the multiplication unit 264. The coefficient holding unit 263 changes the coefficient e2 for realizing the secondary reflected sound in accordance with the control signal CV from the control signal generating unit 34 and supplies the coefficient e2 to the multiplication unit 264.

The multiplication unit 264 is formed by two multipliers, multiplies the coefficients from the coefficient holding unit 262 and the coefficient holding unit 263 by the value of the sample of the sound signal which is stored in the buffer determined by a control signal CP from the control signal generating unit 34 from among the buffers which configure the input buffer 261, and performs supply thereof to the adding unit 265.

That is, the multiplication unit 264 multiplies the coefficient e1 by the value of the sample which is stored in the buffer wx (here, x is equal to or greater than 1 and equal to or smaller than z) determined by the control signal CP and multiplies the coefficient e2 by the value of the sample which is stored in the buffer wy (here, y is equal to or greater than 1 and equal to or smaller than z) determined by the control signal CP. The positions of the buffer wx and the buffer wy are determined by the control signal CP so as to realize a reflection delay. That is, the positions of the buffer wx and the buffer wy change according to the control signal CP.

The adding unit 265 determines the sum of the values of each sample of the sound signal which are supplied from the multiplication unit 264 and multiplied by the coefficients, and outputs the obtained value to the reproduction unit 26 as the value of one sample of the sound signal after surround adjustment.

Here, in a case where the sound signals which are acquired in the acquisition unit 24 have a plurality of channels, a configuration which is formed of the input buffer 261 to the adding unit 265 may be provided for each channel of the sound signals.

In this manner, in the sound effect adjusting unit 25 which is shown in FIG. 18, since it is possible to arbitrarily change the delay of the sound signal, that is, the positions of the buffer wx and the buffer wy and the coefficient e1 and the coefficient e2, by this adjustment, it is possible to continuously change the sense of depth. Due to this, it is possible to further increase the degree of matching of the changing of the surround effect with the image of the shape change of the control graphic CR21.

In other words, by making the sound parameters parametric, the configuration of FIG. 18 is a configuration where the sound effect is continuously changed. That is, the sound effect adjusting unit 25 which is shown in FIG. 18 is an example where the transfer function calculating unit 131 which is shown in FIG. 13 and FIG. 14 is made parametric. In this example, only the dominant factor components (here, the primary reflected sound and the secondary reflected sound) are extracted as the coefficient which is multiplied by the sound signal, and these factor components are used as parameters (variables) rather than fixed values.

Figure 17:
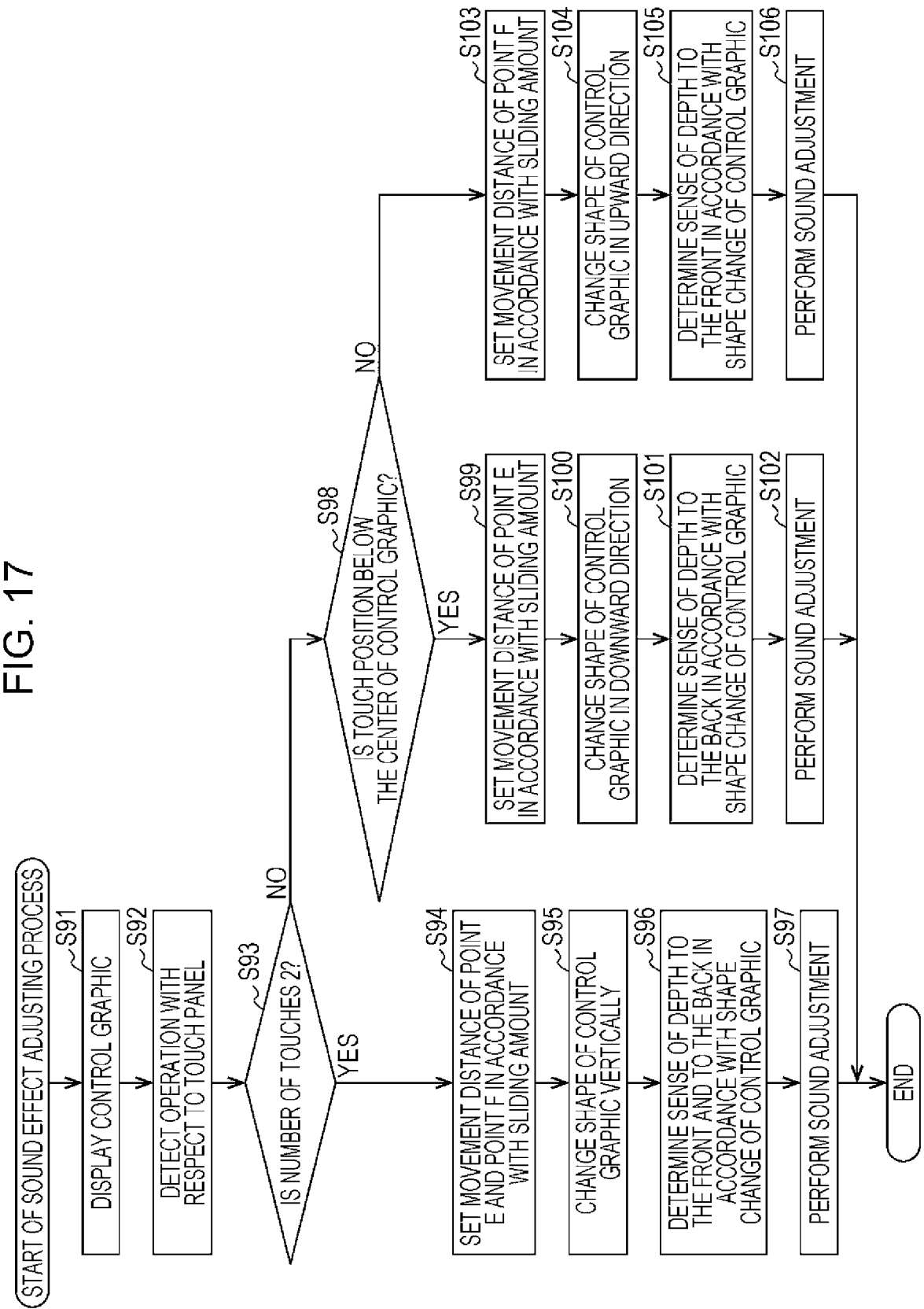
FIG. 17 is a flowchart which describes the sound effect adjustment process.

Even in a case where the sound effect adjusting unit 25 is set to the configuration which is shown in FIG. 18, the same process as the sound effect adjusting process which is shown in FIG. 17 is performed. Here, in such a case, the control signal generating unit 34 generates a control signal CV and a control signal CP in accordance with the shape change of the control graphic CR21, and performs supply thereof to the coefficient holding unit 262 and the coefficient holding unit 263, and to the multiplication unit 264.

<Modification 2 of Fourth Embodiment>
<Adjustment of Sense of Width>

In addition, in the example shown in FIG. 15, description has been given of a case where the sense of depth is associated with the control graphic CR21; however, the sense of width may be associated with the control graphic CR21. Here, it is possible to realize the adjustment of the sense of width by changing the coefficient of the transfer function calculation unit in basically the same manner as the sense of depth which has been described above. Which of the sense of depth and the sense of width it is possible to change is not necessarily determined by the coefficient of one channel, but, for example, speaking of the transfer function processing unit 102, is determined by combining the coefficients of all four of the transfer function calculation units. By properly considering the combination of the four coefficients, it is possible to adjust both of the sense of depth and the sense of width. Since this effect is generally widely recognized, description thereof will be omitted.

Figure 19:
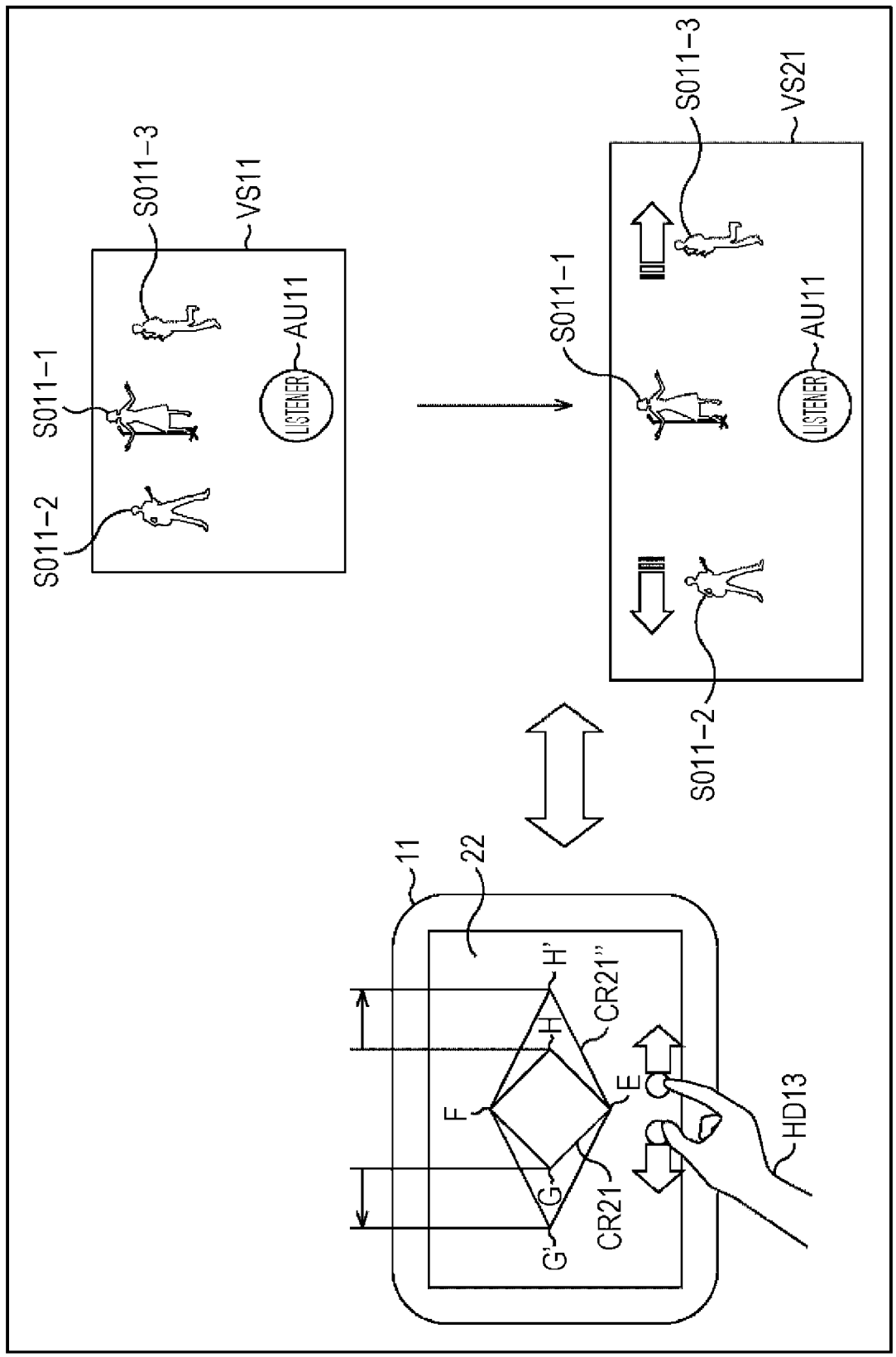
FIG. 19 is a diagram which describes the adjustment of a sense of width using the control graphic.

Here, in such a case, as shown in FIG. 19, the sense of width of the left and right of the virtual listening space is associated with the point G and the point H of the control graphic CR21. Here, in FIG. 19, the same reference numerals are used in the portions corresponding to the case in FIG. 15, and description thereof will be omitted as appropriate.

Here, for example, in the virtual listening space, the sense of width of the space of the left side when viewed by the user (listener) is associated with respect to the point G of the control graphic CR21, and the sense of width of the space of the right side when viewed by the user is associated with respect to the point H in the virtual listening space.

In addition, the state where the control graphic CR21 which is shown in FIG. 19 is a reference, that is, a state with no surround effect (zero sound effect) and in the state where the state of the control graphic CR21 is a reference, the virtual listening space VS11 which is shown in the right side in the diagram is set to be reproduced according to the sound signal.

From such a state, the display unit 22, in other words, the surface of the touch panel as the input unit 21 is set to be pinched outward by the user in the horizontal direction with two fingers of their right hand HD13. By so doing, the sound effect adjusting apparatus 11 senses the movement of the fingers of the user and converts the movement into the sliding amount of the fingers. Then, in accordance with the obtained sliding amount, the sound effect adjusting apparatus 11 moves the point G and the point H of the control graphic CR21 which are lined up in the horizontal direction to a point G' and a point H' and sets a rectangular control graphic CR21" where the four of a point E, a point F, a point G', and a point H' are set as vertices. In other words, the control graphic CR21 changes shape into the control graphic CR21".

When such an operation is performed with respect to the control graphic CR21, the characteristic of the sense of width of the left side which is associated with the point G and the characteristic of the sense of width of the right side which is associated with the point H are changed as shown in a virtual listening space VS21 of the right side in the diagram. In other words, the virtual listening space VS21 becomes a space which is wider in the left and right direction of the listener AU11 in comparison with the virtual listening space VS11.

In the virtual listening space VS21, the width to the right side and to the left side of the listener AU11 becomes larger, and in accordance with this, the sound source SO11-2 and the sound source SO11-3 which are positioned to the front left and right of the listener AU11 are moved so as to be widened in the left and right direction with respect to the sound source SO11-1.

The movement of the point G to the point G' in the control graphic CR21 signifies a change in the sense of width in the left direction of the virtual listening space which is felt by the listener hearing the audio without the surround effects, and the sense of width to the left side of the virtual listening space VS11 is changed in accordance with this change amount. In the same manner, the movement of the point H to the point H' in the control graphic CR21 signifies a change in the sense of width in the right direction of the virtual listening space which is felt by the listener hearing the audio without the surround effects, and the sense of width to the right side of the virtual listening space VS11 is changed in accordance with this change amount.

In other words, the sense of width (surround effect) of the virtual listening space may also be expanded left and right centering on the listener AU11 by being linked to the expansion of the control graphic CR21 in the left and right direction into the control graphic CR21".

In this manner, for the sound effect adjusting apparatus 11, not only surround adjustment according to the selection box as shown in FIG. 10, but also surround adjustment according to the shape change of the control graphic CR21 is possible.

As described above, in the adjustment of the surround effect according to the selection boxes of the related art, it is only possible to select one among several surround modes.

In contrast, according to the present technology, it is possible to continuously adjust the changing of the two sound parameters of the sense of width of the left side and of the right side of the virtual listening space with one control graphic. Moreover, it is possible for the user to clearly recognize the relationship between how the shape of the control graphic is changed and what kind of surround effect is obtained, and it is possible to perform an intuitive and continuous operation. Due to this, it is possible for the user to enjoy a wider surround effect in comparison with the adjustment of the surround effect according to just the selection box.

Here, even in a case where the sense of width is associated with the control graphic CR21 as shown in FIG. 19, in the sound effect adjusting apparatus 11, since the same process as the sound effect adjusting process which was described with reference to the flowchart of FIG. 17 is performed, description thereof will be omitted.

<Modification 3 of Fourth Embodiment>
<Adjustment of Sense of Width and Sense of Depth>

Furthermore, the sense of depth and the sense of width of the front of the virtual listening space may be associated with respect to the control graphic CR21 which is shown in FIG. 19.

Figure 20:
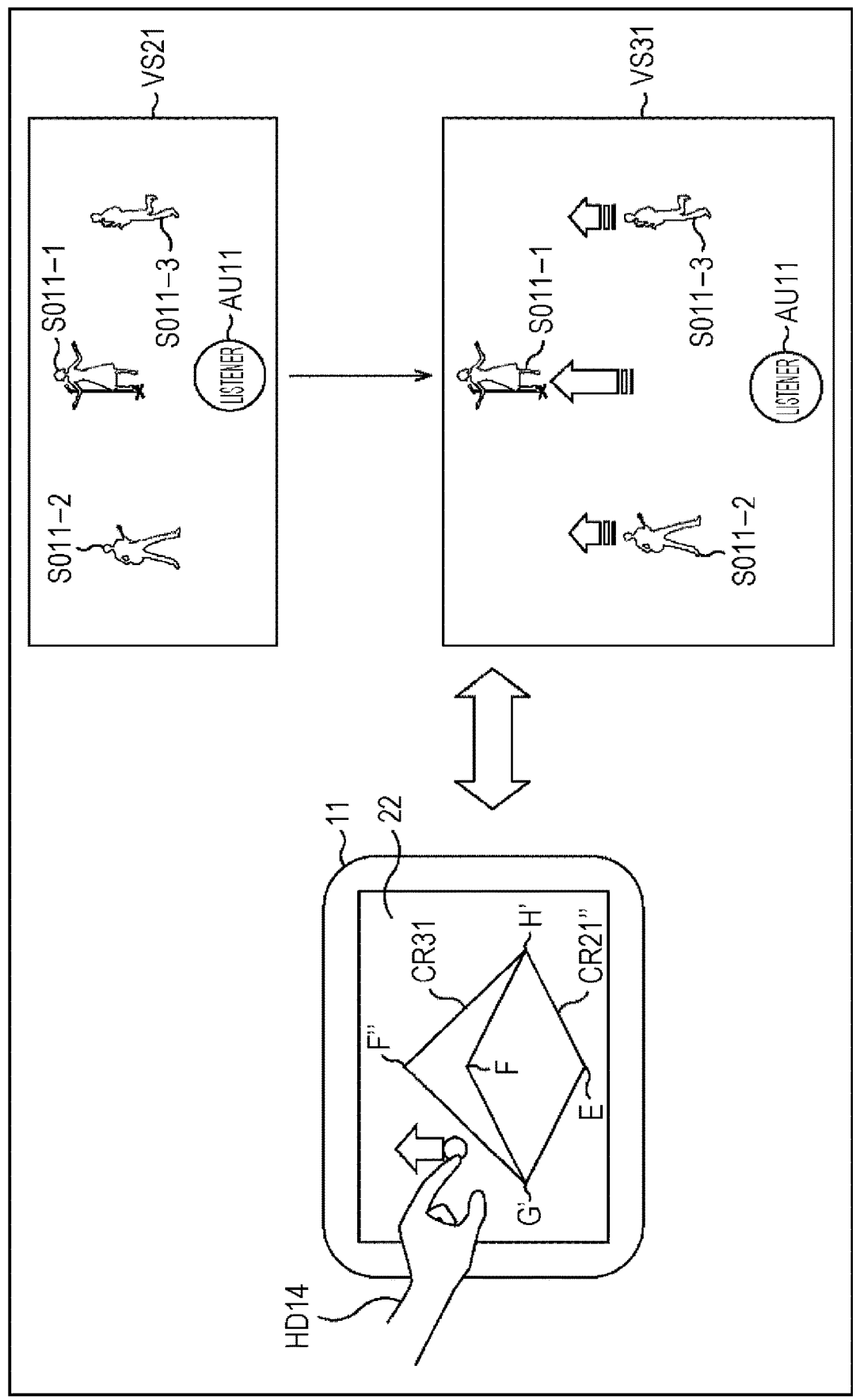
FIG. 20 is a diagram which describes the adjustment of the sense of width and the sense of depth using the control graphic.

For example, the control graphic CR21" of which the shape is changed in order to adjust the sense of width to the left and the right as shown in FIG. 20 is set to be displayed.

In addition, with respect to the state of the control graphic CR21", the virtual listening space VS21 which is shown in the right side in the diagram is set to be reproduced according to the sound signal. In other words, in this state, the surround effect which expands the sense of width to the left and right of the virtual listening space is already applied with respect to the sound signal.

In this example, further, the sense of depth of the front of the virtual listening space is associated with respect to the point F of the control graphic CR21".

From such a state, the user performs a sliding operation in the upward direction in the diagram with the index finger of the left hand HD14 on the surface of the display unit 22. By so doing, the sound effect adjusting apparatus 11 senses the movement of the fingers of the user, converts the movement into the sliding amount of the fingers, moves the point F of the control graphic CR21" to the point F" in accordance with the sliding amount, and sets a rectangular control graphic CR31 where the four of a point E, a point F", a point G', and a point H' are set as vertices. In other words, the control graphic CR21" changes shape into the control graphic CR31.

When such an operation is performed with respect to the control graphic CR21", the characteristic of the sense of depth to the front which is associated with the point F is changed as shown in a virtual listening space VS31 of the right side in the diagram. In other words, the virtual listening space VS31 becomes a space which is wider in the front of the listener AU11 in comparison with the virtual listening space VS21, and each sound source SO11 is also moved in the sense of depth direction so as to move away from the listener AU11 along with the expansion of the sense of depth to the front.

The movement of the point F to the point F" in the control graphic CR21" signifies a change in the sense of depth to the front of the virtual listening space, and surround adjustment is performed with respect to the sound signal such that the sense of depth to the front of the virtual listening space VS21 is changed in accordance with this change amount.

Here, even in a case where the sense of width is associated with the control graphic CR21" as shown in FIG. 20, in the sound effect adjusting apparatus 11, since the same process as the sound effect adjusting process which was described with reference to the flowchart of FIG. 17 is performed, description thereof will be omitted. In addition, here, description has been given of an example where the sense of depth to the front of the virtual listening space is associated with respect to the point F; however, the sense of depth to the back of the virtual listening space is also associated with the point E.

<Modification 4 of Fourth Embodiment>
<Adjustment of Front Width>

In addition, in the example which is shown in FIG. 20, according to the operation of the user on the control graphic CR31, setting may be performed such that it is possible to perform adjustment where the sense of depth to the front of the virtual listening space is further widened to the left and right.

Figure 21:
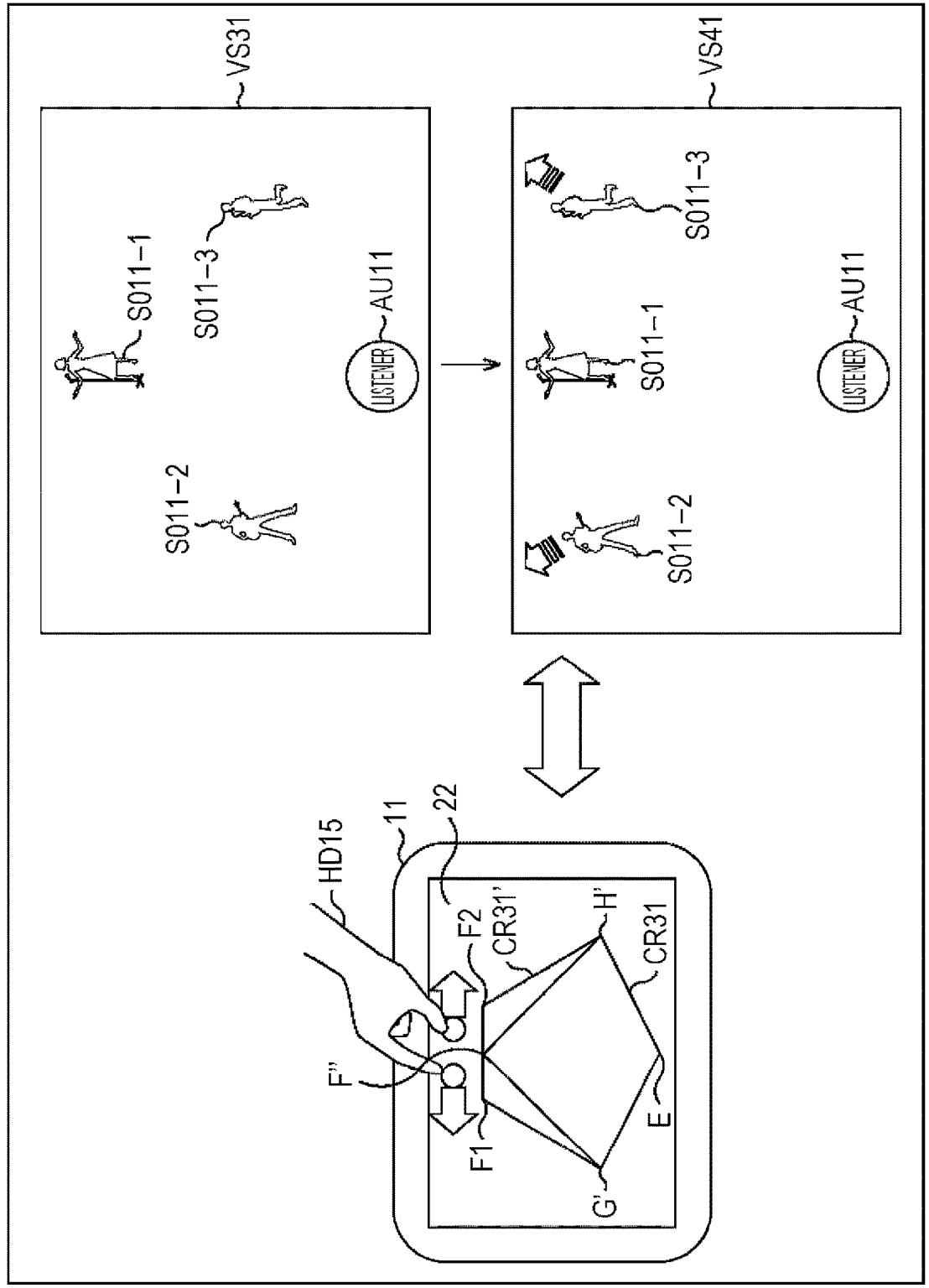
FIG. 21 is a diagram which describes the adjustment of the width of the sense of depth in the front using the control graphic.

In such a case, for example, as shown in FIG. 21, the control graphic CR31 where the shape is changed such that the point F moves to the point F" is displayed on the display unit 22. In addition, with respect to the state of the control graphic CR31, the virtual listening space VS31 shown at the right side in the diagram is set to be reproduced according to the sound signal. Here, in FIG. 21, the same reference numerals are used in the portions corresponding to the case in FIG. 20, and description thereof will be omitted as appropriate.

In the state where the control graphic CR31 is displayed, the surround effects are already applied to the sound signal such that the state which is a reference without surround effects becomes a state where the sense of width is expanded in the left and right direction and the sense of depth to the front is also expanded.

From such a state, in order to further widen the sense of depth to the front of the virtual listening space to the left and right, the user performs pinching out in the horizontal direction in the diagram with two fingers of the right hand HD 15 on the surface of the display unit 22. By so doing, the sound effect adjusting apparatus 11 senses the movement of the fingers of the user and converts the movement into the sliding amount of the fingers. Then, in accordance with the obtained sliding amount, the sound effect adjusting apparatus 11 divides the point F" of the control graphic CR31 into two of a point FIG. 1 and a point FIG. 2. Due to this, the control graphic CR31 changes shape into a pentagon-shaped control graphic CR31' where the point E, a point F1, a point F2, the point G', and the point H' are set as vertices.

In this manner, the operation where the point F is divided into the point F1 and the point F2 signifies further widening the sense of depth at the front to the left and right, and the point F1 and the point F2 are positioned at positions in accordance with the sliding amount at the time of the pinching out operation of the user.

Then, in accordance with the distance from the point F to the point F1 or the point F2, the characteristics of the sense of depth to the left and right at the front which is associated with the point F1 and the point F2 are changed as shown in a virtual listening space VS41 at the right side in the diagram. In other words, for the virtual listening space VS41, the sense of depth to the front of the listener AU11 is further widened to the left and right in comparison with the virtual listening space VS31, and the sound source SO11-2 and the sound source SO11-3 are also moved in the left back direction and the right back direction accordingly.

In this manner, when the point F is divided into the point F1 and the point F2, the sense of depth to the front and the sense of left and right of the virtual listening space are changed. The sound effect adjusting unit 25 adjusts the surround effect with respect to the sound signal such that the front sense of depth of the virtual listening space is expanded to the left and right in accordance with the control signal which is supplied from the control signal generating unit 34 in accordance with the operation of the user.

Here, even in this case, in the sound effect adjusting apparatus 11, since the same process as the sound effect adjusting process which was described with reference to the flowchart of FIG. 17 is performed, description thereof will be omitted.

<Modification 5 of Fourth Embodiment>
<Position Adjustment of Listener>

In addition, in the above, description has been given of a method of changing the sound characteristics of the virtual listening space, that is, a method of adjusting the surround effects to the front and back and the left and right with the listener as the center in the virtual listening space; however, adjustment of the surround effect may be performed such that the position of the listener is changed.

Figure 22:
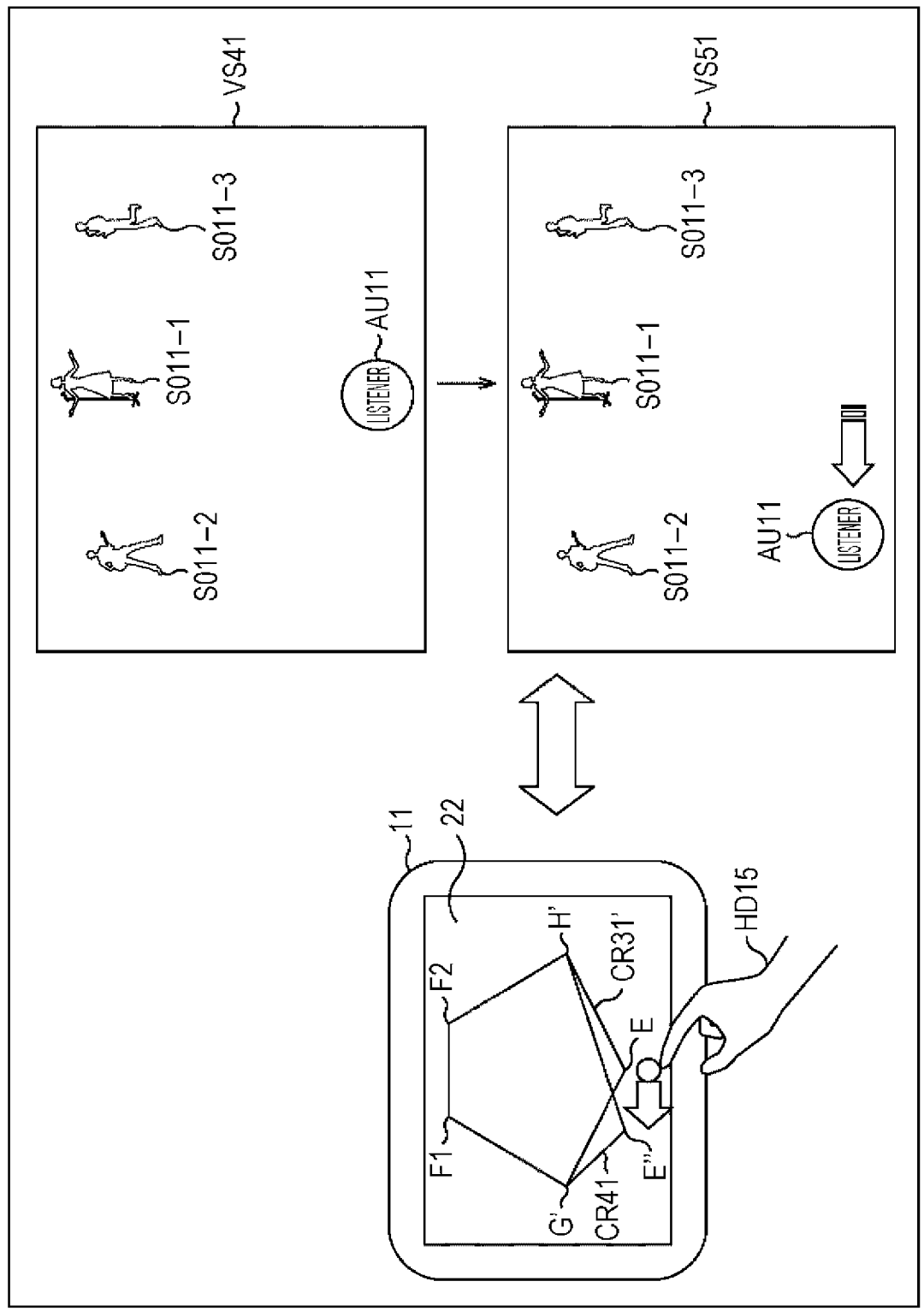
FIG. 22 is a diagram which describes the adjustment of the position of the listener using the control graphic.

In such a case, for example, as shown in FIG. 22, the control graphic CR31' obtained by dividing the point F into the point F1 and the point F2 is displayed on the display unit 22. In addition, with respect to the state of the control graphic CR31', the virtual listening space VS41 shown at the right side in the diagram is set to be reproduced according to the sound signal. Here, in FIG. 22, the same reference numerals are used in the portions corresponding to the case in FIG. 21, and description thereof will be omitted as appropriate.

In the state where the control graphic CR31' is displayed, the surround effects are already applied to the sound signal such that the state becomes a state where the sense of depth to the front is further widened to the left and right.

From such a state, the user performs a sliding operation in the horizontal direction in the diagram with the index finger of the right hand HD 15 on the surface of the display unit 22. By so doing, the sound effect adjusting apparatus 11 senses the movement of the fingers of the user and converts the movement into the sliding amount of the fingers. Then, the sound effect adjusting apparatus 11 moves the point E of the control graphic CR31' to the point E" in accordance with the obtained sliding amount, and sets a pentagon-shaped control graphic CR41 where five of the point E", the point F1, the point F2, the point G', and the point H' are set as vertices. In other words, the control graphic CR31" changes shape into the control graphic CR41.

The operation where the point E is moved to the point E" signifies moving the position of the listener in the virtual listening space and the point E is moved to a position in accordance with the sliding amount of the sliding operation of the user.

Then, in accordance with the movement direction and the movement distance of the point E, the position of the listener which is associated with the point E is changed as shown in a virtual listening space VS51 at the right side in the diagram. In other words, in the virtual listening space VS51, the position of the listener AU11 is moved in the left direction in the diagram in comparison with the position of the listener AU11 in the virtual listening space VS41.

In this manner, when the point E is moved to the point E", the position of the listener in the virtual listening space is moved. The sound effect adjusting unit 25 adjusts the surround effect with respect to the sound signal such that the position of the listener in the virtual listening space is changed in accordance with the control signal which is supplied from the control signal generating unit 34 in accordance with the operation of the user.

Here, even in this case, in the sound effect adjusting apparatus 11, since the same process as the sound effect adjusting process which was described with reference to the flowchart of FIG. 17 is performed, description thereof will be omitted.

According to the above operation, by linking to changes in the control graphic, it is possible to realize not only the changes of the surround effect with the listener as the center, but also the changes of the surround effect which are equivalent to moving the position of the listener in the hall. Naturally, it is possible to change the position of the listener to various positions by changing the shape of the control graphic, and it is possible to realize a user interface and sound effects not in the related art.

<Fifth Embodiment>
<Adjustment of Centrally Located Components>

Furthermore, the gain of the centrally located components is associated with respect to the control graphic, and it may be set to be possible to adjust the centrally located components of the sound signal.

In such a case, for example, the control graphic CR21 shown in FIG. 15 is displayed on the display unit 22. Here, the sense of depth to the back and the front of the virtual listening space is associated with the point E and the point F of the control graphic CR21.

Figure 23:
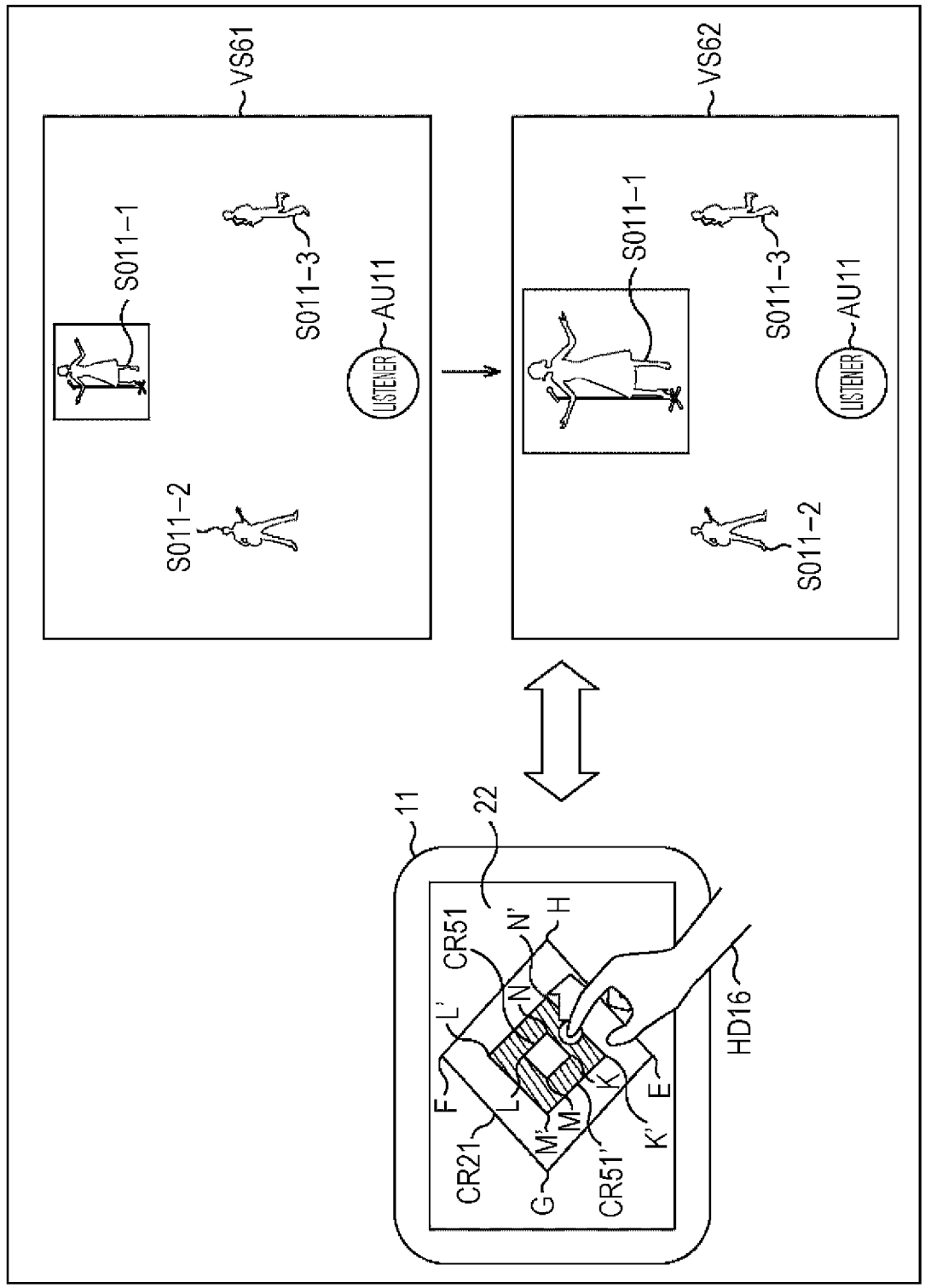
FIG. 23 is a diagram which describes the adjustment of the centrally located components using the control graphic.

From such a state, when the user touches (taps) the inside of the control graphic CR21 with their right hand HD16 as shown in FIG. 23, a rectangular control graphic CR51 where a point K, a point L, a point M, and a point N are set as vertices is further displayed in the inside of the control graphic CR21. Here, in FIG. 23, the same reference numerals are used in the portions corresponding to the case in FIG. 15, and description thereof will be omitted as appropriate. In addition, the operation for displaying the control graphic CR51 is not limited to an operation of tapping a region inside the control graphic CR21, but may be any kind of operation.

When the control graphic CR51 is displayed, it is possible for the user to adjust the sound effect with respect to the centrally located components of the sound signal by performing an operation with respect to the control graphic CR51.

For example, the state of the control graphic CR51 shown in FIG. 23 is set to a state which is a reference, that is, a state where there is no change in the centrally located components and zero sound effects.

In a case where the state of the control graphic CR51 is a reference state, for example, a virtual listening space VS61 which is shown at the right side in the diagram is reproduced according to the sound signal. In the virtual listening space VS61, three of the sound source SO11-1 to the sound source SO11-3 are arranged in front of the listener AU11 and the images of each sound source SO11 are approximately the same size.

From such a state, the user performs a sliding operation with the index finger of the right hand HD16 on the display unit 22. By so doing, the sound effect adjusting apparatus 11 senses the movement of the fingers of the user and converts the movement into the sliding amount of the fingers. Then, the sound effect adjusting apparatus 11 expands the control graphic CR51 in accordance with the obtained sliding amount, and changes the shape to a rectangular control graphic CR51' where a point K', a point L', a point M', and a point N' are set as vertices.

Here, the changes of the size of the control graphic CR51 show the changes of the gain of the centrally located components of the sound signal, and gain adjustment is performed such that the gain of the centrally located components is increased when the control graphic CR51 is expanded, and the gain of the centrally located components is decreased when the control graphic CR51 is reduced.

For example, at the time of the sliding operation on the control graphic CR51, when the position which is initially touched by the user is inside the control graphic CR51, the control graphic CR51 is reduced. In contrast, when the position which is initially touched by the user is outside the control graphic CR51 and a region which is inside the control graphic CR21, the control graphic CR51 is expanded.

Here, when an operation is performed by the user outside the control graphic CR21, the sense of depth may be adjusted by performing an operation with respect to the control graphic CR21. In addition, when the position which is initially touched by the user is outside the control graphic CR51, even when this position is a region which is outside the control graphic CR21, the control graphic CR51 may be set to be expanded.

In the example of FIG. 23, since the user performs a sliding operation by touching a region which is outside the control graphic CR51 and inside the control graphic CR21, the control graphic CR51 is expanded and set to the control graphic CR51'.

When the control graphic CR51 is expanded and displayed in this manner, the gain of the sound from the sound source SO11-1 which is a centrally located component is increased from the state of the virtual listening space VS61, and the virtual listening space is changed to the state of a virtual listening space VS62 which is shown in the right side in the diagram. In the virtual listening space VS62, in comparison with the virtual listening space VS61, the image of the sound source SO11-1 is increased by the amount of the amplification of the gain. Along with this, in the sound effect adjusting unit 25, the centrally located component of the sound signal is amplified.

Here, the expansion of the image of the sound source SO11-1 in the virtual listening space VS62 mimics the amplification of the audio from the sound source SO11-1. In addition, in the gain adjustment of the centrally located components, the adjustment amount of the gain may be represented by not only the changing the size of the control graphic CR51, but also by changing the color of the control graphic CR51, for example. Specifically, the color of the control graphic CR51 may be changed by replacing a change from a bright color to a dark color with a numerical magnitude relationship.

Furthermore, the gain adjustment amount of the centrally located components may be set to be represented by displaying an arbitrary image and changing the resolution of the image. Specifically, changing the resolution of the image from a high state to a low state may be replaced with a numerical magnitude relationship.

Otherwise, the adjustment amount of the centrally located components may be set to be represented by displaying an arbitrary image and changing the transparency of the image. Specifically, changing the transparency of the image from a zero state to a completely transparent state, in other words, a state where it is difficult to see the image, may be replaced with a numerical magnitude relationship.

In this manner, representing not only the shape change of the control graphic, but also the gain adjustment amount by changing the color and the resolution is not limited to this example, and application thereof is possible with respect to all the examples which are disclosed in the present specification. For example, the color, resolution, transparency, or the like of the control graphic CR11 which is described above may be set to be changed in accordance with a user operation with respect to the control graphic CR11.

In addition, regarding the increasing and decreasing method of the centrally located components, for example, when the sound signal which is the input is a 5.1 channel signal, the gain of only the center channel (central channel) may be adjusted. In addition, in a case where the sound signal which is the input has only 2 channels, after the 2 channel sound signal is split into each component of the left channel, the central channel, and the right channel according to the signal process, the gain adjustment of only the central channel, which is a centrally located component, may be set to be performed.

As described above, by associating the gain of the centrally located components as sound parameters with respect to the control graphic CR51, it is possible to provide an easy-to-use user interface which is more intuitive.

For example, in 5.1 channel content such as movies, there are cases where dialogue is placed in the center channel, which is a centrally located component. In such a case, it is possible to manually change the gain of the center channel such that the dialogue is easy to hear; however, for this reason, before arriving at the gain setting menu of each channel of the 5.1 channels, it is difficult for the user to perform this adjustment.

In addition, in normal 2 channel content, in particular, music, it is possible to realize a karaoke function by taking out a centrally located component according to the signal process. However, in order to realize the karaoke function, for example, the function is enabled by pressing or the like a karaoke function button after advancing to a deeper part of the menu. In other words, simply by adjusting the same centrally located component, there are a plurality of menus and a plurality of functions, and it could not be said that the present interfaces are easy to use.

In contrast, in the present technology, on the screen where the surround is adjusted, it is possible to further add a function which realizes the adjustment of the centrally located components by giving one command. In addition, since the new control graphic CR51 is displayed in the middle of the inside of the control graphic CR21, it is easy to associate the control graphic CR51 as being for the adjustment of the centrally located components.

Accordingly, when compared with a method which calls up the functions of the related art from individual menus and performs adjustment separately, it is possible for the present technology to realize extremely high usability, such as being able to continuously adjust a plurality of sound parameters on one screen.

<Configuration Example of Sound Effect Adjusting Unit>

Next, description will be given of a configuration of the sound effect adjusting unit 25 in a case where the gain adjustment of the centrally located components is performed by the control graphic CR51 shown in FIG. 23.

For example, the sound signal which is output from the acquisition unit 24 is set to a 3 channel signal which is formed of a sound signal SL of the left channel, a sound signal SR of the right channel, and a sound signal SC of the central channel. This corresponds to the recording the content which is the reproduction target in multiple channels.

Here, for example, when the reproduction in the reproduction unit 26 is set to stereo channel (2 channel) reproduction, it is necessary to perform a so-called mix-down process with respect to the multichannel sound signal.

Normally, the mix-down process is a process of mixing the signals of each channel at a certain ratio and reducing the number of channels to 2 channels such that it is possible to reproduce the multichannel signal even with a 2 channel speaker.

Accordingly, a case where the sound signal which is output from the acquisition unit 24 is a 3 channel signal corresponds to adding the sound signal SC of the central channel at a certain ratio to the sound signal SL of the left channel and the sound signal SR of the right channel.

However, the sound effect adjusting unit 11 generates a control signal in accordance with the amount of shape changing of the control graphic CR51 without performing the mix-down process at a certain ratio. Then, according to the control signal, the sound effect adjusting unit 11 varies the mixing ratio of the sound signal SL of the left channel and the sound signal SR of the right channel of the sound signal SC of the central channel.

Due to this, it is possible to adjust the gain of the centrally located components in accordance with the operation of the user. For example, it is possible to increase the mixing ratio and emphasize the vocal which is a centrally located component, and to decrease the mixing ratio for uses such as karaoke.

Figure 24:
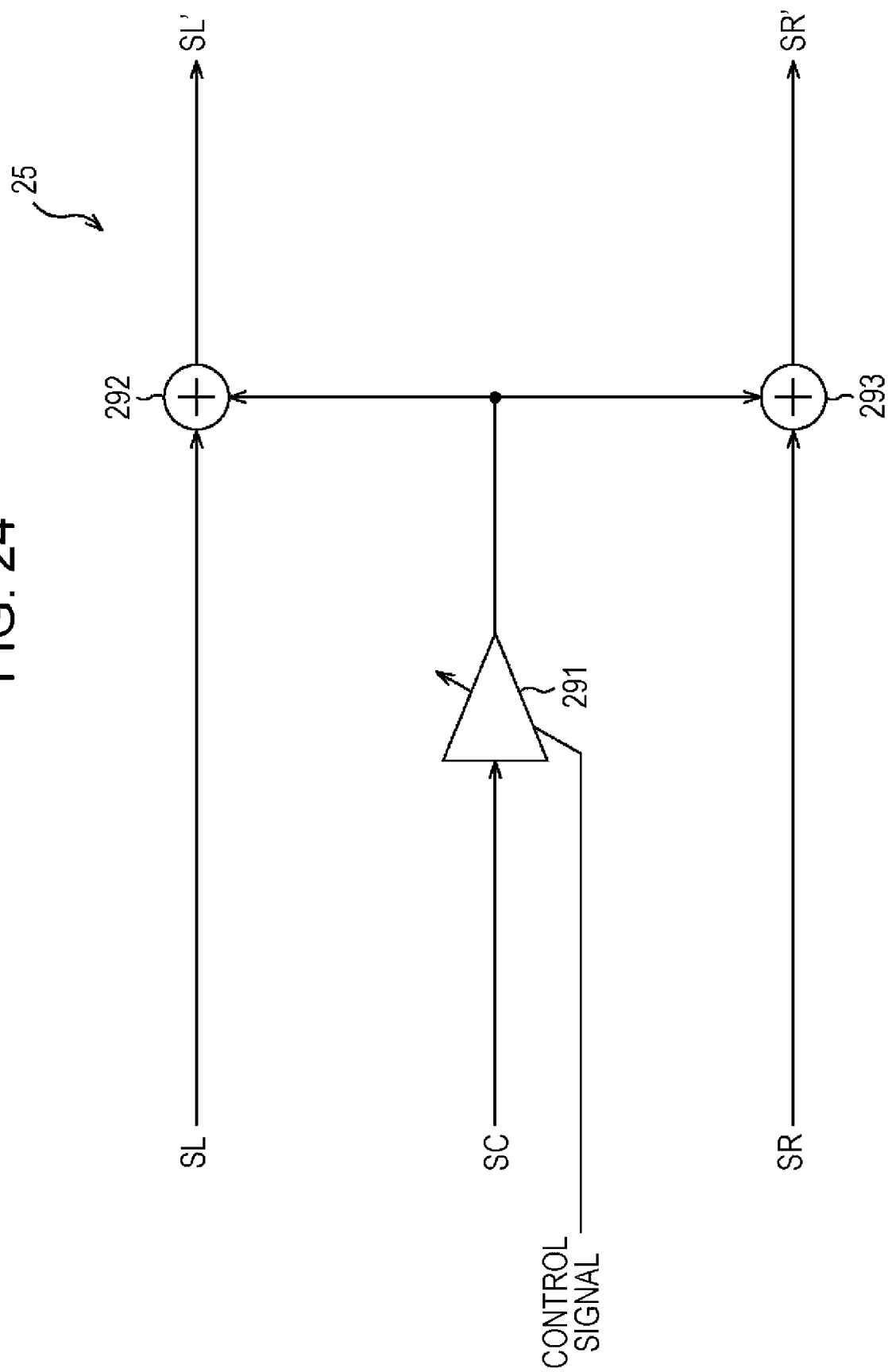
FIG. 24 is a view which illustrates a configuration example of a sound effect adjusting unit.

In this manner, in a case where the mixing ratio of the sound signal SC of the central channel is varied according to the control signal in accordance with the amount of shape changing of the control graphic CR51, a configuration which adjusts the centrally located components shown in FIG. 24 is provided in the sound effect adjusting unit 25 as well as the configuration where the surround effect is adjusted.

Here, in FIG. 24, the illustration of the configuration where the surround effect is adjusted is omitted. A gain adjusting unit 291, an adding unit 292, and an adding unit 293 are included in the sound effect adjusting unit 25 shown in FIG. 24.

In this example, the control signal is supplied to the gain adjusting unit 291 in accordance with the amount of shape changing of the control graphic CR51 and the sound signal SC of the central channel is supplied to the gain adjusting unit 291. In addition, the sound signal SL of the left channel and the sound signal SR of the right channel are respectively supplied to the adding unit 292 and the adding unit 293.

The gain adjusting unit 291 adjusts the gain of the supplied sound signal SC and performs supply thereof to the adding unit 292 and the adding unit 293 based on the control signal which is supplied from the control signal generating unit 34.

The adding unit 292 adds the sound signal SC which is supplied from the gain adjusting unit 291 to the supplied sound signal SL, sets the sound signal SL' of the left channel after gain adjustment, and performs supply thereof to the reproduction unit 26. In addition, the adding unit 293 adds the sound signal SC which is supplied from the gain adjusting unit 291 to the supplied sound signal SR, sets the sound signal SR' of the right channel after gain adjustment, and performs supply thereof to the reproduction unit 26.

Here, in a case where the sound signal is a signal with 2 channels of left and right, it is possible to perform gain adjustment of the centrally located component by using the signals of the left channel and the right channel, generating a signal which corresponds to the central channel, and adjusting the gain of the signal.

In addition, the gain adjustment of the centrally located component may be performed with respect to the sound signal after the surround adjustment, and the surround adjustment may be performed with respect to the sound signal after the gain adjustment of the centrally located component.

<Description of Sound Effect Adjusting Process>

Figure 25:
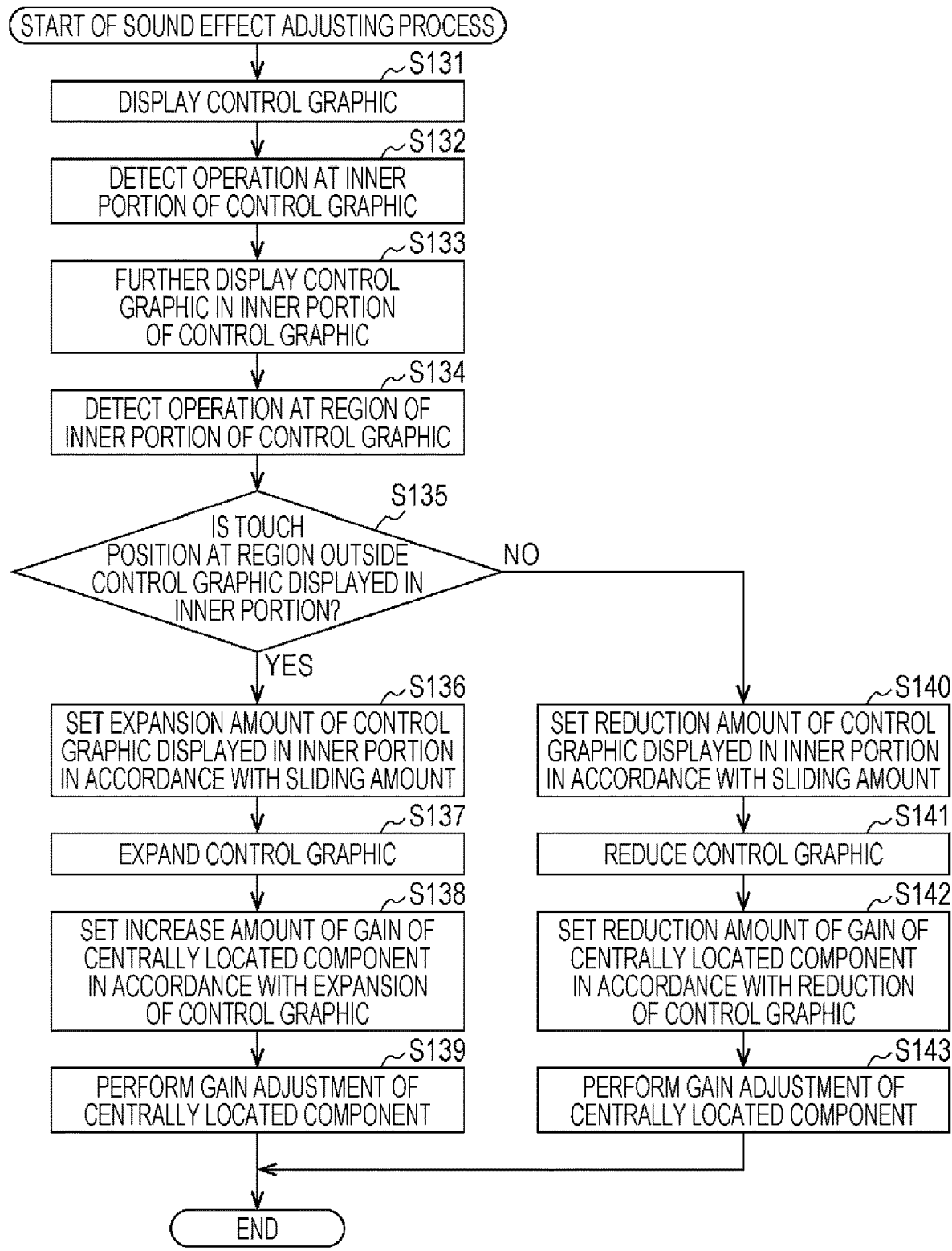
FIG. 25 is a flowchart which describes the sound effect adjustment process.

Furthermore, with reference to the flowchart of FIG. 25, description will be given of the sound effect adjusting process which is performed by the sound effect adjusting apparatus 11 in a case where the sound effect adjusting unit 25 is set to the configuration shown in FIG. 24 and the gain adjustment of the centrally located component is performed according to the operation with respect to the control graphic CR51.

In step S131, the display control unit 33 supplies the image data of the control graphic CR21 to the display unit 22, and displays the control graphic CR21 on the display unit 22. By so doing, the display unit 22 displays the control graphic CR21 based on the image data which is supplied from the display control unit 33.

In a case where the user wants to perform the gain adjustment of the centrally located components, the user taps the inside of the control graphic CR21, that is, a region of the control graphic CR21, and instructs the display of the control graphic CR51. When the user performs an operation with respect to the control graphic CR21, the touch panel as the input unit 21 supplies a signal to the control unit 23 in accordance with an operation of the user.

In step S132, the detection unit 31 detects an operation of the user in the inside of the control graphic CR21 based on the signal which is supplied from the input unit 21. Specifically, the detection unit 31 detects the operation by the user in the inside of the control graphic CR21 from the touch position of the user on the touch panel.

When the operation on the control graphic CR21 is detected, in step S133, the display control unit 33 supplies the image data of the control graphic CR51 to the display unit 22 in accordance with the detection, and further displays the control graphic CR51 in the inside of the control graphic CR21 on the display unit 22. Due to this, the display unit 22 displays the control graphic CR51 in the inside of the control graphic CR21 as shown in FIG. 23, for example.

When the control graphic CR51 is displayed, since the user instructs the gain adjustment of the centrally located components of the sound signal, a sliding operation is performed with respect to the control graphic CR51.

Here, in accordance with whether the centrally located components are increased or decreased, the user performs an operation in the inside of the control graphic CR51, in other words, in a region of the control graphic CR51, or an operation in the outside of the control graphic CR51 and inside of the control graphic CR21.

In step S134, the detection unit 31 detects the user operation in the region which is inside the control graphic CR21 based on a signal which is supplied from the input unit 21 in accordance with the operation by the user in the control graphic CR51.

Specifically, the detection unit 31 detects the touch position of the user on the touch panel and the sliding amount which is the movement amount of the finger of the user which contacts the touch panel.

In step S135, the setting unit 32 determines whether or not the touch position which is detected by the detection unit 31 is in a region to the outside of the control graphic CR51 which is displayed in the inside. That is, in a case where the initial touch position of the user is inside the control graphic CR21 and is in a region which is outside the control graphic CR51, the touch position is determined as a region outside the control graphic CR51.

In step S135, in a case where the touch position is determined as a region outside the control graphic CR51, the process proceeds to step S136.

In step S136, the setting unit 32 sets the expansion amount of the control graphic CR51 which is displayed in the inside of the control graphic CR21 in accordance with the sliding amount which is detected by the detection unit 31. For example, the expansion amount is determined such that each point (vertex) of the control graphic CR51 is moved by only the distance which is determined in advance with respect to the sliding amount.

In step S137, the display control unit 33 controls the display unit 22 based on the expansion amount which is determined in step S136, and expands the control graphic CR51. Due to this, for example, the control graphic CR51 which is shown in FIG. 23 is expanded to the control graphic CR51' and displayed.

In step S138, the control signal generating unit 34 determines the increase amount of the gain of the centrally located components in accordance with the expansion amount of the control graphic CR51. The control signal generating unit 34 generates a control signal which increases the gain of the centrally located components of the sound signal by only the determined increase amount, and performs supply thereof to the gain adjusting unit 291 of the sound effect adjusting unit 25.

In step S139, the sound effect adjusting unit 25 performs gain adjustment of the centrally located components with respect to the sound signal which is supplied from the acquisition unit 24 based on the control signal from the control signal generating unit 34 and supplies the sound signal which is obtained as a result to the reproduction unit 26.

Specifically, the gain adjusting unit 291 adjusts the gain of the supplied sound signal SC and performs supply thereof to the adding unit 292 and the adding unit 293 based on the control signal which is supplied from the control signal generating unit 34. Then, the adding unit 292 adds the sound signal SC which is supplied from the gain adjusting unit 291 to the supplied sound signal SL, sets the sound signal SL', and performs supply thereof to the reproduction unit 26. In addition, the adding unit 293 adds the sound signal SC which is supplied from the gain adjusting unit 291 to the supplied sound signal SR, sets the sound signal SR', and performs supply thereof to the reproduction unit 26.

The reproduction unit 26 reproduces audio based on the sound signal which is supplied from the adding unit 292 and the adding unit 293.

When the gain adjustment of the centrally located components of the sound signal is performed in this manner, and the sound effect adjusting process is finished.

In addition, in step S135, in a case where it is determined that the touch position is not in a region which is outside the control graphic CR51, in other words, in a region which is inside the control graphic CR51, the process proceeds to step S140.

In step S140, the setting unit 32 sets the reduction amount of the control graphic CR51 which is displayed in the inside of the control graphic CR21 in accordance with the sliding amount which is detected by the detection unit 31.

In step S141, the display control unit 33 controls the display unit 22 based on the reduction amount determined in step S140, and reduces the control graphic CR51.

In step S142, the control signal generating unit 34 determines the reduction amount of the gain of the centrally located components in accordance with the reduction amount of the control graphic CR51. The control signal generating unit 34 generates a control signal which decreases the gain of the centrally located components of the sound signal by the determined decrease amount, and performs supply thereof to the gain adjusting unit 291 of the sound effect adjusting unit 25.

In step S143, the sound effect adjusting unit 25 performs gain adjustment of the centrally located components with respect to the sound signal which is supplied from the acquisition unit 24 based on the control signal from the control signal generating unit 34 and supplies the sound signal which is obtained as a result to the reproduction unit 26. That is, in step S143, the same process as in step S139 is performed.

When the gain adjustment of the centrally located components of the sound signal is performed and the sound signal is supplied from the sound effect adjusting unit 25 to the reproduction unit 26, the reproduction unit 26 generates audio based on the sound signal which is supplied from the sound effect adjusting unit 25 and finishes the sound effect adjusting process.

In the above manner, the sound effect adjusting unit 11 changes the shape of the control graphic CR51 in accordance with a user operation with respect to the control graphic CR51 and performs gain adjustment of the centrally located component of the sound signal in accordance with the shape change.

According to the sound effect adjusting apparatus 11, at the same time as the control graphic CR51 which is associated with the sound parameters for gain adjustment in accordance with the operation of the user changes shape, the sound effect is adjusted in accordance with the change of shape, whereby it is possible to realize an intuitive operation for the user. That is, with respect to the user, it is possible to provide an easy-to-use user interface which is easier to understand.

Here, in the present specification, description is given only of a representative operation as an operation with respect to the control graphic CR51; however, in consideration of many other operations as variations of the operation with respect to the control graphic CR51, it is possible to apply the present technology with respect to the adjustment of sound effects corresponding to these variations in the operations.

<Sixth Embodiment>
<Equalizer Adjustment and Surround Adjustment>

In addition, sound parameters of different categories (types), such as the sound parameter of the equalizer adjustment and the sound parameter of the surround adjustment may be associated with respect to each vertex of the control graphic.

Figure 26:
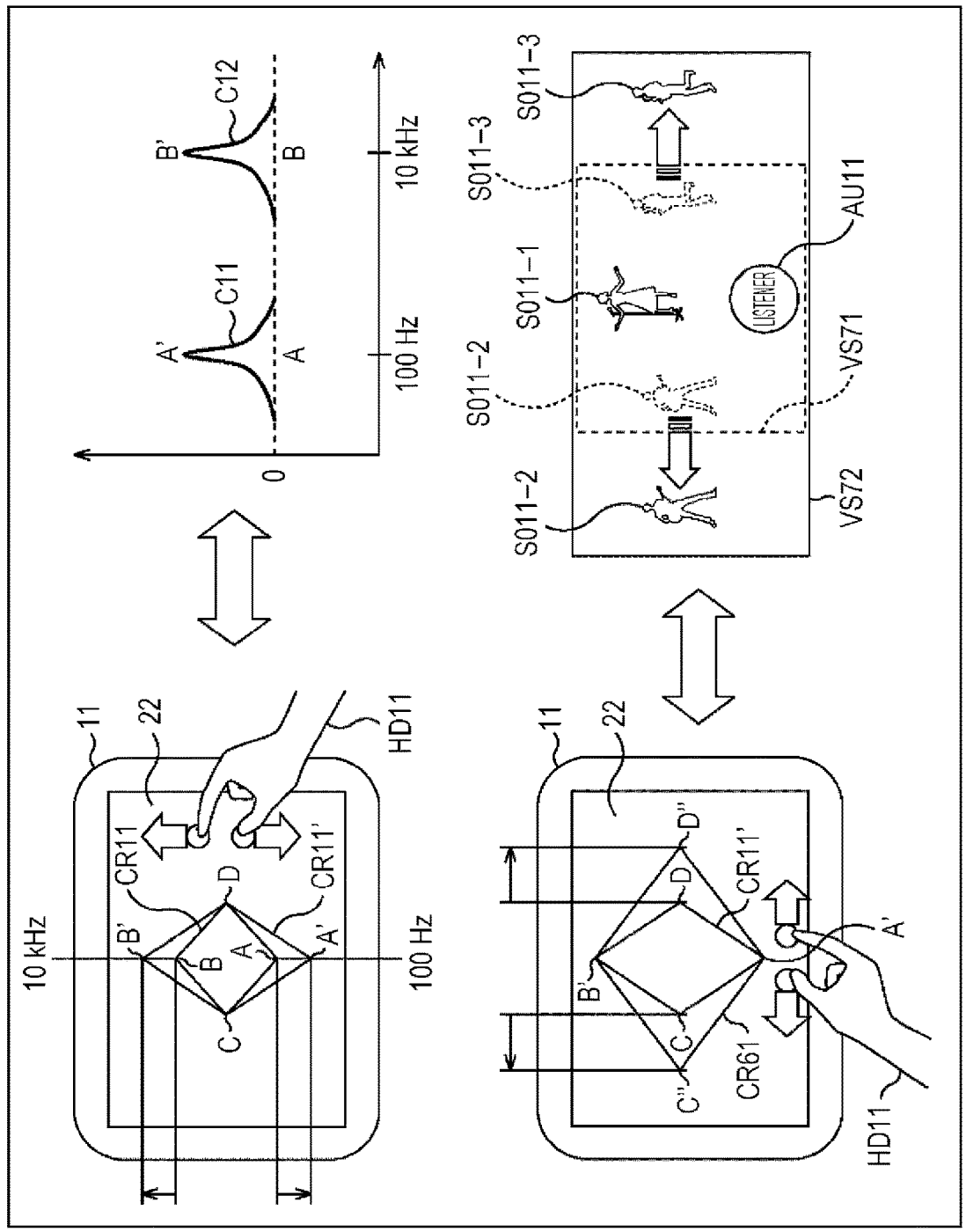
FIG. 26 is a diagram which describes the adjustment of the gain and sense of width using the control graphic.

For example, in a case where the sound parameter of the equalizer adjustment and the sound parameter of the surround adjustment are associated with the control graphic, an operation with respect to the control graphic as shown in FIG. 26 is performed. Here, in FIG. 26, the same reference numerals are used in the portions corresponding to the case in FIG. 4 or FIG. 19, and description thereof will be omitted as appropriate.

For example, the control graphic CR11 where the point A, the point B, the point C, and the point D are set as vertices is displayed on the display unit 22 as shown in the upper side in FIG. 26.

In the control graphic CR11, the 100 Hz gain and the 10 kHz gain of the sound signal are associated with the point A and the point B. In addition, the sense of width of the left direction and the right direction of the virtual listening space is associated with the point C and the point D.

Accordingly, for example, as shown in the upper side in the diagram, when the user performs a pinching out operation in the vertical direction with their right hand HD11, the control graphic CR11 is expanded in the vertical direction along with this operation, and changes shape into the control graphic CR11'. Then, the gain adjustment (equalizer adjustment) of the sound signal is performed by the sound effect adjusting unit 25 such that the 100 Hz characteristic and the 10 kHz of the sound signal are changed in accordance with the control graphic CR11 as shown in the curve C11 and the curve C12 of the right side in the diagram.

In addition, as shown in the lower side in the diagram, when the user performs a pinching out operation in the horizontal direction with respect to the control graphic CR11' with their right hand HD11, the control graphic CR11' is expanded in the horizontal direction along with this operation, and changes shape into a control graphic CR61. The control graphic CR61 has a rectangular shape where the point A', the point B', the point C", and the point D" are set as vertices.

When the control graphic CR11' changes shape into the control graphic CR61, the sense of width in the left and right direction of the virtual listening space of the sound signal is expanded in accordance with this change of shape as shown in the right side in the diagram. In this example, in the state where the control graphic CR11' is displayed, a virtual listening space VS71 is changed into a virtual listening space VS72 along with the shape change into the control graphic CR61. In other words, along with the expansion of the virtual listening space in the left and right direction, the positions of the sound source SO11-2 and the sound source SO11-3 are moved to the outside so as to move away from the sound source SO11-1 in accordance with the expansion.

When the control graphic CR11' is expanded in the horizontal direction, the sound effect adjusting unit 25 performs adjustment of the sense of width with respect to the sound signal, that is, adjustment of surround effect, such that the sense of width of the virtual listening space is expanded.

In this manner, it is possible to associate the equalizer adjustment with respect to the operation in the vertical direction, and associate the surround adjustment with the operation in the horizontal direction of one control graphic CR11. Accordingly, when compared with a method of the related art which calls up the functions from individual menus and performs adjustment separately, since it is possible to continuously adjust the plurality of sound parameters on one screen in the present technology, it is possible to provide higher usability for the user.

Here, it may be possible for the user to set which kind of sound parameter is associated with each portion (vertex) of the control graphic.

<Seventh Embodiment>
<Equalizer Adjustment and Surround Adjustment>

In addition, in the above, description has been given of an example where a sound parameter is associated with a vertex of one graphic; however, a control graphic may be set to be displayed on each surface of a three-dimensional shape.

Figure 27:
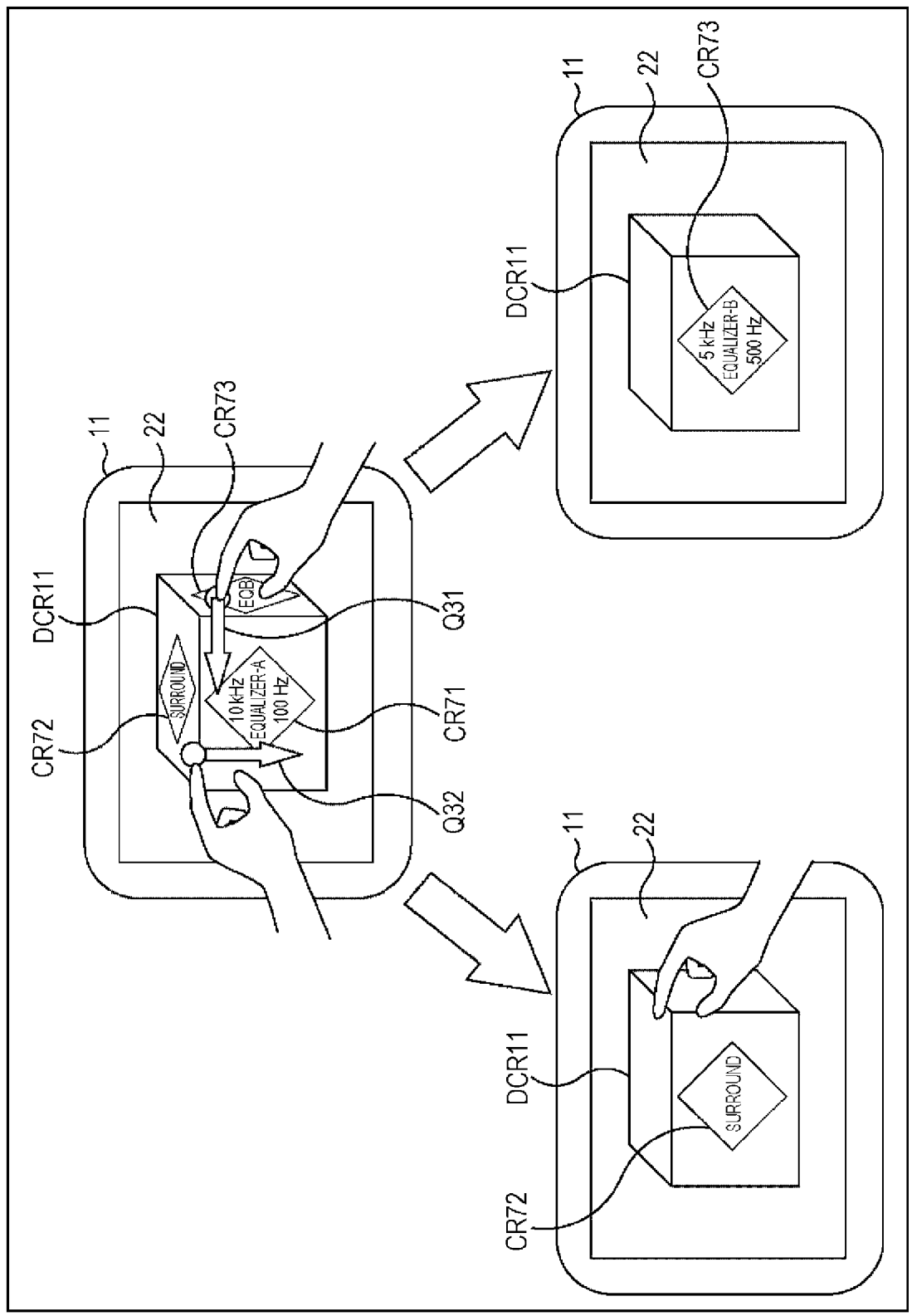
FIG. 27 is a diagram which describes the adjustment of the sound effects using the control graphic.

In such a case, for example, as shown in FIG. 27, the display control unit 33 displays a three-dimensional control graphic DCR11 on the display unit 22. In this example, the three-dimensional control graphic DCR11 is a cube, and the control graphics are displayed on the surfaces of the cube. Specifically, as shown in the upper side in the diagram, a control graphic CR71, a control graphic CR72, and a control graphic CR73 are respectively displayed on the front surface, the upper surface, and the right side surface of the three-dimensional control graphic DCR11.

For example, the control graphic CR71 is a control graphic for equalizer adjustment, and the 10 kHz and 100 Hz gain characteristics are respectively associated with the points on the upper side and lower side in the vertical direction of the control graphic CR71.

In addition, the control graphic CR72 is a control graphic for surround adjustment, and the control graphic CR73 is set to the control graphic for equalizer adjustment. In particular, the 5 kHz and 500 Hz gain characteristics are respectively associated with the points on the upper side and lower side in the vertical direction of the control graphic CR73.

In the three-dimensional control graphic DCR11, for example, an operation is possible with respect to only to a control graphic which is displayed on the surface which is positioned at the front surface side when viewed by the user. Accordingly, in the upper side state in the diagram, an operation is possible with respect to the control graphic CR71 which is displayed on the front surface.

In addition, from this state, when the user performs a sliding operation with a finger in a direction shown by an arrow Q31, that is, in the left direction in the diagram, the three-dimensional control graphic DCR11 is rotated in the left direction, and the control graphic CR73 is positioned at the front surface as shown at the bottom right in the diagram. In this state, it is possible for the user to perform an operation with respect to the control graphic CR73 and to adjust the equalizer of the sound signal.

Furthermore, from the state shown in the upper side in the diagram, when the user performs a sliding operation with a finger in a direction shown by an arrow Q32, that is, in the downward direction in the diagram, the three-dimensional control graphic DCR11 is rotated in the downward direction, and the control graphic CR72 is positioned at the front surface as shown at the bottom left in the diagram. In this state, it is possible for the user to perform an operation with respect to the control graphic CR72 and to adjust the surround of the sound signal.

Here, description has been given of an example where control graphics are displayed on three surfaces of the three-dimensional control graphic DCR11; however, control graphics may be set to be displayed on all the surfaces. In such a case, it is possible for the user to adjust the sound effect by rotating the three-dimensional control graphic DCR11 in an arbitrary direction, displaying a desired surface on the front surface, and performing an operation with respect to the control graphic which is displayed on this surface. Naturally, it is also possible for the user to rotate the three-dimensional control graphic DCR11 one cycle or more in the same direction, and it is also possible to rotate in the opposite direction.

In addition, the three-dimensional control graphic is not limited to a cube, as long as it is a three-dimensional graphic which has a plurality of surfaces such as a rectangular shape, a tetrahedral shape, or an octahedral shape. Furthermore, by changing the brightness and tint of the surface in accordance with the adjustment amount of the sound parameters which are associated with each surface of the three-dimensional control graphic DCR11, it is possible to more easily grasp what kind of adjustment is performed on each surface.

In this manner, by distributing the respective sound parameters on each flat surface on one three-dimensional control graphic DCR11, it is possible to select the sound parameters in an easier to understand manner in comparison with a case where the items of the sound parameters are displayed in a row in the vertical direction or the horizontal direction using text or the like on the screen as in the related art.

<Eighth Embodiment>
<Use Environment>

In addition, in the above, description has been given where the sound effect adjusting apparatus 11 is a display device and it is possible to feel the sound effects with the display device itself.

Figure 28:
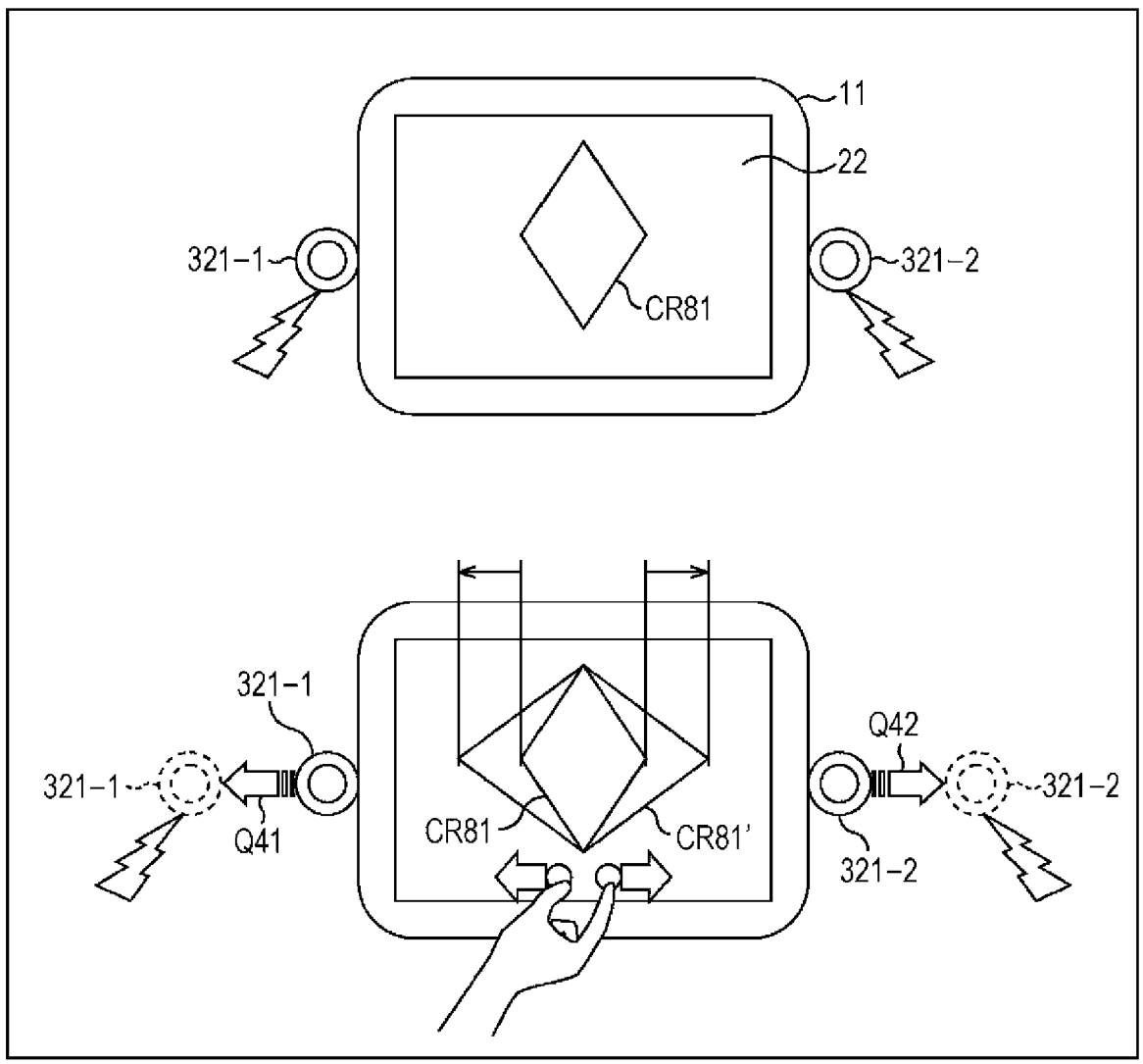
FIG. 28 is a view which illustrates a usage environment example where it is possible to feel sound effects using the display device itself.

That is, as shown in FIG. 28, for example, a speaker 321-1 and a speaker 321-2 are provided in sound effect adjusting apparatus 11 as the reproduction unit 26, and the audio is output based on the sound signal from the speaker 321-1 and the speaker 321-2. Here, below, in a case where the speaker 321-1 and the speaker 321-2 are not particularly distinguished, reference will simply be made to the speaker 321.

In addition, a control graphic CR81 which is associated with the sound parameters is displayed on the display unit 22 of the sound effect adjusting apparatus 11, and audio where the sound effect which is associated with the control graphic CR81 is applied is reproduced from the speaker 321.

Furthermore, when an operation is performed with respect to the control graphic CR81, the control graphic CR81 changes shape to become the control graphic CR81' as shown in the lower side in the diagram.

Then, the sound effect is adjusted along with the shape change of the control graphic CR81. Here, for example, the sense of width to the left and right as the surround effect is set to be associated with the control graphic CR81. In such a case, the sense of width in the horizontal direction is increased along with the shape change of the control graphic CR81, and it is possible to obtain a sound effect as if the speaker 321 were moved to the outside with respect to the sound effect adjusting apparatus 11 as shown by an arrow Q41 and an arrow Q42. In other words, it is possible for the user to feel the sound effect in accordance with an operation with respect to the control graphic CR81 using the sound effect adjusting apparatus 11.

With the present technology, as well as a use environment where it is possible to feel the sound effect with the display device itself in this manner, application is also possible to a use environment where speakers are not provided in the display device itself and the display device is set as a remote commander.

Figure 29:
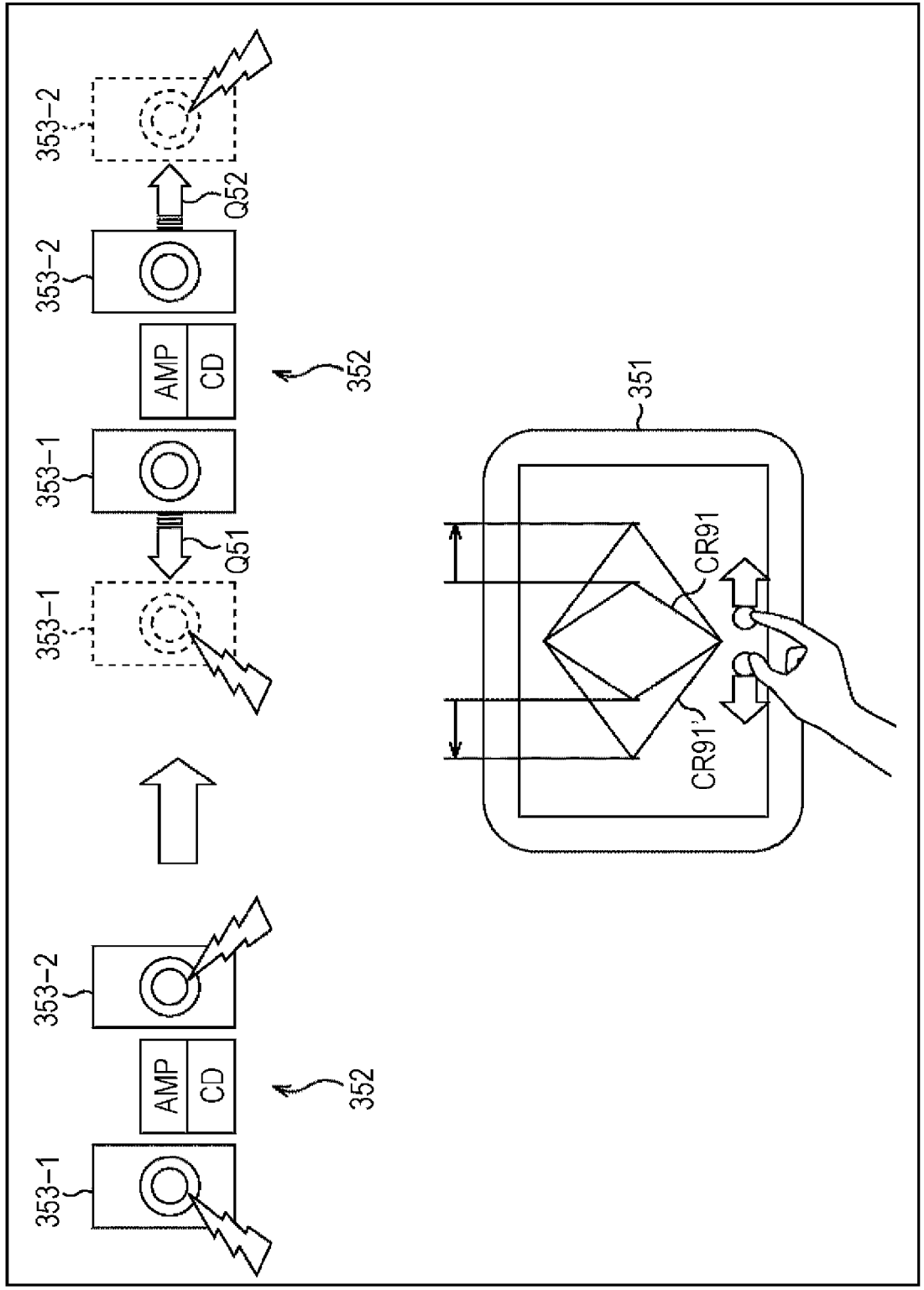
FIG. 29 is a view which illustrates a usage environment example where it is possible to feel sound effects using an external device.

In such a case, for example, as shown in FIG. 29, without speakers being provided in a sound effect adjusting apparatus 351, which is a display device, the sound effect adjusting apparatus 351 functions as a remote commander, and provides instructions for reproducing the sound signal and adjusting the sound effects with respect to an external device 352.

In this example, two of a speaker 353-1 and a speaker 353-2 are provided in the external device 352. The external device 352 adjusts the sound effects of the sound signal according to the control of the sound effect adjusting apparatus 351 and outputs the audio from the speaker 353-1 and the speaker 353-2 based on the sound signal. Here, below, in a case where the speaker 353-1 and the speaker 353-2 are not particularly distinguished, reference will simply be made to the speaker 353.

For example, a control graphic CR91 which is associated with a sound parameter is displayed on the display screen of the sound effect adjusting apparatus 351, and audio where the sound effect which is associated with the control graphic CR91 as shown in the top left in the diagram is applied is reproduced from the external device 352.

Furthermore, when an operation is performed with respect to the control graphic CR91, the control graphic CR91 changes shape to become the control graphic CR91' as shown in the lower side in the diagram.

Then, the sound effect adjusting apparatus 351 transmits a control signal indicating the sound effect to be performed in accordance with the shape change of the control graphic CR91 to the external device 352, and performs the adjustment of the sound effect in accordance with the control signal in the external device 352.

Here, for example, the sense of width to the left and right as the surround effect is set to be associated with the control graphic CR91. In such a case, the sound effect adjusting apparatus 351 transmits the control signal to the external device 352 and provides instructions for the adjustment of the sense of width such that the sense of width of the horizontal direction is increased along with the shape change of the control graphic CR91. By so doing, the external device 352 receives a control signal from the sound effect adjusting apparatus 351. Furthermore, based on the received control signal, the external device 352 adjusts the surround of the sound signal such that a sound effect as if the speaker 353 were moved to the outside with respect to the external device 352 as shown by an arrow Q51 and an arrow Q52 is obtained. Due to this, it is possible for the user to feel the sound effect in accordance with the operation with respect to the control graphic CR91.

<Configuration Example of Sound Effect Adjusting Apparatus>

Figure 30:
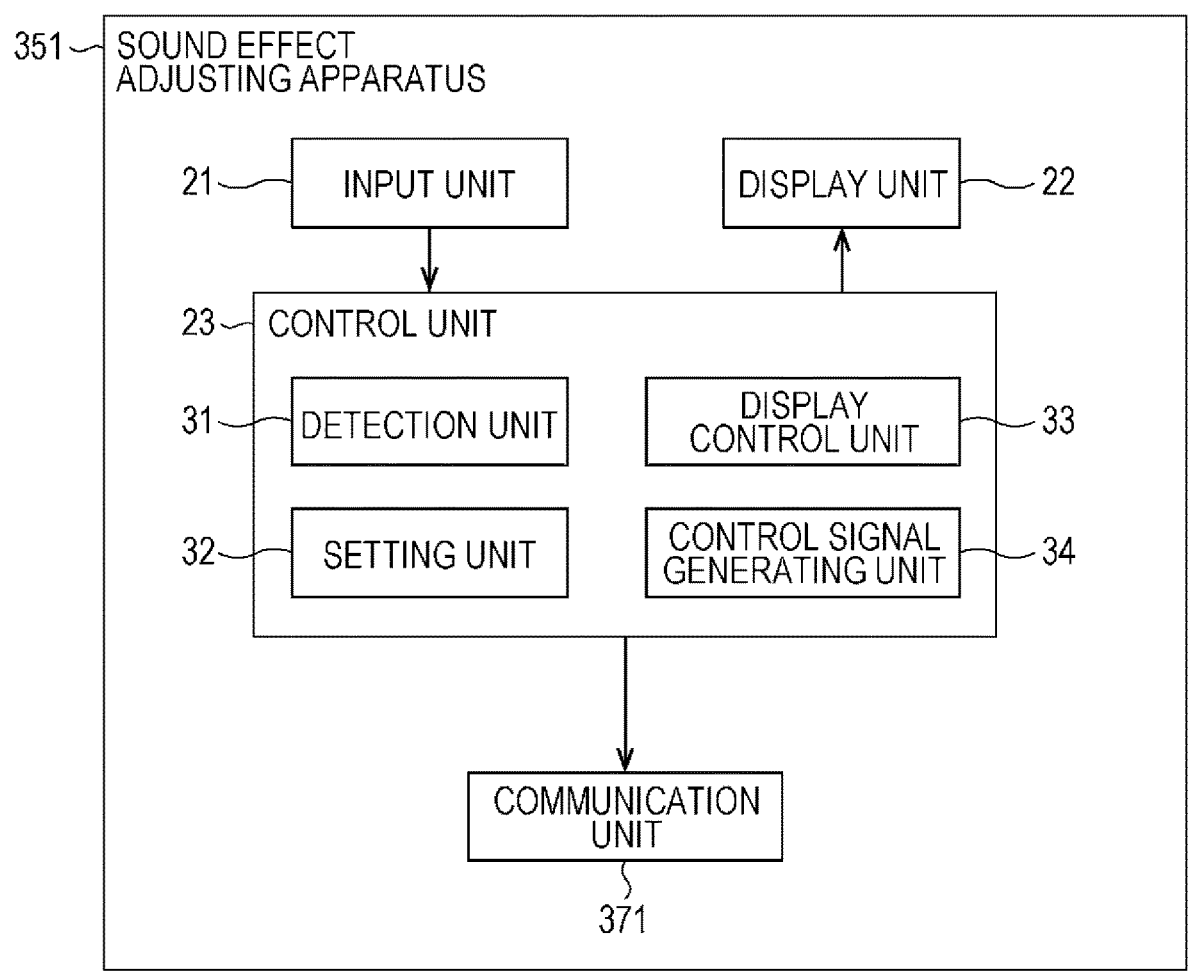
FIG. 30 is a view which illustrates a configuration example of the sound effect adjusting apparatus.

In this manner, in a case where the sound effect adjusting apparatus 351 functions as a remote commander and provides instructions for adjustment of the sound effect with respect to the external device 352, the sound effect adjusting apparatus 351 is configured as shown in FIG. 30, for example. Here, in FIG. 30, the same reference numerals are used in the portions corresponding to the case in FIG. 2, and description thereof will be omitted as appropriate.

The sound effect adjusting apparatus 351 shown in FIG. 30 is configured from the input unit 21, the display unit 22, the control unit 23, and a communication unit 371.

The control unit 23 displays a control graphic on the display unit 22 and provides instructions to the communication unit 371 for the transmission of the control signal to the external device 352, based on the signal which is supplied from the input unit 21 which is formed of a touch panel or the like.

In addition, the control unit 23 is provided with the detection unit 31, the setting unit 32, the display control unit 33, and the control signal generating unit 34. For example, the control signal generating unit 34 generates a control signal which provides instructions for the adjustment of the sound effect in accordance with the operation of the user on the control graphic, and performs supply thereof to the communication unit 371.

The communication unit 371 transmits the control signal which is supplied from the control signal generating unit 34 and provides instructions for adjusting the sound effect to the external device 352 using wireless communication, for example. In addition, the communication unit 371 also transmits a control signal, which provides instructions for the reproduction of the sound signal, the stopping of the reproduction, or the like under the control of the control unit 23, to the external device 352.

The sound effect adjusting apparatus 351 also performs the same process as the sound effect adjusting apparatus 11 described above, and controls the adjustment of the sound effect of the sound signal.

<Ninth Embodiment>
<Sound Effect for Each Touch Position>

Here, in the above, the sound effect was adjusted by changing the shape of the control graphic on the screen of the display unit; however, it is also possible to build a new user interface by changing the sound effect in accordance with the position itself where the screen is touched.

Figure 31:
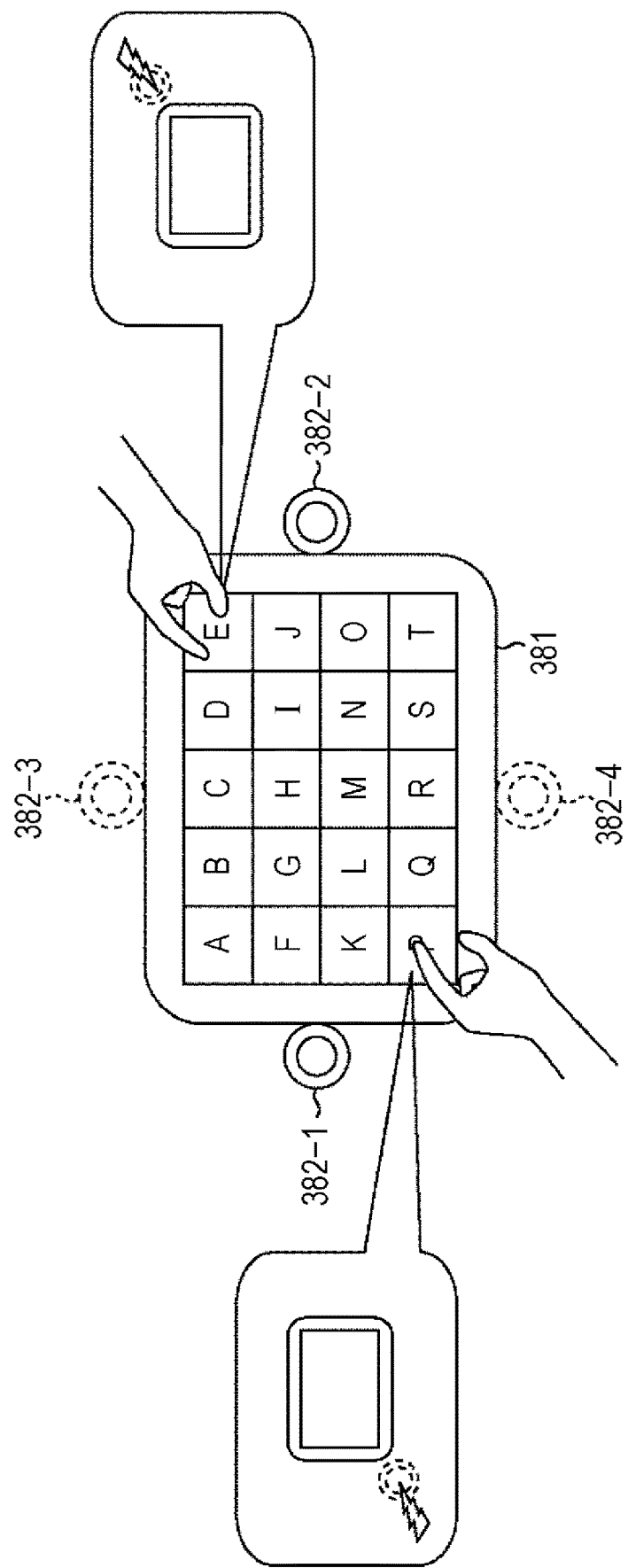
FIG. 31 is a diagram which describes file reproduction in accordance with a touch position.

For example, as shown in FIG. 31, when the display screen of the sound effect adjusting apparatus 381 is divided into 20 and the user touches (contacts) any one among each of the divided regions, the sound effect is realized such that it is possible to hear the audio from the region which is touched by the user.

In this example, two of a speaker 382-1 and a speaker 382-2 are provided in the sound effect adjusting apparatus 381, and the sound effect adjusting apparatus 381 outputs the audio from the speaker 382-1 and the speaker 382-2 based on the sound signal where the sound effect is applied. Here, below, in a case where the speaker 382-1 and the speaker 382-2 are not particularly distinguished, reference will simply be made to the speaker 382.

In addition, on the display screen of the sound effect adjusting apparatus 381, any one of the letters "A" to "T" are displayed in each of 20 divided regions, and each region has a square shape. In the following, each of the divided regions is referred to as the region of the letter which is displayed in that region. That is, for example, the region where the letter "A" is displayed is referred to as the A region.

In the sound effect adjusting apparatus 381, for each of the regions A through T, a file of the sound signal, where sound effect is applied such that the audio is output from the region, is prepared in advance and held when the reproduction is performed by the speakers 382. Then, when a touch operation is performed on the display screen of the sound effect adjusting apparatus 381 by the user, the file (sound signal) which is associated with the touched region is set to be reproduced.

For example, when the user touches the P region on the display screen of the sound effect adjusting apparatus 381, the sound signal of the sound effect is reproduced by the speaker 382 as if the audio is output from the position at the bottom left side of the sound effect adjusting apparatus 381 as shown in the left side in the diagram.

In addition, for example, when the user touches the E region on the display screen of the sound effect adjusting apparatus 381, the sound signal of the sound effect is reproduced by the speaker 382 as if the audio is output from the position at the top right side of the sound effect adjusting apparatus 381 as shown in the right side in the diagram.

Here, for example, it is possible for the representation of the left and right position of the screen according to the sound, that is, the control of the positions in the left and right direction of the virtual sound source to be realized by changing the sound level balance of the audio which is output from the speaker 382-1 and the speaker 382-2. In addition, it is recognized that it is possible for the representation of the up and down position of the screen according to the sound to be reproduced by applying a special notch characteristic to the audio which is reproduced by the speaker 382-1 and the speaker 382-2.

Furthermore, to be most effective, if a speaker 382-3 and a speaker 382-4 are provided in the up and down direction of the sound effect adjusting apparatus 381 outside the speaker 382-1 and the speaker 382-2, representation of the up and down position of the sound is possible with more certainty.

For example, in tablets, the e-book distribution and subscriptions are becoming more common. As application programs which display such e-books, there are ones which output a sound at the time of page turning. However, in such application programs, only same sound is output wherever the user touches on the screen.

In contrast, according to the sound effect adjusting apparatus 381, when turning a page of an e-book, by making a sound audible from the left side when the user touches the left side of the screen or from the upper side when touching the upper side of the screen, it is possible for the user to be made aware of this, and it is possible to further improve the realism.

Accordingly, it is possible to further increase the degree of matching between the sense of operating a physical book that many users have hitherto been accustomed to and the operation sounds which are reproduced by the tablet. Due to this, it is possible to configure a user interface in which dissatisfaction with the operation is reduced and the degree of satisfaction of the user is high.

Here, the configuration of the sound effect adjusting apparatus 381 is also set to the same configuration as the sound effect adjusting apparatus 11 which is shown in FIG. 2. For example, when the display control unit 33 displays the regions A to T on the display unit 22 and an operation is performed by the user with respect to these regions, a signal in accordance with the user operation is supplied from the input unit 21 to the control unit 23.

By so doing, the detection unit 31 specifies the region which is touched by the user based on the signal from the input unit 21, and the control signal generating unit 34 supplies a control signal to the sound effect adjusting apparatus 25 in accordance with the specified result. Then, the sound effect adjusting apparatus 25 acquires a file of the sound signal, which is specified by the control signal from the control signal generating unit 34, from the acquisition unit 24 and performs supply thereof to the reproduction unit 26, and the reproduction unit 26 outputs the audio based on the supplied sound signal.

<Tenth Embodiment>

<Sound Effect in accordance with Sliding Direction>

Furthermore, according to the present technology, in a case where e-books or the like are reproduced, for example, when the paper which is superimposed and displayed on the screen is made to slide in a predetermined direction so as to turn the page, it is possible to realize sound effects in accordance with the sliding direction.

Figure 32:
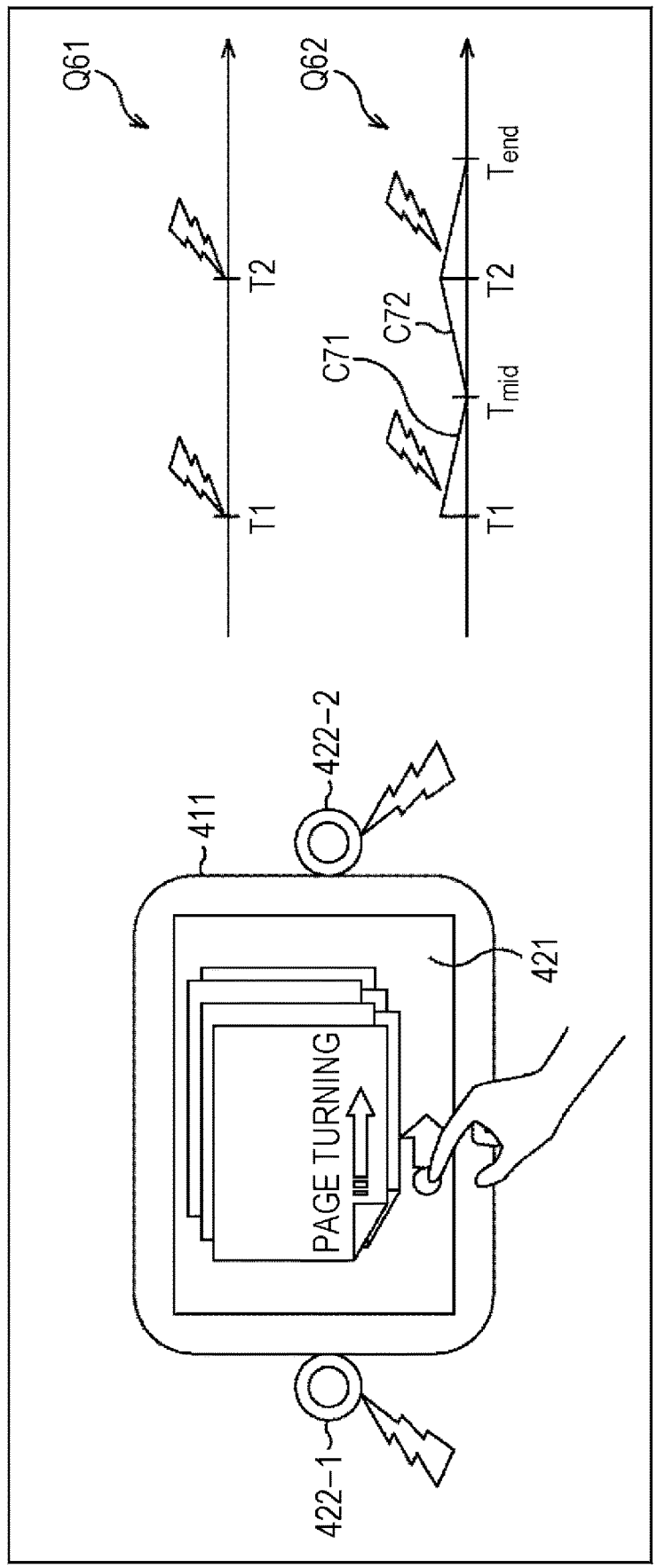
FIG. 32 is a diagram which describes audio reproduction in accordance with page turning.

In such a case, for example, the image of the paper as the e-book is displayed on a display unit 421 of the sound effect adjusting apparatus 411 where the present technology is applied as shown in FIG. 32. The paper which is displayed on the display unit 421 is superimposed, and each piece of paper is one page. In addition, a touch panel which corresponds to the input unit 21 of FIG. 2 is superimposed and provided on the display unit 421, and the operations of the user are received by the display unit 421 through the touch panel.

Furthermore, two of a speaker 422-1 and a speaker 422-2 are provided at the left and right edges of the sound effect adjusting apparatus 411 in the diagram, and the sound effect adjusting apparatus 411 outputs audio from the speaker 422-1 and the speaker 422-2 based on the sound signal in accordance with the page turning operation by the user. Here, below, in a case where the speaker 422-1 and the speaker 422-2 are not particularly distinguished, reference will simply be made to the speaker 422.

For example, when a sliding operation is performed by the finger of the user on the surface of the display unit 421 such that the paper which is displayed at the foreground as shown in FIG. 32 is turned to the right side in the diagram, the paper in the foreground on the display unit 421 is slid in the left to the right direction in accordance with the sliding operation.

At the same time, the sound effect adjusting apparatus 411 outputs audio based on the sound signal from the speaker 422-1 at a time T1 as shown by an arrow Q61 in order to represent the sliding operation using audio. Furthermore, thereafter, the sound effect adjusting apparatus 411 outputs audio based on the sound signal from the speaker 422-2 at the time T2. Due to this, since a sound effect where the sense of movement of the page (paper) from the left side to the right side is represented is obtained, it is possible to further increase the degree of matching between the movement of the paper on the screen of the display unit 421 and the sound.

Furthermore, in accordance with the sliding operation in the right direction by the user, the sound effect adjusting apparatus 411 may be set to output audio based on the sound signal from the speaker 422 as shown by an arrow Q62.

That is, the sound effect adjusting apparatus 411 outputs audio based on the sound signal from the speaker 422-1 at the time Ti and controls the sound level of the audio such that the sound level of the audio is decreased over time and the output of the audio from the speaker 422-1 is stopped at the time $T_{mid}$. In FIG. 32, a straight line C71 shows the sound level of the audio which is output from the speaker 422-1, and the sound level of the audio is decreased from the time T1 to the time $T_{mid}$.

Furthermore, the sound effect adjusting apparatus 411 outputs audio based on the sound signal from the speaker 422-2 at the time $T_{mid}$, and controls the sound level of the audio such that the sound level of the audio is increased over time until the time T2 and thereafter the sound level of the audio is decreased over time until the time $T_{end}$.

In FIG. 32, the straight line C72 shows the sound level of the audio which is output from the speaker 422-2, and the sound level of the audio is increased from the time $T_{mid}$ to the time T2 and the sound level of the audio is gradually decreased from the time T2 to the time $T_{end}$. In addition, the reproduction of the audio is stopped at the time $T_{end}$.

When the reproduction of such audio is performed, in a case where the movement of the paper is particularly slow, the degree of matching between the reproduced audio and the changes of the sound generated by the page turning in practice is increased.

In this manner, with respect to the movement of the object (image) which is the movement on the screen, it is possible to further increase the realism by applying the changes in the sound corresponding to the movement. As a result, it is possible to configure a user interface in which dissatisfaction with the operation is reduced and the degree of satisfaction of the user is high.

Here, the configuration of the sound effect adjusting apparatus 411 described with reference to FIG. 32 is also configured to be the same as the configuration of the sound effect adjusting apparatus 11 of FIG. 2. That is, the sliding operation of the user is detected by the detection unit 31 and a control signal which controls the sound level is generated by the control signal generating unit 34 in accordance with the detected operation. Then, the sound effect adjusting unit 25 realizes sound effects which correspond to the movement of the object such as page turning by controlling the sound level of the sound signal based on the control signal which is generated by the control signal generating unit 34.

According to the present technology as described above, by combining the change positions of the graphic and images on the screen and changing the sound effect, it is possible to provide an easy-to-use user interface which is easier to understand in comparison with the sound adjusting method using the enumeration of the related art without an image.

Incidentally, it is possible to perform execution of the above-described series of processes using hardware, or it is possible to perform execution using software. In a case where the series of processes is performed using software, the program configuring the software is installed in a computer. Here, as the computers, computers with built-in dedicated hardware, general personal computers which are able to perform various types of functions by installing various types of programs, and the like are included, for example.

FIG. 33 is a block diagram which illustrates a configuration example of hardware of a computer which executes the above-described series of processes according to a program.

In the computer, a CPU (Central Processing Unit) 701, a ROM (Read Only Memory) 702, and a RAM (Random Access Memory) 703 are connected to each other via a bus 704.

An input output interface 705 is further connected to the bus 704. An input unit 706, an output unit 707, a recording unit 708, a communication unit 709, and a drive 710 are connected to the input output interface 705.

The input unit 706 is formed of a keyboard, a mouse, a microphone, a touch panel, or the like. The output unit 707 is formed of a display, a speaker or the like. The recording unit 708 is formed of a hard disk, a non-volatile memory, or the like. The communication unit 709 is formed of a network interface, or the like. The drive 710 drives a removable media 711 such as a magnetic disk, an optical disc, a magneto-optical disc, or a semiconductor memory.

In the computer configured as above, for example, the CPU 701 performs the series of processes described above by loading a program recorded in the recording unit 708 into the RAM 703 through the input output interface 705 and the bus 704 and performing execution thereof.

It is possible to provide the program which is executed by the computer (CPU 701) by recording on a removable media 711 as package media or the like. In addition, it is possible to provide the program through a wired or wireless transmission medium, such as a local area network, the Internet, or digital satellite broadcasting.

In the computer, it is possible to install the program in the recording unit 708 through the input output interface 705 by mounting the removable media 711 in the drive 710. In addition, it is possible to install the program in the recording unit 708 by receiving in the communication unit 709 through the wired or wireless transmission medium. Otherwise, it is possible to install the program in advance in the ROM 702 and the recording unit 708.

Here, the program which is executed by the computer may be a program where processes are performed in the order which was described in the present specification, or may be a program where processes are performed at a necessary timing such as when call up is performed.

In addition, embodiments of the present technology are not limited to the embodiments described above, and various modifications may be made in a range not departing from the scope of the present technology.

For example, it is possible for the present technology to adopt a cloud computing configuration in which processing is performed by sharing and performing one function in conjunction by a plurality of apparatuses through a network.

In addition, it is possible for each step in the flow chart described above to be shared and performed by a plurality of apparatuses as well as performed by one apparatus.

Furthermore, in a case where a plurality of processes are included in one step, it is possible for the plurality of processes which are included in the one step to be shared and performed by a plurality of apparatuses as well as performed by one apparatus.

In addition, it is possible for the present technology to be configured as below.

(1) A content processing apparatus, comprising: a processor configured to control display of a graphic including a single shape corresponding to a plurality of content output characteristic adjusting parameters, modify the single shape included in the graphic displayed on the display based on input information, and adjust at least one content output characteristic adjusting parameter of reproduced content based on the input information.

(2) The content processing apparatus of any one of (1), wherein a geometry of the single shape corresponds to the plurality of content output characteristic adjusting parameters, and the processor modifies the geometry of the single shape based on the input information.

(3) The content processing apparatus of any one of (1) to (2), wherein the processor adjusts the at least one content output characteristic adjusting parameter according to the modification of the geometry of the single shape after the geometry of the single shape is adjusted based on the input information.

(4) The content processing apparatus of any one of (1) to (3), wherein the display is a touch panel and the input information is generated in response to detection of a touch on the touch panel.

(5) The content processing apparatus of (4), wherein the input information is generated based on a detected touch on the touch panel that includes a pinch-out motion in a first direction, and in response to the input information, the processor elongates the single shape of the graphic displayed on the display in the first direction, and increases values of corresponding content output characteristic adjusting parameters of the reproduced content according to the elongated single shape of the graphic displayed on the display.

(6) The content processing apparatus of any one of (4) to (5), wherein the input information is based on a detected touch on the touch panel including a pinch-out in a second direction, and in response to the input information, the processor elongates the single shape of the graphic displayed on the display in the second direction, and decreases values of corresponding content output characteristic adjusting parameters of the reproduced content according to the elongated single shape of the graphic displayed on the display.

(7) The content processing apparatus of any one of (4) to (6), wherein the first direction is perpendicular to the second direction.

(8) The content processing apparatus of (5), wherein the processor elongates the single shape of the graphic displayed on the display equally relative to a center axis of the single shape of the graphic, and increases the values of the corresponding content output characteristic adjusting parameters equally.

(9) The content processing apparatus of any one of (4) to (8), wherein the processor adjusts at least two content output characteristic adjusting parameters when the input information indicates that a single gesture is detected by the touch panel.

(10) The content processing apparatus of any one of (2) to (9), wherein the processor divides at least one content output characteristic adjusting parameter into two additional content output adjusting parameters based on the input information.

(11) The content processing apparatus of any one of (1) to (10), wherein the single shape is associated with a plurality of different categories of content output characteristic adjusting parameters.

(12) The content processing apparatus of (11), wherein the plurality of different categories of content output characteristic adjusting parameters includes a first category associated with one axis of the single shape and a second category associated with a second axis of the single shape.

(13) The content processing apparatus of any one of (5), wherein the processor determines whether the touch is above or below a center axis of the single shape of the graphic displayed on the display, elongates the single shape of the graphic displayed on the display in one direction when the touch is above the center axis, elongates the single shape of the graphic displayed on the display in another direction when the touch is below the center axis, and adjusts the values of the corresponding content output characteristic adjusting parameters of the reproduced content based on a direction of elongation.

(14) The content processing apparatus of any one of (1) to (13), wherein the processor modifies the single shape of the graphic displayed on the display in predetermined increments in response to the input information.

(15) The content processing apparatus of any one of (1) to (14), wherein the single shape of the graphic is a polygon, and the processor modifies the single shape of the graphic by changing a location of at least one of the vertices of the polygon relative to a center of the polygon.

(16) The content processing apparatus of (15), wherein the processor modifies the single shape of the graphic by adding a new vertex to the polygon, and the processor adds an additional content output characteristic adjusting parameter to the at least one content output characteristic adjusting parameter in response to addition of the new vertex.

(17) The content processing apparatus of any one of (15) to (16), wherein the polygon is a rectangle.

(18) The content processing apparatus of any one of (15) to (17), wherein the display additionally displays at least one icon proximate to at least one vertex of the rectangle, and the processor changes at least one of a size and a resolution of at least one of the icons in response to the input information.

(19) The content processing apparatus of any one of (1) to (18), wherein the single shape includes a plurality of sides.

(20) The content processing apparatus of any one of (1) to (19), wherein each of the plurality of sides is associated with a subset of the plurality of content output characteristic adjusting parameters.

(21) The content processing apparatus of (14), wherein the processor adjusts a geometry of at least one of the plurality of sides based on the input information, and adjusts at least one of a subset of the plurality of content output characteristic adjusting parameters associated with the at least one of the plurality of sides.

(22) The content processing apparatus of (4), wherein the processor modifies at least one of a color, transparency or resolution of the graphic based on the input information.

(23) The content processing apparatus of any one of (1) to (22), wherein content includes sound and the content output characteristic adjusting parameters include sound adjusting parameters.

(24) A content processing method, comprising: controlling, in a processor, display of a graphic including a single shape corresponding to a plurality of content output characteristic adjusting parameters; modifying, in the processor, the single shape included in the graphic displayed on the display based on input information; and adjusting, in the processor, at least one content output characteristic adjusting parameter of reproduced content based on the input information.

(25) A non-transitory computer-readable medium storing computer-readable instructions thereon, the computer-readable instructions when executed by a computer cause the computer to perform a method comprising: controlling display of a graphic including a single shape corresponding to a plurality of content output characteristic adjusting parameters; modifying the single shape included in the graphic displayed on the display based on input information; and adjusting at least one content output characteristic adjusting parameter of reproduced content based on the input information.

(26) A content processing apparatus, comprising: a touch panel display configured to receive an input based on a user touch thereon, the touch panel display displaying a graphic including a single shape corresponding to a plurality of content output characteristic adjusting parameters; and a processor configured to modify the single shape included in the graphic displayed on the display based on input information, and adjust at least one content output characteristic adjusting parameter of reproduced content based on the input information.

(27) A sound effect adjusting apparatus including: a display control unit which displays a control graphic for adjusting sound effects of sound signals and which continuously changes the control graphic according to an operation of a user with respect to the control graphic, and a control unit which, with respect to a plurality of sound parameters for applying the sound effects to the sound signals which are associated with mutually different portions of the control graphic, continuously changes the sound parameters by linking to changes in the control graphic.

(28) The sound effect adjusting apparatus according to (27), further including: a detection unit which detects an operation of the user with respect to the control graphic by detecting the operation of the user with respect to a touch panel which is provided superimposed on the display unit which displays the control graphic, in which the display control unit changes the control graphic according to a detection result by the detection unit, and the control unit changes the sound parameters according to the detection result by the detection unit.

(29) The sound effect adjusting apparatus according to (27), further including: a detection unit which detects an operation of the user with respect to the control graphic by detecting the operation on the control graphic by a pointer which is displayed along with the control graphic, in which the display control unit changes the control graphic according to a detection result by the detection unit, and the control unit changes the sound parameters according to the detection result by the detection unit.

(30) The sound effect adjusting apparatus according to any one of (27) to (29), further including: a sound effect adjusting unit which applies the sound effects with respect to the sound signals based on the sound parameters which are changed according to the changes in the control graphic, and a reproduction unit which reproduces audio based on the sound signals to which the sound effects are applied by the sound effect adjusting unit.

(31) The sound effect adjusting apparatus according to (30), in which the sound effects are continuously changed by making the sound parameters parametric.

(32) The sound effect adjusting apparatus according to (30), in which the sound effect adjusting unit continuously changes the sound effects by cross-fading the sound signals to which a first sound effect which is determined in advance is applied and the sound signals to which a second sound effect, which is determined in advance and which is different to the first sound effect is applied, according to the changes in the sound parameters.

(33) The sound effect adjusting apparatus according to any one of (27) to (39), further including: a communication unit which transmits a control signal according to changes in the sound parameters to an external device which applies the sound effect with respect to the sound signal.

(34) The sound effect adjusting apparatus according to any one of (27) to (33), in which, along with the control graphic, the display control unit further displays another control graphic which is different to the control graphic.

(35) The sound effect adjusting apparatus according to any one of (27) to (33), in which the display control unit further displays an image which recalls the sound parameters along with the control graphic, and changes the control graphic and the image according to an operation of the user with respect to the control graphic.

(36) The sound effect adjusting apparatus according to any one of (27) to (35), in which the display control unit changes a shape of the control graphic according to an operation of the user with respect to the control graphic.

(37) The sound effect adjusting apparatus according to (36), in which the sound parameters of types which are mutually different are associated with the first vertex and the second vertex of the control graphic.

(38) The sound effect adjusting apparatus according to any one of (27) to (35), in which the display control unit changes the color, resolution, or transparency of the control graphic according to an operation of the user with respect to the control graphic.

(39) The sound effect adjusting apparatus according to any one of (27) to (38), in which the control unit changes the sound characteristics of a virtual listening space, which is centered on a listener in the virtual listening space which is reproduced by the sound signals, by changing the sound parameters.

(40) The sound effect adjusting apparatus according to any one of (27) to (38), in which the control unit changes a position of a listener in a virtual listening space, which is reproduced by the sound signals, by changing the sound parameters.

(41) A sound effect adjusting method including: displaying a control graphic for adjusting sound effects of sound signals and continuously changing the control graphic according to an operation of a user with respect to the control graphic, and with respect to a plurality of sound parameters for applying the sound effects to the sound signals which are associated with mutually different portions of the control graphic, continuously changing the sound parameters by linking to changes in the control graphic.

(42) A program causing a computer to execute: displaying a control graphic for adjusting sound effects of sound signals and continuously changing the control graphic according to an operation of a user with respect to the control graphic, and with respect to a plurality of sound parameters for applying the sound effects to the sound signals which are associated with mutually different portions of the control graphic, continuously changing the sound parameters by linking to changes in the control graphic.

(43) A sound effect adjusting apparatus including: a display control unit which displays a predetermined image on a display unit and which continuously changes the image according to an operation of a user with respect to the image, and a control unit which continuously changes sound effects of sound signals by linking to changes in the image.

(44) A sound effect adjusting method including: displaying a predetermined image on a display unit and changing the image according to an operation of a user with respect to the image, and continuously changing sound effects of sound signals by linking to changes in the image.

The present disclosure contains subject matter related to that disclosed in Japanese Priority Patent Application JP 2012-194039 filed in the Japan Patent Office on Sep. 4, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

11 SOUND EFFECT ADJUSTING APPARATUS
21 INPUT UNIT

22 DISPLAY UNIT
23 CONTROL UNIT
25 SOUND EFFECT ADJUSTING UNIT
26 REPRODUCTION UNIT
31 DETECTION UNIT
32 SETTING UNIT
33 DISPLAY CONTROL UNIT
34 CONTROL SIGNAL GENERATING UNIT

The invention claimed is:

1. An information processing apparatus, comprising:
a processing circuit coupled to a memory and configured to
control output of a graphic on a display, the graphic including a closed polygon corresponding to a plurality of content audio output characteristic adjusting parameters, a position of each vertex in the closed polygon corresponding to a gain characteristic for a frequency band in the plurality of content audio output characteristic adjusting parameters,
modify, based on modifying input information, the closed polygon included in the graphic displayed into a different closed polygon by changing at least one vertex angle of the closed polygon and by dividing one of the vertices of the closed polygon into two vertices in the different closed polygon,
set, based on the modifying input information, one of the two vertices in the different closed polygon to correspond to a first gain characteristic for a first different frequency band having a center frequency that is greater than a center frequency of a frequency band corresponding to the at least one vertex of the closed polygon,
set, based on the modifying input information, the other one of the two vertices in the different closed polygon to correspond to a second gain characteristic for a second different frequency band having a center frequency that is less than the center frequency of the frequency band corresponding to the at least one vertex of the closed polygon, and
adjust at least one content audio output characteristic adjusting parameter of reproduced content based on the modifying input information.

2. The information processing apparatus according to claim 1, wherein a geometry of the closed polygon corresponds to the plurality of content audio output characteristic adjusting parameters, and the processor modifies the geometry of the closed polygon based on the input information to transform the closed polygon into the different closed polygon.

3. The information processing apparatus according to claim 2, wherein the processing circuit adjusts the at least one content audio output characteristic adjusting parameter according to the different closed polygon after the geometry of the closed polygon is adjusted based on the input information.

4. The information processing apparatus according to claim 2, wherein the processing circuit divides at least one content audio output characteristic adjusting parameter into two additional content audio output adjusting parameters based on the input information.

5. The information processing apparatus according to claim 1, wherein the display is a touch panel and the input information is generated in response to detection of a touch on the touch panel.

6. The information processing apparatus according to claim 5, wherein the input information is generated based on a detected touch on the touch panel that includes a pinch-out motion in a first direction, and
in response to the input information, the processing circuit elongates the closed polygon of the graphic displayed on the display in the first direction as part of modifying the closed polygon into the different closed polygon, and
increases values of corresponding content audio output characteristic adjusting parameters of the reproduced content according to, in part, the elongation of the closed polygon of the graphic displayed on the display.

7. The information processing apparatus according to claim 6, wherein the input information is based on a detected touch on the touch panel including a pinch-out in a second direction, and
in response to the input information, the processing circuit elongates the closed polygon of the graphic displayed on the display in the second direction as part of modifying the closed polygon into the different closed polygon, and
decreases values of corresponding content audio output characteristic adjusting parameters of the reproduced content according to, in part, the elongation of the closed polygon of the graphic displayed on the display.

8. The information processing apparatus according to claim 7, wherein the first direction is perpendicular to the second direction.

9. The information processing apparatus according to claim 6, wherein the processing circuit elongates the closed polygon of the graphic displayed on the display equally relative to a center axis of the closed polygon of the graphic as part of modifying the closed polygon into the different closed polygon, and increases the values of the corresponding content audio output characteristic adjusting parameters equally.

10. The information processing apparatus according to claim 5, wherein the processing circuit adjusts at least two content audio output characteristic adjusting parameters when the input information indicates that a single gesture is detected by the touch panel.

11. The information processing apparatus according to claim 1, wherein the closed polygon is associated with a plurality of different categories of content audio output characteristic adjusting parameters.

12. The content processing apparatus according to claim 1, wherein the processing circuit modifies the single shape of the graphic by adding a new vertex to the closed polygon in order to generate the different closed polygon, and the processing circuit adds an additional content audio output characteristic adjusting parameter to the at least one content audio output characteristic adjusting parameter in response to addition of the new vertex.

13. The information processing apparatus according to claim 1, wherein the closed polygon includes a plurality of sides, and each of the plurality of sides is associated with a subset of the plurality of content audio output characteristic adjusting parameters.

14. The information processing apparatus according to claim 13, wherein the processing circuit adjusts a geometry of at least one of the plurality of sides based on the input information, and adjusts at least one of a subset of the plurality of content audio output characteristic adjusting parameters associated with the at least one of the plurality of sides.

15. The information processing apparatus according to claim 1, wherein content is audio content.

16. The information processing apparatus according to claim 1, wherein the processing circuit is configured to control the display to display an item indicating the at least one content audio output characteristic adjusting parameter on a position associated with the closed polygon.

17. The information processing apparatus according to claim 1, wherein the processor circuit is further configured to adjust a gain for a different frequency band, as the at least one content audio output characteristic adjusting parameter, based on a distance to a center of the polygon from each of a plurality of corresponding vertices in the different polygon.

18. The information processing apparatus according to claim 1, wherein at least one of the vertices in the different closed polygon are not associated with any of the plurality of content audio output characteristic adjusting parameters.

19. A content processing method, comprising:
controlling, with a processing circuit that is coupled to a memory, display of a graphic including a closed polygon corresponding to a plurality of content audio output characteristic adjusting parameters, a position of each vertex in the closed polygon corresponding to a gain characteristic for a frequency band in the plurality of content audio output characteristic adjusting parameters;
modifying, with the processing circuit and based on modifying input information, the closed polygon included in the graphic displayed into a different closed polygon by changing at least one vertex angle of the closed polygon and by dividing one of the vertices of the closed polygon into two vertices in the different closed polygon;
setting, based on the modifying input information, one of the two vertices in the different closed polygon to correspond to a first gain characteristic for a first different frequency band having a center frequency that is greater than a center frequency of a frequency band corresponding to the at least one vertex of the closed polygon;
setting, based on the modifying input information, the other one of the two vertices in the different closed polygon to correspond to a second gain characteristic for a second different frequency band having a center frequency that is less than the center frequency of the frequency band corresponding to the at least one vertex of the closed polygon; and
adjusting, with the processing circuit, at least one content audio output characteristic adjusting parameter of reproduced content based on the input information.

20. A non-transitory computer-readable medium storing computer-readable instructions thereon, the computer-readable instructions when executed by a computer cause the computer to perform a method comprising:
controlling display of a graphic including a closed polygon corresponding to a plurality of content audio output characteristic adjusting parameters, a position of each vertex in the closed polygon corresponding to a gain characteristic for a frequency band in the plurality of content audio output characteristic adjusting parameters;
modifying, based on modifying input information, the closed polygon included in the graphic displayed into a different closed polygon by changing at least one vertex angle of the closed polygon and by dividing one of the vertices of the closed polygon into two vertices in the different closed polygon;
setting, based on the modifying input information, one of the two vertices in the different closed polygon to correspond to a first gain characteristic for a first different frequency band having a center frequency that is greater than a center frequency of a frequency band corresponding to the at least one vertex of the closed polygon;
setting, based on the modifying input information, the other one of the two vertices in the different closed polygon to correspond to a second gain characteristic for a second different frequency band having a center frequency that is less than the center frequency of the frequency band corresponding to the at least one vertex of the closed polygon; and
adjusting at least one content audio output characteristic adjusting parameter of reproduced content based on the input information.

21. An information processing apparatus, comprising:
a touch panel display configured to receive input information based on a user touch thereon, the touch panel display displaying a graphic including a closed polygon corresponding to a plurality of content audio output characteristic adjusting parameters, a position of each vertex in the closed polygon corresponding to a gain characteristic for a frequency band in the plurality of content audio output characteristic adjusting parameters; and
a processing circuit configured to
modify, based on modifying input information, the closed polygon included in the graphic displayed into a different closed polygon by changing at least one vertex angle of the closed polygon and by dividing one of the vertices of the closed polygon into two vertices in the different closed polygon,
set, based on the modifying input information, one of the two vertices in the different closed polygon to correspond to a first gain characteristic for a first different frequency band having a center frequency that is greater than a center frequency of a frequency band corresponding to the at least one vertex of the closed polygon,
set, based on the modifying input information, the other one of the two vertices in the different closed polygon to correspond to a second gain characteristic for a second different frequency band having a center frequency that is less than the center frequency of the frequency band corresponding to the at least one vertex of the closed polygon, and
adjust at least one content audio output characteristic adjusting parameter of reproduced content based on the input information.

* * * * *